(12) United States Patent
Funayama et al.

(10) Patent No.: US 9,093,319 B2
(45) Date of Patent: Jul. 28, 2015

(54) SEMICONDUCTOR DEVICE AND MANUFACTURING METHOD THEREOF

(75) Inventors: Kota Funayama, Kanagawa (JP); Hiraku Chakihara, Kanagawa (JP); Yasushi Ishii, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 267 days.

(21) Appl. No.: 13/468,992

(22) Filed: May 10, 2012

(65) Prior Publication Data

US 2012/0292679 A1    Nov. 22, 2012

(30) Foreign Application Priority Data

May 20, 2011   (JP) .................................. 2011-113841

(51) Int. Cl.

| | |
|---|---|
| H01L 29/94 | (2006.01) |
| H01L 27/115 | (2006.01) |
| H01L 27/105 | (2006.01) |
| H01L 21/28 | (2006.01) |
| H01L 49/02 | (2006.01) |
| H01L 29/423 | (2006.01) |
| H01L 29/792 | (2006.01) |
| G11C 16/04 | (2006.01) |
| H01L 29/66 | (2006.01) |

(52) U.S. Cl.
CPC ...... *H01L 27/11565* (2013.01); *G11C 16/0466* (2013.01); *H01L 21/28282* (2013.01); *H01L 27/1052* (2013.01); *H01L 27/11568* (2013.01); *H01L 28/40* (2013.01); *H01L 29/4234* (2013.01); *H01L 29/66833* (2013.01); *H01L 29/792* (2013.01); *H01L 29/66477* (2013.01)

(58) Field of Classification Search
CPC ............ H01L 29/792; H01L 29/66477; H01L 21/28282; H01L 27/1052
USPC ........................... 257/298, 326; 438/239, 287
See application file for complete search history.

(56) References Cited

U.S. PATENT DOCUMENTS

| | | | |
|---|---|---|---|
| 2002/0048200 A1* | 4/2002 | Kuwazawa | .................. 365/200 |
| 2010/0200909 A1 | 8/2010 | Kawashima et al. | |
| 2011/0095348 A1* | 4/2011 | Chakihara et al. | ............. 257/298 |

FOREIGN PATENT DOCUMENTS

JP   2010-183022 A   8/2010

* cited by examiner

*Primary Examiner* — Jamie C Niesz
(74) *Attorney, Agent, or Firm* — Miles & Stockbridge P.C.

(57) ABSTRACT

A memory cell of a nonvolatile memory and a capacitive element are formed over the same semiconductor substrate. The memory cell includes a control gate electrode formed over the semiconductor substrate via a first insulating film, a memory gate electrode formed adjacent to the control gate electrode over the semiconductor substrate via a second insulating film, and the second insulating film having therein a charge storing portion. The capacitive element includes a lower electrode formed of the same layer of a silicon film as the control gate electrode, a capacity insulating film formed of the same insulating film as the second insulating film, and an upper electrode formed of the same layer of a silicon film as the memory gate electrode. The concentration of impurities of the upper electrode is higher than that of the memory gate electrode.

5 Claims, 60 Drawing Sheets

| OPERATION \ APPLIED VOLTAGE | Vd | Vcg | Vmg | Vs | Vb |
|---|---|---|---|---|---|
| WRITING | 1 V | Vdd | 12 V | 6 V | 0 |
| ERASING | 0 | 0 | −6 V | 6 V | 0 |
| READING | Vdd | Vdd | Vdd | 0 | 0 |

Vdd = 1.5 V

SEMICONDUCTOR DEVICE AND MANUFACTURING METHOD THEREOF

CROSS-REFERENCE TO RELATED APPLICATIONS

The disclosure of Japanese Patent Application No. 2011-113841 filed on May 20, 2011 including the specification, drawings and abstract is incorporated herein by reference in its entirety.

BACKGROUND

The present invention relates to semiconductor devices and manufacturing methods thereof, and more particularly, to a technique effectively applied to a semiconductor device with a nonvolatile memory and a manufacturing method thereof.

As an electrically writable and erasable nonvolatile semiconductor storage device, an electrically erasable and programmable read only memory (EEPROM) is widely used. Such a storage device (memory), typified by a flash memory currently used widely, includes a trap insulating film and a conductive floating gate electrode enclosed by an oxide film, under a gate electrode of a MISFET. The storage device is to store therein a charge storing state of the floating gate or trap insulating film as storage information, and to read the information therefrom as a threshold of the transistor. The trap insulating film is an insulating film that can store therein charges, and is a silicon nitride film or the like by way of example. The charging and discharging of charges into such a charge storing region shifts the threshold of the MISFET to operate the storage device as a memory element. The flush memory is a split gate cell using a metal-oxide-nitride-oxide-semiconductor (MONOS) film. Such a memory uses the silicon nitride film as the charge storing region to have the following advantages. Specifically, the memory has the excellent data hold reliability because of storing charges discretely as compared to the conductive floating gate film. Thus, the memory can thin oxide films located under and above the silicon nitride film because of the excellent data hold reliability to thereby decrease the voltages for the writing and erasing operations.

Japanese Unexamined Patent Publication No. 2010-183022 (Patent Document 1) discloses a technique regarding a semiconductor device including a memory region, a power feeding region, and a capacitor region.

RELATED ART DOCUMENTS

Patent Documents

[Patent Document 1]
Japanese Unexamined Patent Publication No. 2010-183022

SUMMARY

A related-art split gate nonvolatile memory has a memory gate electrode formed of, for example, a doped polysilicon film into which impurities are introduced to have a low resistivity. Some semiconductor devices have a combination of a nonvolatile memory and a PIP-type capacitive element mounted over the same semiconductor substrate. Such a semiconductor device is desired to improve both characteristics of the nonvolatile memory and the capacitive element to thereby improve the performance of the semiconductor device.

Accordingly, it is an object of the present invention to provide a technique that can improve the performance of the semiconductor device.

The above and other objects and the novel features of the invention will become apparent from the description of the present specification and the accompanying drawings.

The outline of representative aspects of the invention disclosed in the present application will be briefly described below.

A semiconductor device according to a representative embodiment includes a combination of a memory cell of a nonvolatile memory and a capacitive element mounted thereover. The concentration of impurities in an upper electrode of the capacitive element is higher than that of impurities in a memory gate electrode of the memory cell.

A manufacturing method of a semiconductor device according to the representative embodiment is a method for manufacturing a semiconductor device which includes a combination of a memory cell of a nonvolatile memory and a capacitive element mounted thereover. First, the method involves forming a first silicon film serving as both a control gate electrode of the memory cell and a lower electrode of a capacitive element, over a main surface of a semiconductor substrate, and forming the control gate electrode and the lower electrode by patterning the first silicon film. The method also involves forming an insulating film serving as both an insulating film for charge storage of the memory cell and a capacity insulating film of the capacitive element, over each of the main surface of the semiconductor substrate, the surface of the control gate electrode, and the surface of the lower electrode, and then forming a second silicon film serving as both a memory gate electrode of the memory cell and an upper electrode of the capacitive element, over the insulating film. Further, the method involves forming a first mask layer over a part of the second silicon film to serve as an upper electrode, etching back the second silicon film to leave the second silicon film at the sidewall of the control gate electrode to thereby form the memory gate electrode, while leaving the second silicon film under the first mask layer to thereby form the upper electrode. Thereafter, the method involves forming a second mask layer covering the memory gate electrode and exposing the upper electrode, over the semiconductor substrate, and ion-implanting impurities into the upper electrode using the second mask layer as an ion implantation blocking mask such that no impurities are ion-implanted into the memory gate electrode at this time.

Effects of the representative aspects of the invention disclosed in the present application will be briefly described as follows.

The representative embodiments of the invention can improve the performance of the semiconductor device.

DETAILED DESCRIPTION

Figure 1:
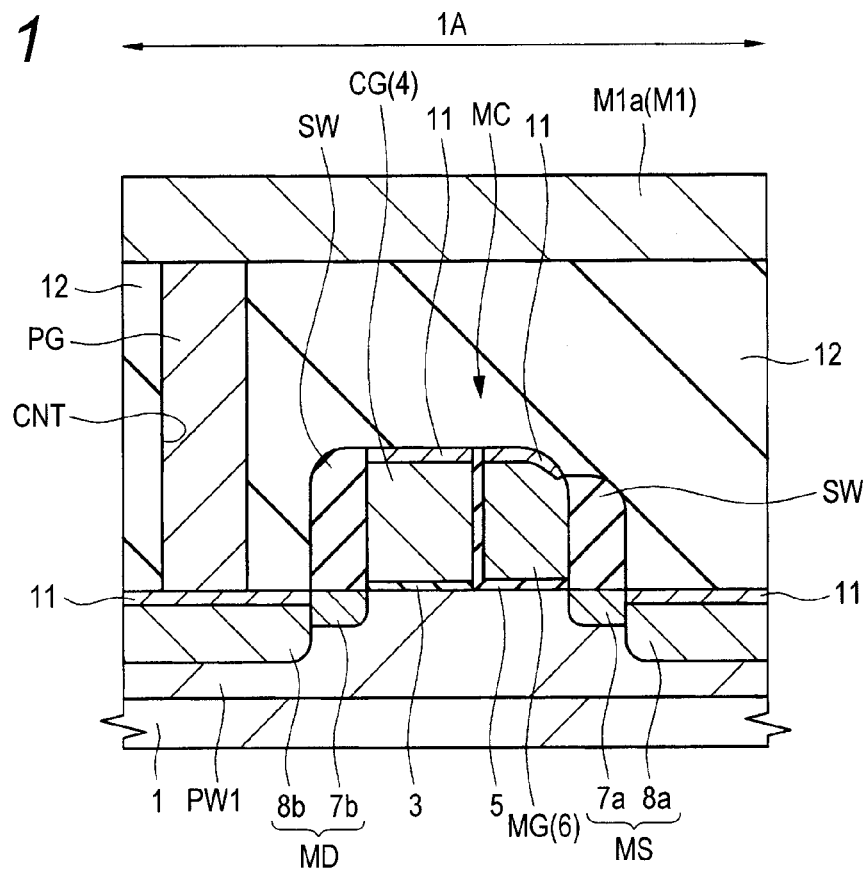
FIG. 1 is a cross-sectional view of a main part (memory cell region) of a semiconductor device according to one embodiment of the invention.

The following preferred embodiments may be described below by being divided into a plurality of sections or embodiments for convenience, if necessary, which are not independent from each other except when specified otherwise. One of the sections or embodiments is a modified example, a detailed explanation, a supplemental explanation, or the like of a part or all of the other. When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle. It is also needless to say that components (including elements or process steps, etc.) employed in the following description of the embodiments are not always essential, unless otherwise specified and considered to be definitely essential in principle. Similarly, in the following description of the shapes, positional relations and the like of the components or the like in the embodiments, they will include those substantially analogous or similar to their shapes or the like, unless otherwise specified and considered not to be definitely so in principle, etc. The same goes for the above-mentioned number and range.

Now, preferred embodiments of the invention will be described below in detail based on the accompanying drawings. In all drawings for explanation of the embodiments, the member having the same function is designated by the same or related reference character, and thus a repeated description thereof will be omitted below. In the following embodiments, the description of the same or like parts is not repeated in principle if not necessary.

Among the drawings used for the embodiments, some cross-sectional views omit hatching for easy understanding. And, some plan views make hatching for easy understanding.

First Embodiment

A semiconductor device in the present invention includes a nonvolatile memory (nonvolatile storage element, flush memory, or nonvolatile semiconductor storage device). The nonvolatile memory mainly uses a trap insulating film (insulating film capable of storing charges therein) in a charge storing portion. In the following embodiments, the nonvolatile memory will be described below based on a memory cell using a trap insulating film using an n-channel metal insulator semiconductor field effect transistor (MISFET) as a reference. The polarity in the following embodiments (polarity of an applied voltage or polarity of a carrier in each of writing, erasing, and reading) is for explaining the operation of the memory cell including the n-channel MISFET as a basis. If the polarities of all of the applied voltage and the conduction type of the carrier are reversed, the same operation can be obtained in principle using the p-channel type MISFET as a basis.

The semiconductor device of this embodiment will be described below with reference to the accompanying drawings.

Figure 2:
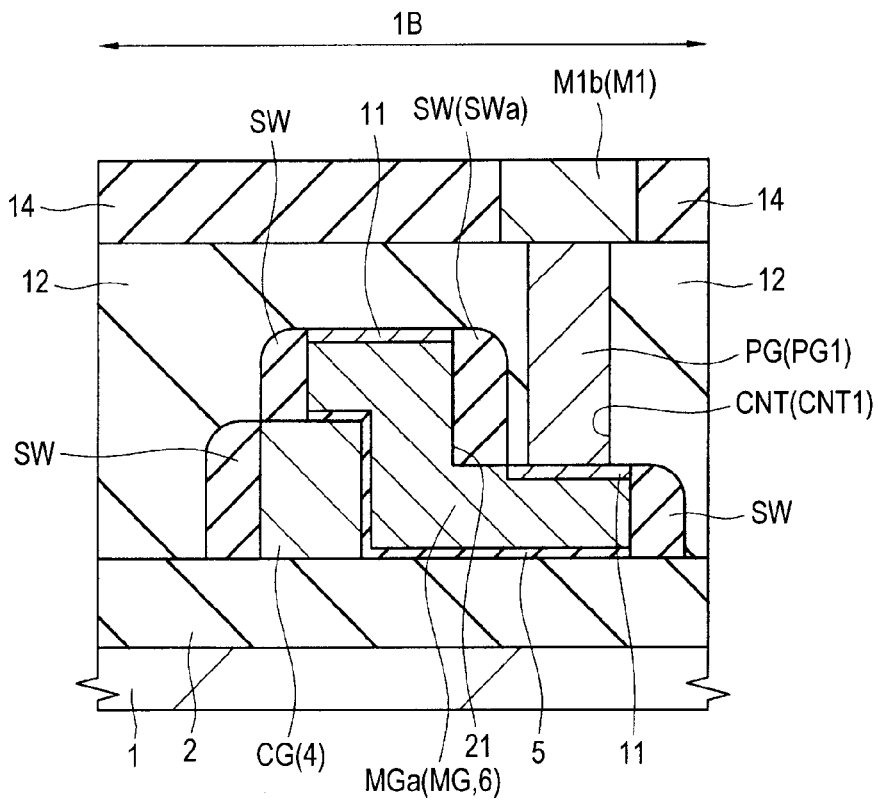
FIG. 2 is a cross-sectional view of a main part (memory gate shunt region) of a semiconductor device according to one embodiment of the invention.
Figure 3:
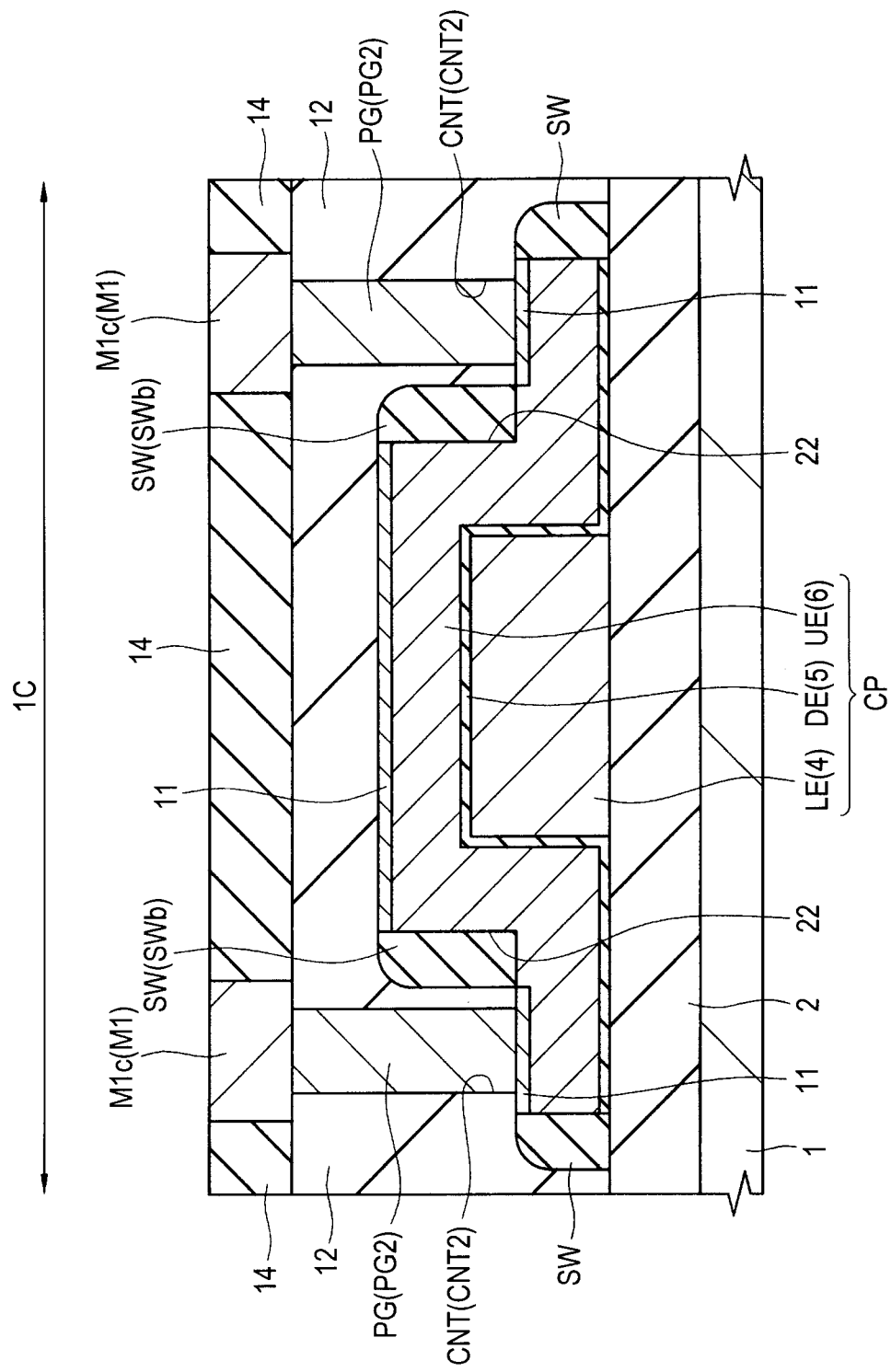
FIG. 3 is a cross-sectional view of a main part (capacitor formation region) of a semiconductor device according to one embodiment of the invention.
Figure 4:
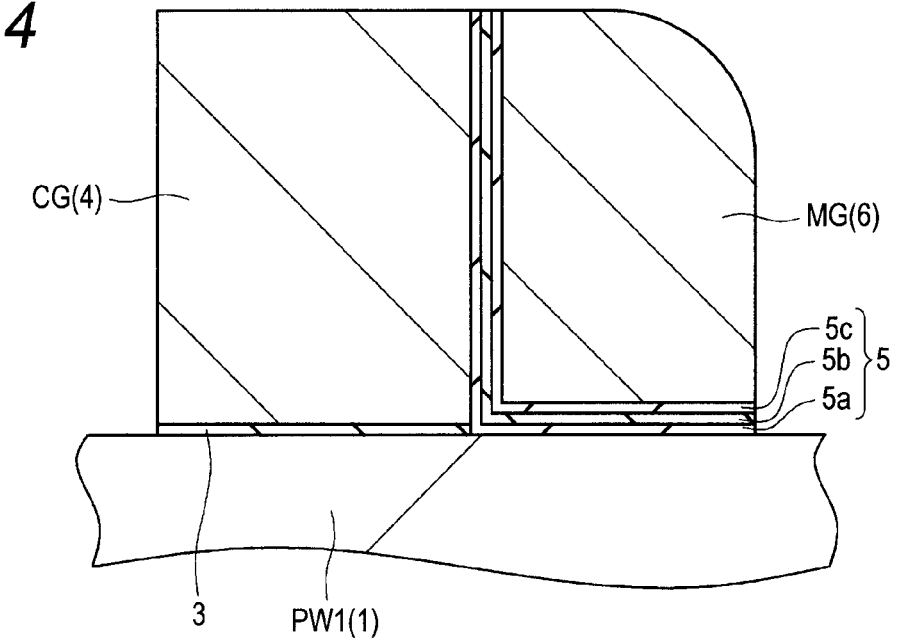
FIG. 4 is a partial enlarged cross-sectional view of a part of FIG. 1.
Figure 5:
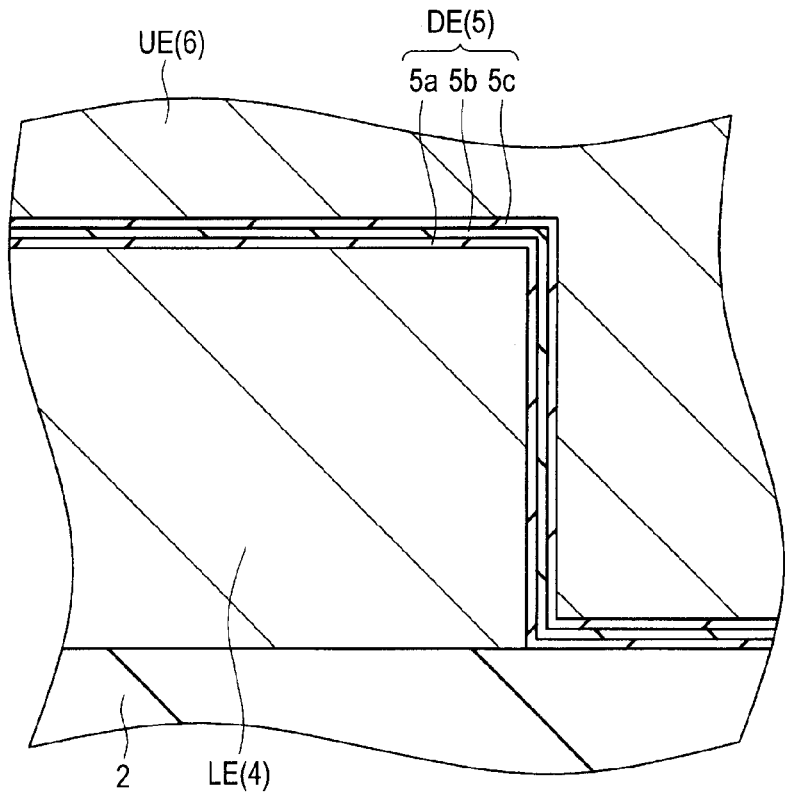
FIG. 5 is a partial enlarged cross-sectional view of a part of FIG. 3.

FIGS. 1 to 3 are cross-sectional views of main parts of the semiconductor device in this embodiment. FIG. 1 is a cross-sectional view of a main part of a memory cell region 1A of the nonvolatile memory. FIG. 2 is a cross-sectional view of a main part of a memory gate shunt region 1B. FIG. 3 is a cross-sectional view of a main part of a capacitor formation region 1C. FIG. 4 is a partial enlarged cross-sectional view (cross-sectional view of a main part) of a memory cell MC in the semiconductor device of this embodiment, showing an enlarged part of FIG. 1 (part of the memory cell region 1A). For easy understanding, FIG. 4 shows only a control gate electrode CG, a memory gate electrode MG, insulating films 3 and 5, and a substrate region directly under these elements (parts of the semiconductor substrate 1 forming the p-type well PW1) of the structure shown in FIG. 1. FIG. 5 is a partial enlarged cross-sectional view of a part of FIG. 3.

The semiconductor device of this embodiment is a semiconductor device including the nonvolatile memory. FIGS. 1 to 3 illustrate cross-sectional views of main parts of the memory cell region 1A, the memory gate shunt region 1B, and the capacitor formation region 1C of the nonvolatile memory, respectively. The memory cell region 1A is a region in which the memory cell MC of the nonvolatile memory is formed. The memory gate shunt region (power feeding region) 1B is a region used for coupling the memory gate electrode MG to a wiring M1, that is, a region in which the memory gate electrode MG (contact MGa thereof) is coupled to the wiring M1 via a plug PG. The capacitor formation region 1C is a region with a PIP type capacitive element CP formed therein. The memory cell region 1A, the memory gate shunt region 1B, and the capacitor formation region 1C correspond to different regions at the main surface of the same semiconductor substrate 1. FIGS. 1 and 2 show sections perpendicular to the direction of extending of the control gate electrode CG and the memory gate electrode MG (in the direction perpendicular to the paper surface of FIGS. 1 and 2). The control gate electrode CG shown in FIG. 1 and the control gate electrode CG shown in FIG. 2 are integrally formed together. The memory gate electrode MG shown in FIG. 1 is integrally formed with the contact MGa (contact MGa of the memory gate electrode MG) shown in FIG. 2. FIGS. 1 to 3 show different cross-sectional views of the memory cell region 1A, the memory gate shunt region 1B, and the capacitor formation region 1C, which are formed over the same semiconductor substrate 1. Capacitive elements CP formed in the capacitor formation region 1C are used for a peripheral circuit or the like. The peripheral circuit is, for example, a processor including a CPU, a control circuit, a sense amplifier, a column decoder a row decoder, an input/output circuit, and the like.

As shown in FIGS. 1 to 5, an element isolation region 2 for isolating elements is formed over the semiconductor substrate (semiconductor wafer) 1 made of a p-type single crystal silicon having a specific resistance of, for example, about 1 to 10 Ωcm. A p-type well PW1 is formed in an active region isolated (defined) by the element isolation region 2. The p-type well PW1 is mainly formed in the memory cell region 1A. The element isolation region 2 is formed in the memory gate shunt region 1B and the capacitor formation region 1C without formation of the p-type well PW1.

In the p-type well PW1 of the memory cell region 1A, a memory cell MC is formed as a component of a nonvolatile memory comprised of a memory transistor and a control transistor (selection transistor) as shown in FIG. 1. In the memory cell region 1A, a plurality of memory cells MC are actually formed in the form of array. FIG. 1 shows the section of one of the memory cells MC located in the memory cell region 1A. The memory cell region 1A is electrically isolated from other regions by the element isolation region 2.

As shown in FIGS. 1 and 4, the memory cell MC of the nonvolatile memory in the semiconductor device of this embodiment is a split gate type memory cell, which includes two MISFETs coupled together, specifically, a control transistor (selection transistor) with a control gate electrode (selection gate electrode) CG, and a memory transistor with a memory gate electrode (gate electrode for the memory) MG.

A MISFET (metal insulator semiconductor field effect transistor) including a gate insulating film with a charge storing portion (charge storing layer) and a memory gate electrode MG is hereinafter referred to as a memory transistor (transistor for storage). Another MISFET including a gate insulating film and a control gate electrode CG is hereinafter referred to as a control transistor (selection transistor, transistor for memory cell selection). Thus, the memory gate electrode MG is a gate electrode of the memory transistor, the control gate electrode CG is a gate electrode of the control transistor, and the control gate electrode CG an the memory gate electrode MG are gate electrodes included in the nonvolatile memory (memory cell thereof).

Now, the structure of the memory cell MC will be specifically described below.

As shown in FIGS. 1 and 4, the memory cell MC of the nonvolatile memory includes n-type semiconductor regions MS and MD for a source and a drain formed in the p-type well PW1 of the semiconductor substrate 1, the control gate electrode CG formed over the semiconductor substrate 1 (p-type well PW1), and the memory gate electrode MG adjacent to the control gate electrode CG formed over the semiconductor substrate 1 (p-type well PW1). The memory cell MC of the nonvolatile memory includes an insulating film (gate insulating film) 3 formed between the control gate electrode CG and the semiconductor substrate (p-type well PW1) 1, and an insulating film 5 formed between the memory gate electrode MG and the semiconductor substrate 1 (p-type well PW1), and between the memory gate electrode MG and the control gate electrode CG.

The control gate electrode (first gate electrode) CG and the memory gate electrode (second gate electrode) MG are arranged in parallel to extend along the main surface of the semiconductor substrate 1 with the insulating film 5 intervening in between the opposed side surfaces (sidewalls) of these gate electrodes. The extending direction of each of the control gate electrode CG and the memory gate electrode MG is the direction perpendicular to the paper surface of each of FIGS. 1 and 4. The control gate electrode CG and the memory gate electrode MG are formed via the insulating films 3 and 5 over the semiconductor substrate 1 (p-type well PW1) between the semiconductor region MD and the semiconductor region MS (note that the control gate electrode CG is formed via the insulating film 3, and the memory gate electrode MG is formed via the insulating film 5). The memory gate electrode MG is positioned on the semiconductor region MS side, and the control gate electrode CG is positioned on the semiconductor region MD side.

The control gate electrode CG and the memory gate electrode MG are adjacent to each other with the insulating film 5 intervening in therebetween, and the memory gate electrode MG is formed in the form of sidewall spacer over the sidewall (side) of the control gate electrode CG over the insulating film 5. The insulating film 5 extends across both the region between the memory gate electrode MG and the semiconductor substrate 1 (p-type well PW1), and the region between the memory gate electrode MG and the control gate electrode CG.

The insulating film 3 (that is, insulating film 3 under the control gate electrode CG) formed between the control gate electrode CG and the semiconductor substrate 1 (p-type well PW1) serves as a gate insulating film of the control transistor. The insulating film 5 (that is, the insulating film 5 under the memory gate electrode MG) formed between the memory gate electrode MG and the semiconductor substrate 1 (p-type well PW1) serves as a gate insulating film (gate insulating film having therein a charge storing portion) of the memory transistor.

The insulating film 3 can be formed using, for example, a silicon oxide film or a silicon oxynitride film. The insulating film 3 may be formed using a metal oxide film having a higher dielectric constant than that of a silicon nitride film, such as a hafnium oxide film, an aluminum oxide film (alumina), or a tantalum oxide film, in addition to the above silicon oxide film or silicon oxynitride film.

The insulating film 5 is comprised of a laminated film including a silicon oxide film (oxide film) 5a, a silicon nitride film (nitride film, charge storing layer) 5b over the silicon oxide film 5a, and another silicon oxide film (oxide film) 5c over the silicon nitride film 5b.

For easy understanding of FIGS. 1 to 3, the laminated film comprised of the silicon oxide film 5a, the silicon nitride film 5b, and the silicon oxide film 5c is simply illustrated as the insulating film 5. Actually, as shown in FIG. 4, the insulating film 5 is comprised of a laminated film including the silicon oxide film 5a, the silicon nitride film 5b over the silicon oxide film 5a, and the silicon oxide film 5c over the silicon nitride film 5b.

The insulating film 5 includes the laminated structure including the silicon oxide film 5a, the silicon nitride film 5b, and the silicon oxide film 5c. The insulating film 5 extends through the region between the memory gate electrode MG and the semiconductor substrate 1 (p-type well PW1) and the region between the memory gate electrode MG and the control gate electrode CG, and thus can also be regarded as a laminated gate insulating film (gate insulating film having the laminated structure). The insulating film 5 between the memory gate electrode MG and the semiconductor substrate 1 (p-type well PW1) serves as a gate insulating film of the memory transistor. The insulating film 5 between the memory gate electrode MG and the control gate electrode CG serves as an insulating film for insulating (electrically isolating) the memory gate electrode MG from the control gate electrode CG.

The silicon nitride film 5b of the insulating film 5 is an insulating film for storing charges, and thus serves as the charge storing layer (charge storing portion). That is, the silicon nitride film 5b is a trap insulating film formed in the insulating film 5. Thus, the insulating film 5 can be regarded as an insulating film having a charge storing portion (charge storing layer, namely, silicon nitride film 5b) therein.

The silicon oxide film 5c and the silicon oxide film 5a positioned above and under the silicon nitride film 5b can serve as the charge blocking layer (charge blocking film, charge trapping layer). Sandwiching of the silicon nitride film 5b between the silicon oxide film 5c and the silicon oxide film 5a can store charges into the silicon nitride film 5b. The silicon oxide film 5a, the silicon nitride film 5b, and the silicon oxide film 5c can be regarded as an oxide-nitride-oxide (ONO) film.

The semiconductor region MS is a semiconductor region serving as one of a source region and a drain region, and the semiconductor region MD is a semiconductor region serving as the other of the source region and the drain region. The semiconductor region MS is a semiconductor region serving as the source region, and the semiconductor region MD is a semiconductor region serving as the drain region. The semiconductor regions MS and MD respectively have a lightly doped drain (LDD) structure comprised of a semiconductor region (n-type impurity diffusion layer) with n-type impurities introduced thereinto. That is, the semiconductor region MS for the source includes an n$^-$-type semiconductor region 7a, and an n$^+$-type semiconductor region 8a having a higher impurity concentration than that of the n$^-$-type semiconductor region 7a. The semiconductor region MD for the drain includes an n$^-$-type semiconductor region 7b, and a n$^+$-type semiconductor region 8b having a higher impurity concentration than that of the n$^-$-type semiconductor region 7b. The n$^+$-type semiconductor region 8a has a junction depth more than that of the n$^-$-type semiconductor region 7a, and an impurity concentration higher than that of the n$^-$-type semiconductor region 7a. The n$^+$-type semiconductor region 8b has a junction depth more than that of the n$^-$-type semiconductor region 7b, and an impurity concentration higher than that of the n$^-$-type semiconductor region 7b.

A sidewall insulating film (sidewall, sidewall spacer) SW comprised of an insulator (silicon oxide film, insulating film), such as a silicon oxide film, is formed over the sidewalls of the memory gate electrode MG and the control gate electrode CG (sidewalls not adjacent to each other). That is, the sidewall insulating film SW is formed over the sidewall (side) of the memory gate electrode MG opposite to the side adjacent to the control gate electrode CG via the insulating film 5, and over the sidewall (side) of the control gate electrode CG opposite to the side adjacent to the memory gate electrode MG via the insulating film 5.

The n$^-$-type semiconductor region 7a of the source is formed in self-alignment with the sidewall of the memory gate electrode MG, and the n$^+$-type semiconductor region 8a is formed in self-alignment with the side of the sidewall insulating film SW at the sidewall of the memory gate electrode MG (side opposite to the side in contact with the memory gate electrode MG). Thus, the low-concentration n$^-$-type semiconductor region 7a is formed under the sidewall insulating film SW at the sidewall of the memory gate electrode MG, whereas the high-concentration n$^+$-type semiconductor region 8a is formed outside the low-concentration n$^-$-type semiconductor region 7a. The low-concentration n$^-$-type semiconductor region 7a is formed adjacent to the channel region of the memory transistor. The high-concentration n$^+$-semiconductor region 8a is formed in contact (adjacent) to the low-concentration n$^-$-type semiconductor region 7a so as to be spaced apart from the channel region of the memory transistor by the n$^-$-type semiconductor region 7a.

The n$^-$-type semiconductor region 7b of the drain is formed in self-alignment with the sidewall of the control gate electrode CG. The n$^+$-type semiconductor region 8b is formed in self-alignment with the side of the sidewall insulating film SW at the sidewall of the control gate electrode CG (the side opposite to the side in contact with the control gate electrode CG). Thus, the low-concentration n$^-$-type semiconductor region 7b is formed under (below) the sidewall insulating film SW at the sidewall of the control gate electrode CG. The high-concentration n$^+$-type semiconductor region 8b is formed outside the low-concentration n$^-$-type semiconductor region 7b. Accordingly, the low-concentration n$^-$-type semiconductor region 7b is formed adjacent to the channel region of the control transistor. The high-concentration n$^+$-type semiconductor region 8b is formed in contact (adjacent) to the low-concentration n$^-$-type semiconductor region 7b so as to be spaced apart from the channel region of the control transistor by the n$^-$-type semiconductor region 7b.

The channel region of the memory transistor is formed under the insulating film 5 below the memory gate electrode MG. The channel region of the control transistor is formed under the insulating film 3 below the control gate electrode CG. A semiconductor region (p-type semiconductor region or n-type semiconductor region) for adjustment of a threshold of the control transistor is formed in the channel formation region of the control transistor under the insulating film 3 below the control gate electrode CG if necessary. Another semiconductor region (p-type semiconductor region or n-type semiconductor region) for adjustment of a threshold of the memory transistor is formed in the channel formation region of the memory transistor under the insulating film 5 below the control gate electrode MG if necessary.

The control gate electrode CG is comprised of a conductor (conductive film), preferably, a silicon film 4, such as an n-type polysilicon film (polycrystalline silicon film with n-type impurities introduced thereinto, doped polysilicon film). The silicon film 4 included in the control gate electrode CG is an n-type silicon film into which n-impurities are introduced to decrease its resistance. Specifically, the control gate electrode CG is comprised of the patterned silicon film 4.

The memory gate electrode MG is comprised of a silicon film 6. The silicon film 6 included in the memory gate electrode MG is preferably a silicon film having a low concentration of impurities, or a non-doped (undoped) silicon film. The concentration of impurities of the silicon film 6 is more preferably equal to or less than $1 \times 10^{19}/cm^3$.

The non-doped (undoped) silicon film means a silicon film into which no impurities are intended to be introduced (added, or doped). Thus, the term "non-doped (undoped)" silicon film does not exclude the case where the silicon film contains an undesired small amount of impurities. In contrast, the silicon film into which impurities are introduced (doped) means a silicon film into which impurities are intended to be introduced (added, or doped).

The silicon film 6 is preferably a polysilicon (polycrystalline silicon) film. The silicon film 6 included in the memory gate electrode MG is preferably a polysilicon (polycrystalline silicon) film having a low concentration of impurities, or a non-doped polysilicon (polycrystalline silicon) film. When impurities are introduced into the silicon film 6 included in the memory gate electrode MG, the introduced impurities are preferably n-type impurities (made of, for example, arsenic (As) or phosphorus (P)). Thus, when the silicon film 6 included in the memory gate electrode MG is comprised of a polysilicon (polycrystalline silicon) film having a low concentration of impurities, the silicon film 6 is more preferably an n-type polysilicon film (polycrystalline silicon film into which n-type impurities are introduced, n-type doped polysilicon film).

In this embodiment, the concentration of impurities of the memory gate electrode MG of the memory cell MC (silicon film 6 included therein) is lower than that of a lower electrode LE (silicon film 6 included therein) and the contact MGa (silicon film 6 included therein), which is the main feature of the invention, and will be described below.

A metal silicide layer (metal silicide film) 11 is formed over an upper part (upper surface) of the metal gate electrode MG (silicon film 6 included therein), an upper part (upper surface) of the control gate electrode CG (silicon film 4 included therein), and an upper part (upper surface, surface) of the n+-type semiconductor regions 8a and 8b by the self aligned silicide (Salicide) technique or the like. The metal silicide layer 11 is comprised of, for example, a cobalt silicide layer or a nickel silicide layer. The metal silicide layer 11 can decrease a diffusion resistance or a contact resistance. The combination of the silicon film 4 included in the control gate electrode CG and the metal silicide layer 11 thereover can be regarded as the control gate electrode CG. The combination of the silicon film 6 included in the memory gate electrode MG and the metal silicide layer 11 thereover can be regarded as the memory gate electrode MG. From the viewpoint of preventing the short-circuit between the memory gate electrode MG and the control gate electrode CG as much as possible, no metal silicide layer 11 is possibly formed over one or both of the memory gate electrode MG and the control gate electrode CG.

As shown in FIG. 2, a contact hole CNT1 for coupling to the memory gate electrode MG and a plug PG1 filling the hole among the contact holes CNT and the plugs PG filling the holes are formed over the contact MGa of the memory gate electrode MG in the memory gate shunt region 1B. The contact MGa is integrally formed with the memory gate electrode MG formed in the form of sidewall spacer over the sidewall of the control gate electrode CG via the insulating film 5. That is, a part of the memory gate electrode MG other than the contact MGa is formed in the form of sidewall spacer over the sidewall of one of the control gate electrodes CG via the insulating film 5. The part formed in the form of sidewall spacer is integrally formed with the contact MGa. Thus, the contact MGa can be regarded as one of the memory gate electrodes MG, and the contact MGa is a part not serving as a gate electrode of the memory transistor in the memory cell MC of the nonvolatile memory. Thus, the contact MGa is preferably provided in a region other than the memory cell region 1A in which a plurality of memory cells MC are arranged in array (for example, a memory gate shunt region 1B disposed in the vicinity of the memory cell region 1A), and is more preferably disposed over the element isolation region 2.

More preferably, the presence of the element isolation region 2 under the contact MGa can prevent the semiconductor substrate 1 from being exposed when the contact hole CNT1 is displaced, or can prevent the formation of a parasitic capacity. No existence of the element isolation region 2 under the contact MGa can ensure the insulating between the semiconductor substrate 1 and the contact MGa because the insulating film 5 intervenes in between the semiconductor substrate 1 and the contact MGa.

The contact MGa extends from one sidewall of the control gate electrode CG (sidewall on the side with the memory gate electrode MG formed thereat) via the insulating film 5 in the direction spacing apart from the adjacent control gate electrode CG. A part of the contact MGa runs on the control gate electrode CG, and the contact MGa has its part positioned over the control gate electrode CG. That is, the contact MGa extends over the element isolation region 2 from the control gate electrode CG via the sidewall of the control gate electrode CG. The insulating film 5 intervenes in between the contact MGa of the memory gate electrode MG and the sidewall of the control gate electrode CG. The sidewall insulating film SW is also formed over the side (sidewall) of the contact MGa. The metal silicide layer 11 is also formed over the upper part (upper surface) of the contact MGa not covered by the sidewall insulating film SW.

The contact MGa is a part for coupling the plug PG1 for supplying (performing power-feeding) a predetermined voltage (potential) to the memory gate electrode MG. The predetermined operating voltage (potential) is applied (supplied) to the contact MGa from the wiring M1b via the plug PG1. The voltage (potential) applied to the contact MGa is transmitted to the memory gate electrode MG of the memory cell, so that the memory gate electrode MG can serve as a predetermined operating voltage (potential) to perform a predetermined operation of the memory cell. The operating voltage to be applied to the contact MGa corresponds to the Vmg of FIG. 8 to be described later.

The memory gate electrode MG is formed by etching back (applying anisotropic etching to) the silicon film 6 covering the control gate electrode CG over the semiconductor substrate 1 to leave the silicon film 6 in the form of sidewall spacer via the insulating film 5 at the sidewall of the control gate electrode CG, as will be described later. Thus, a part of the memory gate electrode MG other than the contact MGa is formed by the silicon film 6 remaining in the form of sidewall spacer. As will be described in detail below, in the etching back step of the silicon film 6, a resist pattern (corresponding to a photoresist pattern RP2a to be described later) is formed over the silicon film 6 and a part of the silicon film 6 under the photoresist pattern is left, so that the contact MGa of the memory gate electrode MG is formed.

Like the memory gate electrode MG in the form of sidewall spacer, the contact MGa is also formed by the silicon film 6.

In this embodiment, the concentration of impurities of the contact MGa (silicon film 6 included therein) is higher than that of the memory gate electrode MG (silicon film 6 included therein) of the memory cell MC. Due to a difference in concentration of impurities, the resistance of the contact MGa (silicon film 6 included therein) is lower than that of the memory gate electrode MG (silicon film 6 included therein) in the memory cell region 1A.

As shown in FIG. 3, a capacitive element (capacitor) CP is formed over the same semiconductor substrate 1 as the semiconductor substrate 1 with the memory cell MC of the nonvolatile memory formed therein. The capacitive element CP in the capacitor formation region 1C will be specifically described below.

As shown in FIG. 3, the element isolation region 2 is formed in the semiconductor substrate 1 over the entire capacitor formation region 1C. As shown in FIG. 3, a lower electrode (first electrode) LE of the capacitive element CP is formed above the semiconductor substrate 1 in the capacitor formation region 1C, that is, over the element isolation region 2. The lower electrode LE in the capacitor formation region 1C is formed of the same conductive film (silicon film 4) as that of the control gate electrode CG in the memory cell region 1A and the memory gate shunt region 113. That is the control gate electrode CG and the lower electrode LE are formed of the silicon film 4 (patterned silicon film 4). The silicon film 4 included in the control gate electrode CG and the lower electrode LE has n-type impurities introduced thereinto to decrease its resistance.

As will be described in detail below, the control gate electrode CG and the lower electrode LE are formed by forming the silicon film 4 over the main surface of the semiconductor substrate 1 including the memory cell region 1A, the memory gate shunt region 1B, and the capacitor formation region 1C, ion-implanting n-type impurities into the silicon film 4; and patterning the silicon film 4 by photolithography, dry etching, and the like.

An upper electrode (second electrode) UE is formed over the lower electrode LE via the capacity insulating film DE. The capacity insulating film DE is formed of the same insulating film as the insulating film 5 in the memory cell region 1A and the memory gate shunt region 1B. That is, the capacity insulating film DE of the capacitive element CP is formed of the same layer of the insulating film 5 as the gate insulating film (memory gate insulating film, namely, insulating film 5) of the memory transistor of the memory cell MC. In short, the capacity insulating film DE of the capacitive element CP and the gate insulating film (memory gate insulating film) of the memory transistor of the memory cell MC are formed by the insulating film 5. Thus, as shown in FIG. 5, the capacity insulating film DE of the capacitive element CP is comprised of a laminated film (that is, insulating film 5) including the silicon oxide film 5a, the silicon nitride film 5b over the silicon oxide film 5a, and the silicon oxide film 5c over the silicon nitride film 5b. For easy understanding of FIG. 3, the laminated film of the silicon oxide film 5a, the silicon nitride film 5b, and the silicon oxide film 5c is shown as the single capacity insulating film DE.

The capacity insulating film DE and the upper electrode UE are patterned and formed as a laminated layer pattern to cover at least a part of the lower electrode LE.

The upper electrode UE in the capacitor formation region 1C is formed of the same layer of the conductive film as the memory gate electrode MG in the memory cell region 1A and the memory gate shunt region 1B. That is, the upper electrode UE in the capacitor formation region 1C is formed by the same layer of the silicon film 6 as the silicon film 6 included in the memory gate electrode MG. That is, the memory gate electrode MG and the upper electrode UE each are formed of the silicon film 6. The memory gate electrode MG is separated from the upper electrode UE.

The memory gate electrode MG in the memory cell region 1A and the upper electrode UE in the capacitor formation region 1C are formed of the same layer of the silicon film 6, but differ from each other in concentration of impurities. That is, in the main aspect of this embodiment, the concentration of impurities of the upper electrode UE (silicon film 6 included therein) in the capacitor formation region 1C is higher than that of the memory gate electrode MG (silicon film 6 included therein) in the memory cell region 1A. That is, the upper electrode UE in the capacitor formation region 1C and the memory gate electrode MG in the memory cell region 1A are formed of the same layer of the silicon film 6. The concentration of impurities of the silicon film 6 included in the upper electrode UE in the capacitor formation region 1C (specifically, n-type impurity concentration) is higher (at a higher level) than that of the silicon film 6 (specifically, concentration of n-type impurities) included in the memory gate electrode MG in the memory cell region 1A. Due to the difference in concentration of impurities, the resistance of the upper electrode UE (silicon film 6 included therein) in the capacitor formation region 1C is lower than that of the memory gate electrode MG (silicon film 6 included therein) in the memory cell region 1A.

The memory gate electrode MG and the upper electrode UE are formed by forming the silicon film 6 over the main surface of the semiconductor substrate 1 including the memory cell region 1A, the memory gate shunt region 1B, and the capacitor formation region 1C so as to cover the control gate electrode CG and the lower electrode LE, and then applying anisotropic etching to the silicon film 6. At this time, the upper electrode UE is formed by previously forming a resist pattern (corresponding to the photoresist pattern RP2b to be described later) over the silicon film 6 before the anisotropic etching to leave the silicon film 6 under the resist pattern. Thus, the upper electrode UE is formed by the patterned silicon film 6. Thereafter, impurities are introduced into the upper electrode UE in the capacitor formation region 1C (silicon film 6 included therein) without introducing impurities into the memory gate electrode MG in the memory cell region 1A (silicon film 6 included therein). Thus, the concentration of impurities of the upper electrode UE (silicon film 6 included therein) in the capacitor formation region 1C can be higher than the concentration of impurities of the memory gate electrode MG (silicon film 6 included therein) in the memory cell region 1A. A manufacturing process thereof will be described later.

The capacitive element (PIP type capacitive element) CP is formed by the lower electrode LE, the capacitive insulating film DE, and the upper electrode UE. The lower electrode LE serves as one electrode of the capacitive element CP, the upper electrode UE serves as the other electrode of the capacitive element CP, and the capacity insulating film DE serves as a dielectric film of the capacitive element CP. The sidewall insulating film SW is also formed over the sides of the upper electrode UE and over the sides of the lower electrode LE in a region not covered by a laminated pattern of the capacity insulating film DE and the upper electrode UE. The metal silicide layer 11 is formed over the upper part (upper surface) of the upper electrode UE not covered with the sidewall insulating films SW, and over the upper part (upper surface) of the lower electrode LE not covered with the laminated pattern including the capacity insulating film DE and the upper electrode UE.

The laminated pattern of the capacity insulating film DE and the upper electrode UE does not cover the entire surface of the lower electrode LE. In the section different from FIG. 3, a part of the lower electrode LE is not covered by the laminated pattern of the capacity insulating film DE and the upper electrode UE. This is because the plugs PG can be coupled to a region of the lower electrode LE not covered by the laminated pattern of the capacity insulating film DE and the upper electrode UE.

As shown in FIG. 3, the upper electrode UE has a part not positioned above the lower electrode LE. An insulating film 12 over the part of the upper electrode UE not positioned above the lower electrode LE has a contact hole CNT (which is hereinafter referred to as a contact hole CNT2). A plug PG (which is hereinafter referred to as a plug PG2) embedded in the contact hole CNT2 is electrically coupled to the upper electrode UE. The plug PG2 is coupled to the wiring M1c, and the wiring M1c is electrically coupled to the upper electrode UE via the plug PG2.

The capacitive element CP is the so-called polysilicon insulator polysilicon (PIP) type capacitive element. The PIP-type capacitive element is a capacitive element (polysilicon capacitive element) comprised of two layered polysilicon layers (comprised of the lower electrode LE and the upper electrode UE), and an insulating film sandwitched therebetween (capacity insulating film DE).

The capacitive element CP is preferably disposed over the element isolation region 2. The presence of the element isolation region 2 under the capacitive element CP ensures insulation between the semiconductor substrate 1 and the capacitive element CP, which can prevent the formation of unnecessary defined capacity or the like. However, even when no element isolation region 2 exists under the capacitive element CP, the same insulating film as the insulating film 3 is formed between the lower electrode LE and the semiconductor substrate 1 (note that this structure can be obtained by forming the insulating film 3 not only in the memory cell region 1A, but also in the capacitor formation region 1C in step S4 to be described later). The insulating film 5 intervenes in between the part of the upper electrode UE not located above the lower electrode LE and the semiconductor substrate 1, so that the insulation can be ensured between the semiconductor substrate 1 and the lower electrode or upper electrode UE.

An insulating film 12 is formed as an interlayer insulating film over the semiconductor substrate 1 so as to cover the control gate electrode CG, the memory gate electrode MG, the lower electrode LE, the upper electrode UE, and the sidewall insulating film SW. The insulating film 12 is comprised of a single film of a silicon oxide film, or a laminated film made of a silicon nitride film and a silicon oxide film which is formed over the silicon nitride film and which is thicker than the silicon nitride film. The insulating film 12 has its upper surface flattened.

Contact holes (openings or through holes) CNT are formed in the insulating film 12. A conductive plug PG is embedded as a conductor (conductor for connection) in each contact hole CNT.

The plug PG is formed of a thin barrier conductive film formed over the bottom and sidewalls (sides) of the contact hole CNT, and a main conductive film formed over the barrier conductive film to fill the contact hole CNT. For simplifying the drawings, FIGS. 1 and 3 show the barrier conductive film and the main conductive film integrally formed and included in the plug PG. The barrier conductive film included in the plug PG can be, for example, a titanium film, a titanium nitride film, or a laminated film thereof. The main conductive film included in the plug PG can be a tungsten film.

The contact holes CNT and the plugs PG embedded therein are formed above the $n^+$-type semiconductor regions 8a and 8b, the control gate electrode CG, the memory gate electrode MG, the lower electrode LE and the upper electrode UE. At the bottom of each contact hole CNT, a part of the main surface of the semiconductor substrate 1, for example, a part of each of the $n^+$-type semiconductor regions 8a and 8b (metal silicide layer 11 thereover), a part of the control gate electrode CG (metal silicide layer 11 thereover), a part of the contact MGa (metal silicide layer 11 thereover) of the memory gate electrode MG, a part of the lower electrode LE (metal silicide layer 11 thereover), or a part of the upper electrode UE (metal silicide layer 11 thereover) is exposed. The plug PG is coupled to the exposed part (exposed part at the bottom of the contact hole CNT).

Referring to a cross-sectional view of FIG. 1, the section in which the part of the $n^+$-type semiconductor region 8b (metal silicide layer 11 thereover) is exposed at the bottom of the contact hole CNT to be electrically coupled to the plug PG filling the contact hole CNT. As shown in the cross-sectional view of FIG. 2, the contact MGa (metal silicide layer 11 thereover) of the memory gate electrode MG is exposed at the bottom of the contact hole CNT (which is hereinafter referred to as a contact hole CNT1) to be electrically coupled to the plug PG (hereinafter referring to as a plug PG1) filling the contact hole CNT1. As shown in the cross-sectional view of FIG. 3, a part of the upper electrode UE (metal silicide layer 11 thereover) is exposed at the bottom of the contact hole CNT to be electrically coupled to the plug PG filling the contact hole CNT.

As shown in FIG. 2, a contact hole CNT1 among the contact holes CNT is formed above the flattened part positioned over the element isolation region 2 in the contact MGa, and then the plug PG1 filling the contact hole CNT1 is electrically coupled to the contact MGa. The plug PG1 is electrically coupled to the contact MGa of the memory gate electrode MG at the bottom of the contact hole CNT1. When the metal silicide layer 11 is formed over the memory gate electrode MG as shown in FIG. 2, the plug PG1 embedded in the contact hole CNT1 is electrically coupled to the meal silicide layer 11 over the contact MGa at the bottom of the contact hole CNT1, whereby the plug is electrically coupled to the memory gate electrode MG (contact M Ga).

The wirings (wiring layers) M1 are formed over the insulating film 12 with the plugs PG embedded therein. Each wiring M1 is, for example, a damascene wiring (embedded wiring), and is embedded in a wiring trench provided in the insulating film 14 formed over the insulating film 12. The wiring M1 is electrically coupled via the plug PG to the source region (semiconductor region MS) of the memory transistor, the drain region (semiconductor region MD) of the control transistor, the control gate electrode CG, the memory gate electrode MG, the upper electrode UE, or the lower electrode LE. As shown in FIG. 1, as one example of the wiring M1, a wiring M1a is electrically coupled to a drain region (semiconductor region MD) of the control transistor via the plug PG. As shown in FIG. 2, a wiring M1b is electrically coupled to the memory gate electrode MG (contact MGa) over the plug PG1. As shown in FIG. 3, a wiring M1c is electrically coupled to the upper electrode UE via the plug PG. Further, another wiring and insulating film located as the upper layer are also formed, and its illustration and description will be omitted below. The wiring M1 and another wiring thereover can be formed by patterning not only the damascene wiring (embedding wiring), but also a conductive film for wiring, and thus can be, for example, a tungsten wiring or an aluminum wiring.

Figure 6:
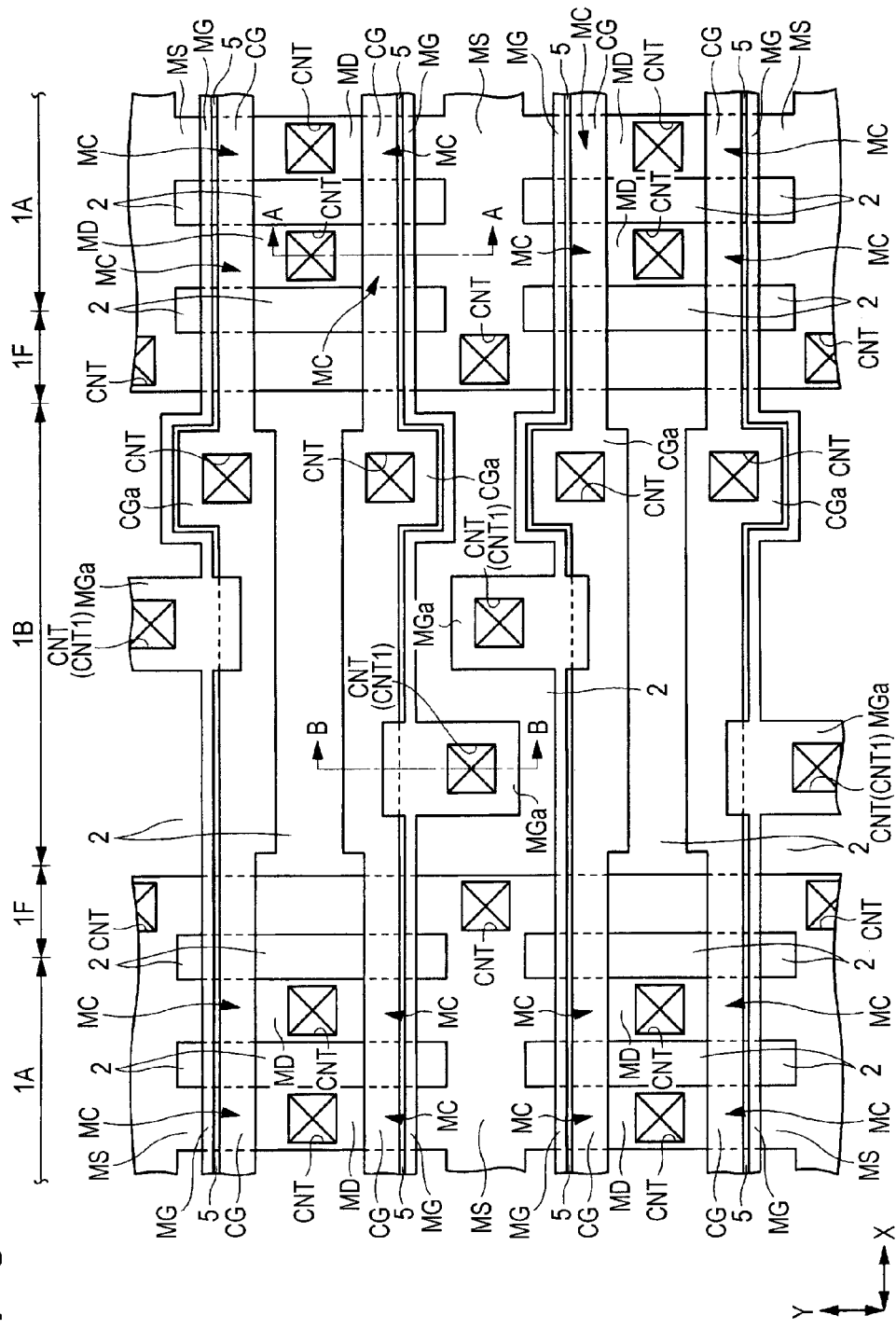
FIG. 6 is a plan view of a main part of the semiconductor device in the one embodiment of the invention.

FIG. 6 is a plan view of a main part of the semiconductor device of this embodiment, showing the memory cell region 1A, the source dummy region 1F, and the memory gate shunt region 1B. The section taken along the line A-A of FIG. 6 corresponds to the above FIG. 1, while the section taken along the line B-B of FIG. 6 corresponds to the above FIG. 2. For easy understanding, the plan view of FIG. 6 illustrates a planar layout of the control gate electrode CG, the memory gate electrode MG, the insulating film 5 between the control gate electrode CG and the memory gate electrode MG, the semiconductor region MS for the source, the semiconductor region MD for the drain, the element isolation region 2, and the contact hole CNT, and thus an illustration of other components will be omitted below. The above capacitor formation region 1C is not shown in FIG. 6.

As shown in FIG. 6, the memory cells MC of the nonvolatile memory are arranged in the array over the main surface of the semiconductor substrate 1 (more specifically, in the memory cell region 1A). The control gate electrodes CG of the memory cell MC arranged in the direction X of FIG. 6 among the memory cells MC arranged in the array (in column) in the directions X and Y of FIG. 6 are integrally formed along the direction X. That is, one control gate electrode CG extending in the direction X of FIG. 6 includes control gate electrodes (selection gate electrodes) of a plurality of memory cells MC arranged in parallel in the direction X of FIG. 6. The control gate electrodes CG each extending in the direction X are arranged in parallel in the direction Y of FIG. 6. Thus, the respective control gate electrodes CG extend in the direction X of FIG. 6, and serve as control gate electrodes (selection gate electrodes) of a plurality of memory cells MC arranged in parallel in the direction X of FIG. 6 and also as control gate lines (selection gate lines) for electrically coupling the control gate electrodes of the memory cells MC arranged in the direction X of FIG. 1.

Among the memory cells MC arranged in the array (in column) in the directions X and Y of FIG. 6, the memory gate electrodes MG of the memory cells MC arranged in the direction X of FIG. 6 are coupled together in the direction X and integrally formed. That is, one memory gate electrode MG extending in the direction X of FIG. 6 includes memory gate electrodes of a plurality of memory cells MC arranged in parallel in the direction X of FIG. 6. The memory gate electrodes MG each extending in the direction X are arranged in parallel in the direction Y of FIG. 6. Thus, the respective memory gate electrodes MG extend in the direction X of FIG. 6, and serve as memory gate electrodes of a plurality of memory cells MC arranged in parallel in the direction X of FIG. 6 and also as memory gate lines for electrically coupling the memory gate electrodes of the memory cells MC arranged in the direction X of FIG. 1. The memory gate electrode MG is adjacent to the control gate electrode CG via the insulating film 5. The directions X and Y of FIG. 6 are the direction parallel to the main surface of the semiconductor substrate 1. The direction Y is the direction intersecting the direction X, preferably, perpendicular to the direction X.

Among the memory cells MC arranged in the array in the directions X and Y of FIG. 6, the memory cells MC adjacent (next) to each other in the direction Y of FIG. 6 via the semiconductor region MD as the drain region share the semiconductor region MD as the drain region. The memory cells MC adjacent (next) to each other in the direction Y of FIG. 6 via the semiconductor region MC as the source region shares the semiconductor region MS serving as the source region.

The contact hole CNT and the plug PG filling the hole for coupling the semiconductor region MS for the source, among the contact holes CNT and the plugs PG filling the holes is formed above the semiconductor region MS in the source dummy region 1F at the end (outer periphery) of the memory cell region 1A. The contact hole CNT for coupling to the semiconductor region MS for the source and the plug PG filling the hole are disposed in the source dummy region 1F at the end (outer periphery) of the memory cell region 1A, so that the source dummy region 1F becomes the memory cell dummy region to serve as measures against crystal defects. Thus, the source dummy region 1F does not preferably have a memory cell MC disposed therein (in other words, is not used as the memory cell MC).

Among the contact holes CNT and the plugs PG filling the holes, the contact hole CNT and the plug filling the hole for coupling to the semiconductor region MD for the drain is formed above the semiconductor region MD (above the $n^+$-type semiconductor region 8b thereof) for the drain of each memory cell MC in the memory cell region 1A.

As shown in FIG. 6, the control gate electrode CG and the memory gate electrode MG which are adjacent to each other via the insulating film 5 extends not only to the memory cell region 1A, but also to the memory gate shunt region 1B. The memory gate shunt region 1B is a region for coupling the control gate electrode CG and the memory gate electrode MG to the wiring M1. The element isolation region 2 is formed in the entire memory gate shunt region 1B. As shown in FIG. 2, in the memory gate shunt region 1B, the control gate electrode CG and the memory gate electrode MG adjacent to each other via the insulating film 5 extend over the element isolation region 2.

The control gate electrode CG in the memory cell region 1A serves as a gate electrode of the control transistor included in the memory cell MC. The control gate electrode CG in the memory gate shunt region 1B is positioned over the element isolation region 2. The control gate electrode does not serve as a gate electrode of the control transistor of the memory cell MC. The control gate electrode CG in the memory gate shunt region 1B serve as control gate lines (selection gate lines) for electrically coupling the control gate electrodes of the memory cells MC arranged in the direction X as shown in FIG. 6. The memory gate electrode MG in the memory cell region 1A serves as a gate electrode of the memory transistor included in the memory cell MC. The memory gate electrode MG in the memory gate shunt region 1B is positioned over the element isolation region 2, and serves not as the gate electrode of the memory transistor of the memory cell MC, but as the memory gate line for electrically coupling the memory gate electrodes of the memory cells MC arranged in the direction X shown in FIG. 6.

Among the contact holes CNT and the plugs PG filling the holes, the contact hole CNT and the plug PG filling the hole for coupling to the control gate electrode CG are formed above the contact CGa of the control gate electrode CG in the memory gate shunt region 1B. The contact CGa of the control gate electrode CG is a part (wide part) whose width (width in the direction Y) is relatively widened at the lower part of the contact hole CNT, and is integrally formed with the control gate electrode CG. The contact hole CNT is formed above the contact part CGa whose width is relatively widened in the control gate electrode CG, and the plug PG embedded in the contact hole CNT is coupled to the contact CGa, which can prevent displacement of the contact hole CNT to ensure the exposure of the control gate electrode CG at the bottom of the contact hole CNT. Thus, the plug PC can be surely coupled (electrically coupled) to the control gate electrode CG.

Among the contact holes CNT and the plugs PG filling the holes, the contact hole CNT1 and the plug PG1 filling the hole for coupling to the memory gate electrode MG are formed above the contact MGa of the memory gate electrode MG in the memory gate shunt region 1B. As described above, the contact MGa of the memory gate electrode MG extends from above the control gate electrode CG over the element isolation region 2 across the sidewall of the control gate electrode CG (extending in the direction Y of FIG. 6), and is integrally formed with the memory gate electrode MG.

Unlike this embodiment, if a contact hole CNT1 and a plug PG1 filling the hole are formed over the memory gate electrode MG in the form of sidewall spacer without the contact MGa, it is not easy to surely form the contact hole CNT1 over the memory gate electrode MG in the form of sidewall without being superimposed on the control gate electrode CG. For example, since there is a small margin with respect to an offset of the contact hole, the reliability of electric coupling between the memory gate electrode MG and the plug PG1 filling the contact hole CNT1 is reduced, which can decrease the manufacturing yield of the semiconductor device.

In contrast, in this embodiment, the contact hole CNT1 and the plug PG1 filling the hole are formed above the contact MGa of the memory gate electrode MG, which can surely expose the contact MGa as a part of the memory gate electrode MG at the bottom of the contact hole CNT1. Thus, the plug PG1 can be surely coupled (electrically coupled) to the memory gate electrode MG (contact MGa thereof). Further, the control gate CG can be surely prevented from being exposed at the bottom of the contact hole CNT1, whereby the control gate electrode CG and the memory gate electrode MG can be prevented from being short-circuited by the plug PG1.

Figures 7, 8:
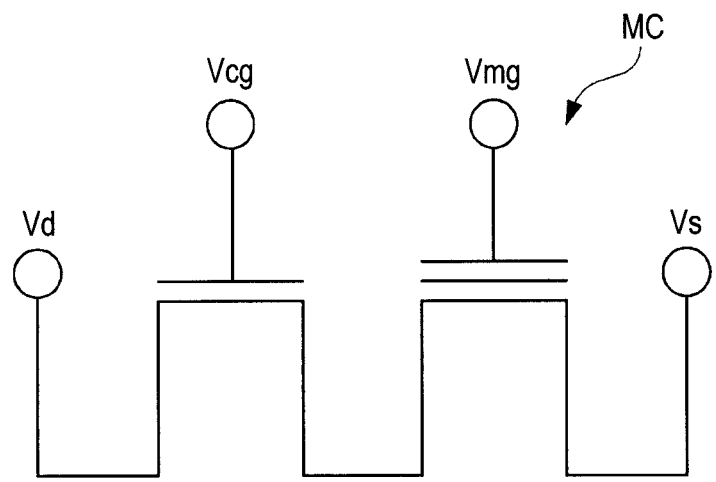
FIG. 7 is a diagram of an equivalent circuit of a memory cell.
FIG. 8 is a table showing one example of application conditions of voltages to respective components of a selection memory cell at the times of "writing", "erasing", and "reading"

FIG. 7 is an equivalent circuit diagram of the memory cell MC. FIG. 8 is a table showing an example of application conditions of voltages to respective components of the selection memory cell in "writing", "erasing", and "reading" of this embodiment. The table of FIG. 8 shows a voltage Vmg applied to the memory gate electrode MG of the memory cell (selection memory cell), a voltage Vs applied to the source region (semiconductor region MS), a voltage Vcg applied to the control gate electrode CG, a voltage Vd applied to the drain region (semiconductor region MD), and a voltage Vb applied to the p-type well PW1 at each of the "writing", "erasing", and "reading" times as shown in FIGS. 1 and 4. The data described in the table of FIG. 8 is one of preferable examples of the application conditions of voltages. The invention is not limited thereto, and various modifications and changes can be made to the described conditions if necessary. In this embodiment, implantation of electrons into the silicon nitride film 5b which is a charge storing layer (charge storing portion) of the insulating film 5 of the memory transistor is defined as the "writing" operation, and implantation of holes (hole: positive hole) thereinto is defined as the "erasing" operation.

As the writing system, hot-electron writing, which is called the source side injection (SSI) system, can be used. For example, the voltage described in the column "writing" of FIG. 8 is applied to each component of the selection memory cell for writing, and electrons are implanted into the silicon nitride film 5b of the insulating film 5 of the selection memory cell. Hot electrons are generated in the channel region (between the source and drain) under a region between two gate electrodes (memory gate electrode MG and the control gate electrode CG). Then, the hot electrons are implanted into the silicon nitride film 5, which is a charge storing layer (charge storing portion) of the insulating film 5 under the memory gate electrode MG. The implanted hot electrons (electrons) are caught at a trap level in the silicon nitride film 5b of the insulating film 5, which results in an increase in threshold voltage of the memory transistor.

The erasing operation can use a band-to-band tunneling (BTBT) hot hole implantation and erasing system. The holes (positive holes) generated by the BTBT (band-to-band tunnel phenomenon) are implanted into the charge storing portion (silicon nitride film 5b of the insulating film 5) to thereby perform the erasing operation. For example, the voltage showed in the column of "erasing" is applied to each part of the selection memory cell for performing the erasing operation. The band-to-band tunneling (BTBT) phenomenon generates holes (positive holes), which are accelerated by the electric field, so that the holes are implanted into the silicon nitride film 5b of the insulating film 5 of the selection memory cell to thereby decrease the threshold voltage of the memory transistor.

At the time of reading, for example, the voltage showed in the column of "reading" in FIG. 8 is applied to each part of the selection memory cell for performing the reading operation in FIG. 8. The voltage Vmg applied to the memory gate electrode MG upon reading is set to a level between a threshold voltage of the memory transistor in the writing state and another threshold voltage of the memory transistor in the erasing state, which can distinguish the writing state from the erasing state.

Now, a manufacturing method of a semiconductor device of this embodiment will be described below.

Figure 9:
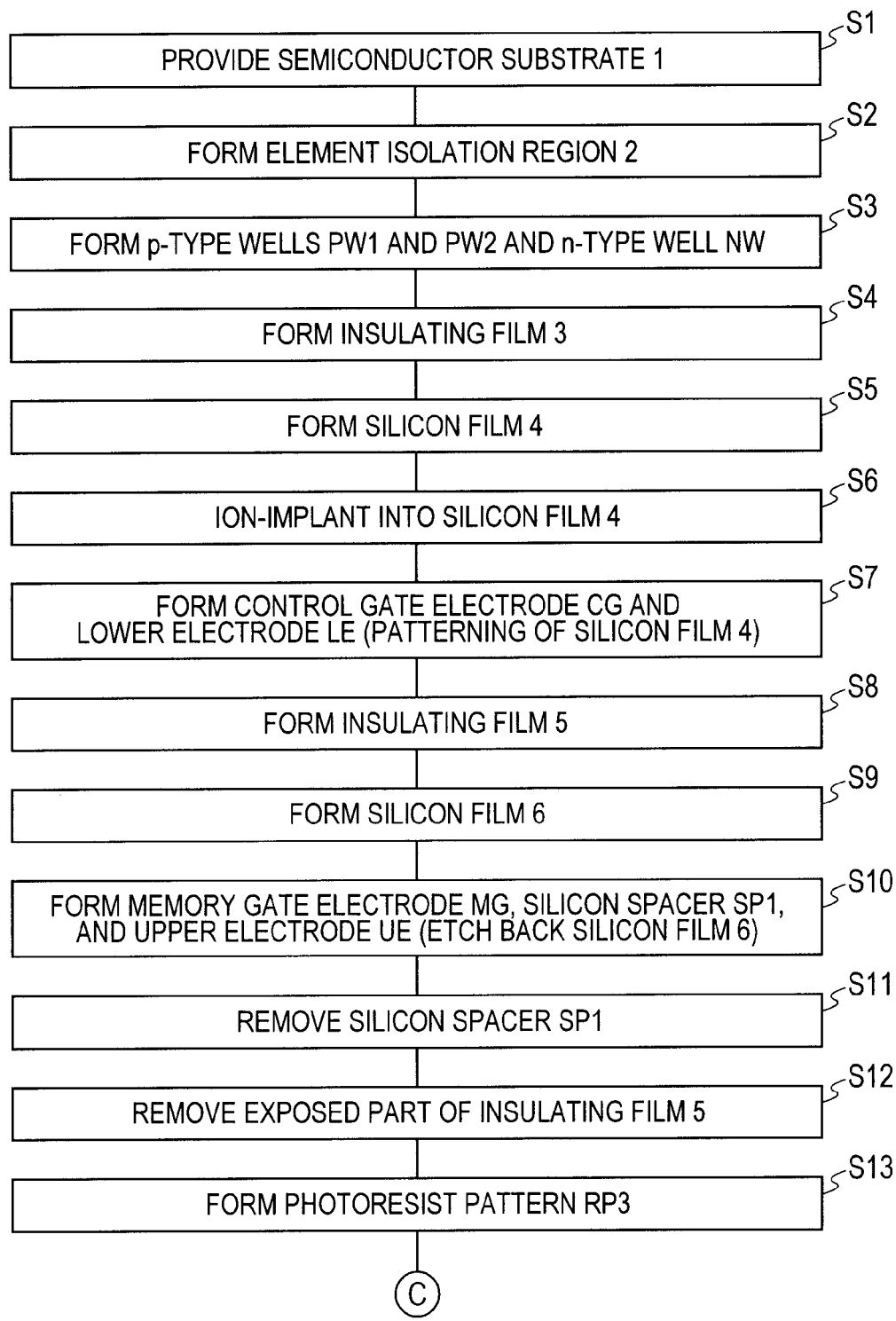
FIG. 9 is a process flowchart showing a part of a manufacturing process of the semiconductor device in the one embodiment of the invention.
Figure 10:
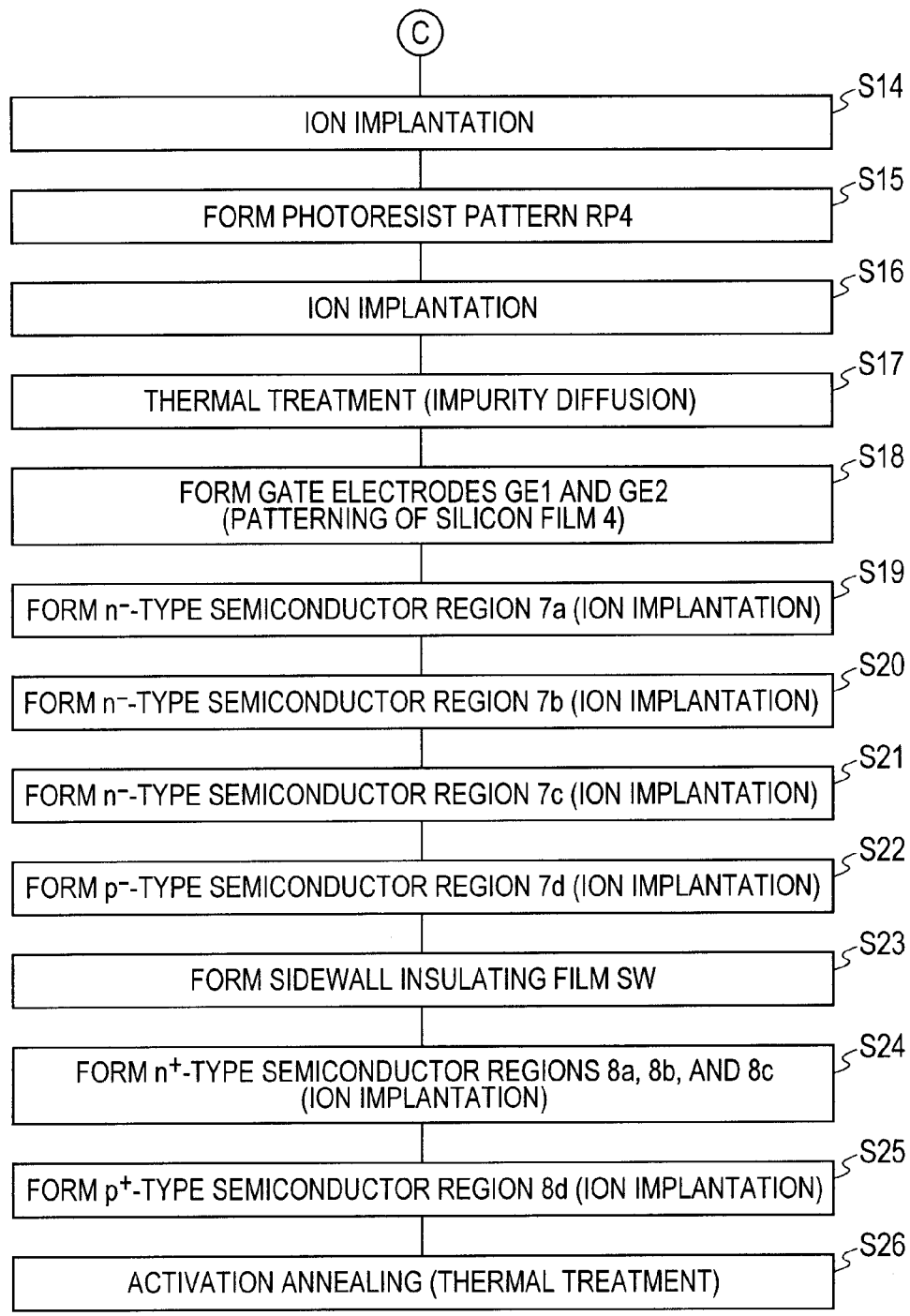
FIG. 10 is a process flowchart showing another part of the manufacturing process of the semiconductor device in the one embodiment of the invention.
Figure 11:
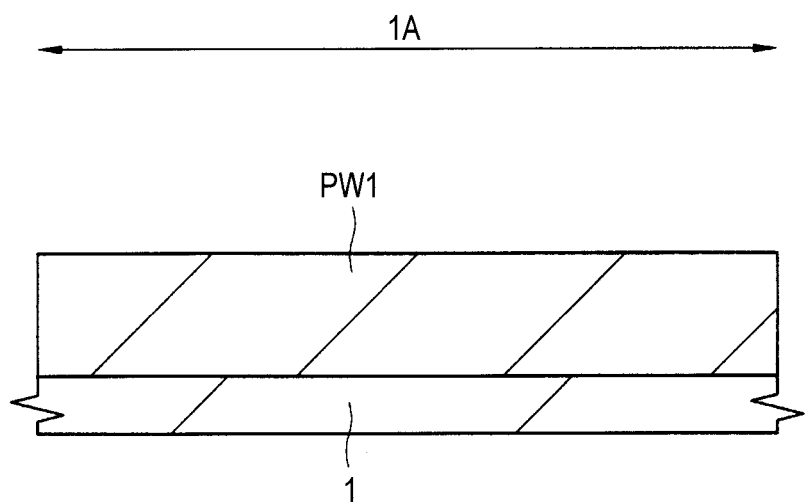
FIG. 11 is a cross-sectional view of a main part (memory cell region) of the manufacturing step of the semiconductor device in the one embodiment of the invention.
Figure 12:
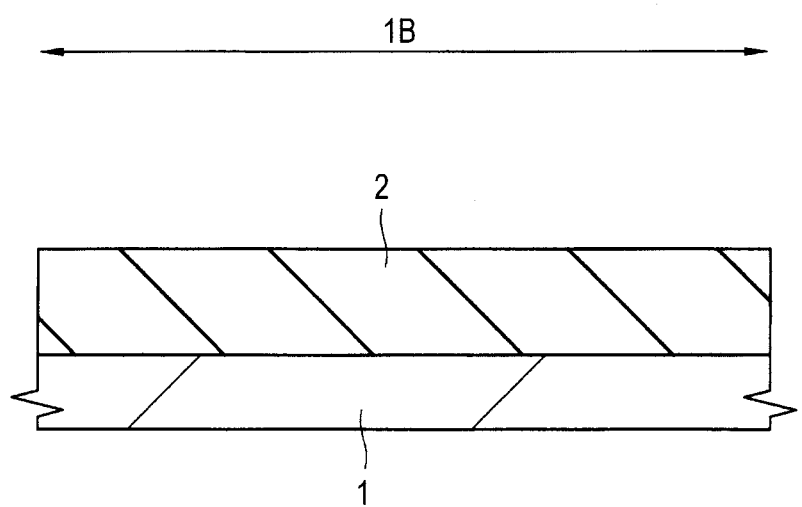
FIG. 12 is a cross-sectional view of a main part (memory gate shunt region) of the manufacturing step of the semiconductor device in the one embodiment of the invention.
Figure 13:
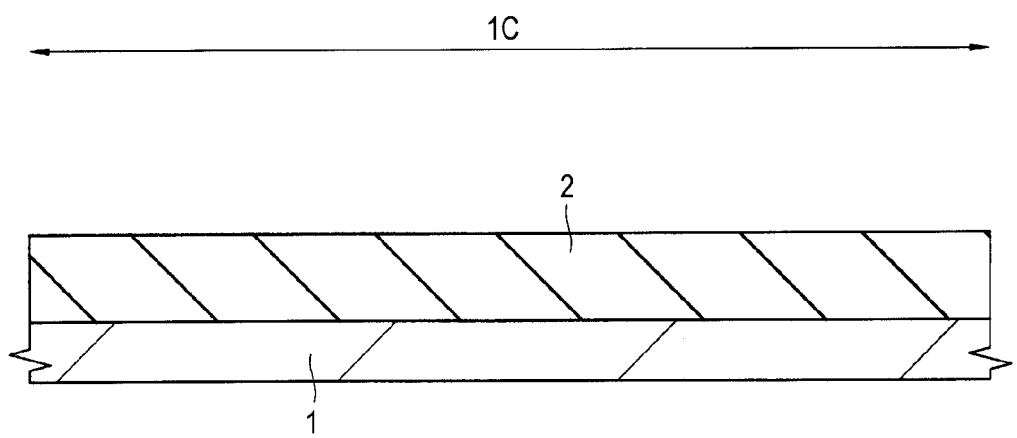
FIG. 13 is a cross-sectional view of a main part (capacitor formation region) of the same manufacturing step of the semiconductor device as that in FIG. 11.
Figure 14:
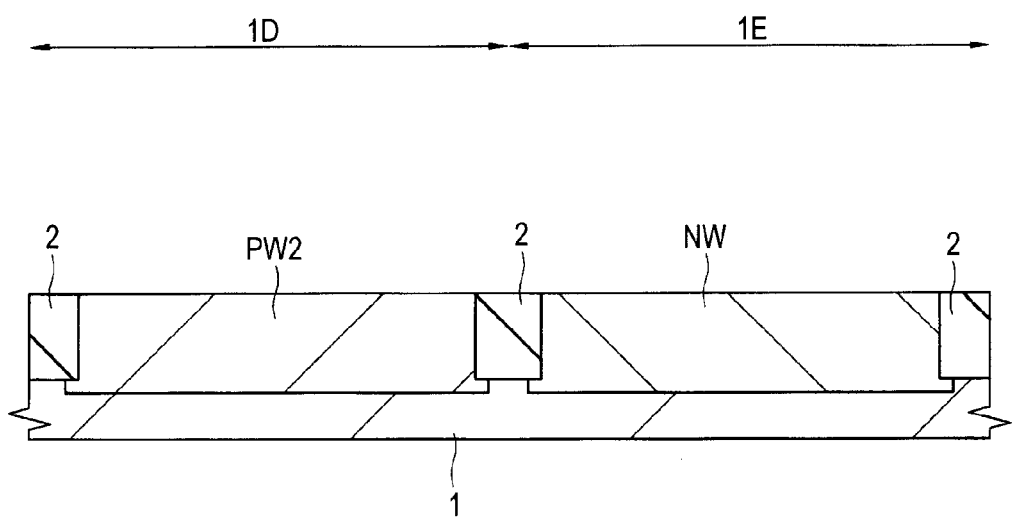
FIG. 14 is a cross-sectional view of main parts (peripheral nMIS region, and peripheral pMIS region) of the same manufacturing step of the semiconductor device as that in FIG. 11.
Figure 15:
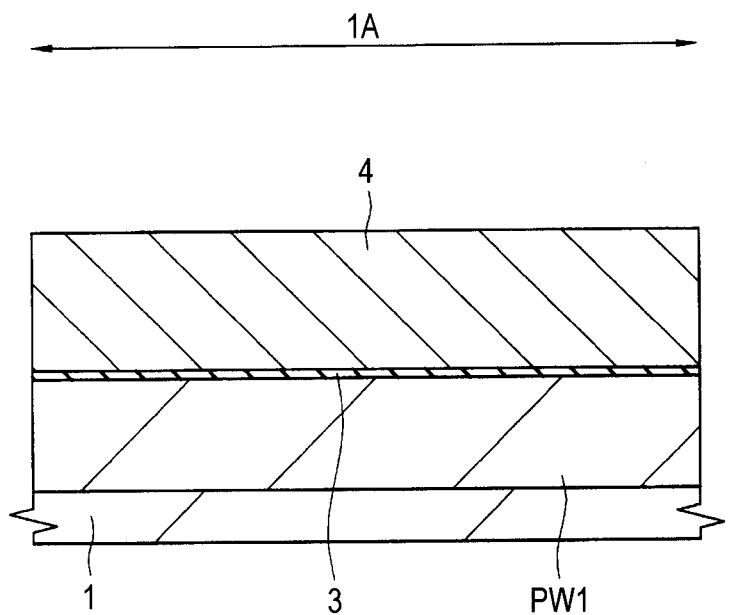
FIG. 15 is a cross-sectional view of a main part (memory cell region) of a manufacturing step of the semiconductor device, following the step shown in FIG. 11.
Figure 16:
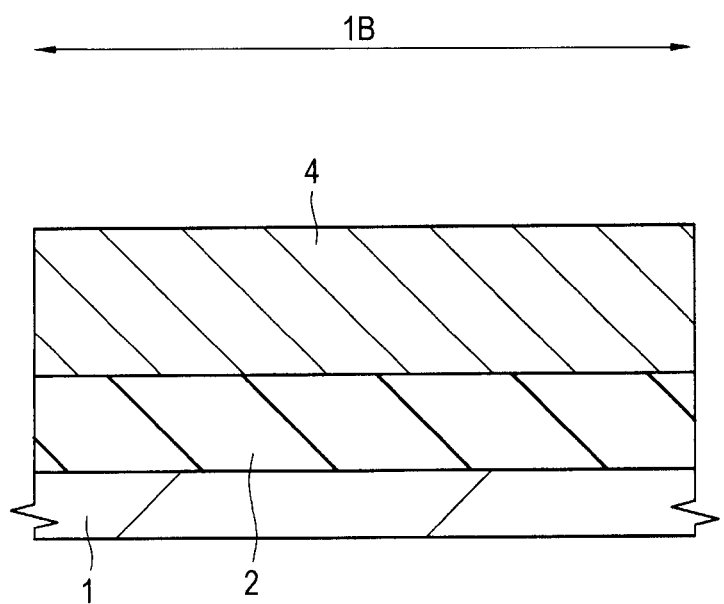
FIG. 16 is a cross-sectional view of a main part (memory gate shunt region) of the same manufacturing step of the semiconductor device as that in FIG. 15.
Figure 17:
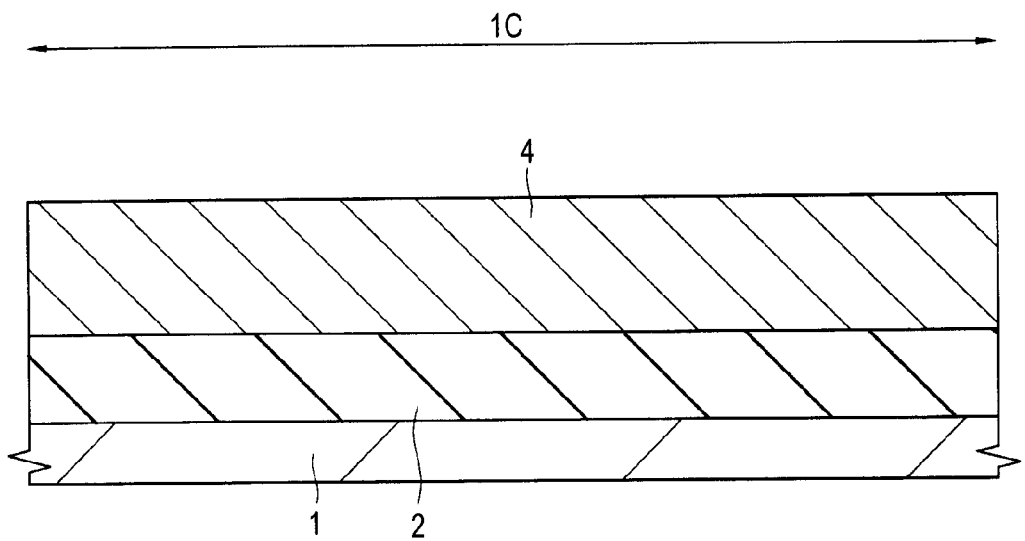
FIG. 17 is a cross-sectional view of a main part (capacitor formation region) of the same manufacturing step of the semiconductor device as that in FIG. 15.
Figure 18:
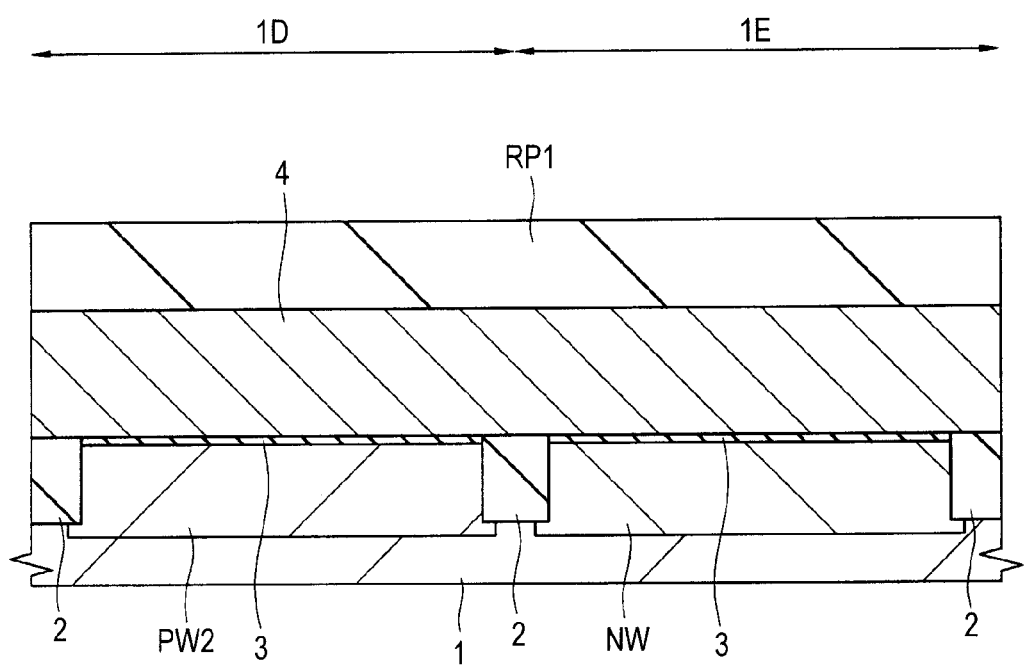
FIG. 18 is a cross-sectional view of main parts (peripheral nMIS region, and peripheral pMIS region) of the same manufacturing step of the semiconductor device as that in FIG. 15.
Figure 22:
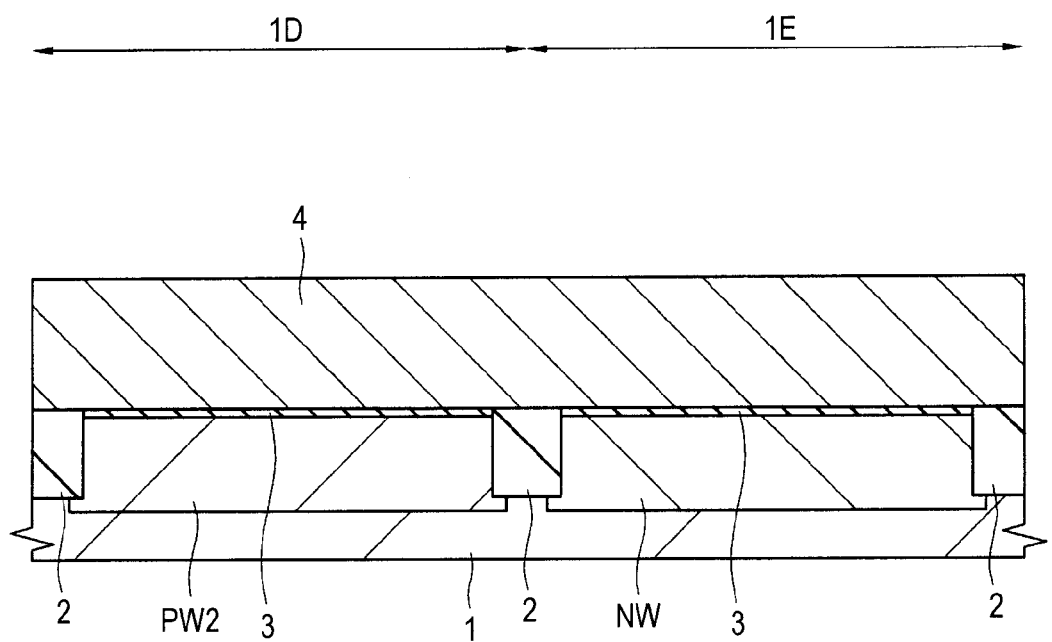
FIG. 22 is a cross-sectional view of main parts (peripheral nMIS region, and peripheral pMIS region) of the same manufacturing step of the semiconductor device as that in FIG. 19.
Figure 23:
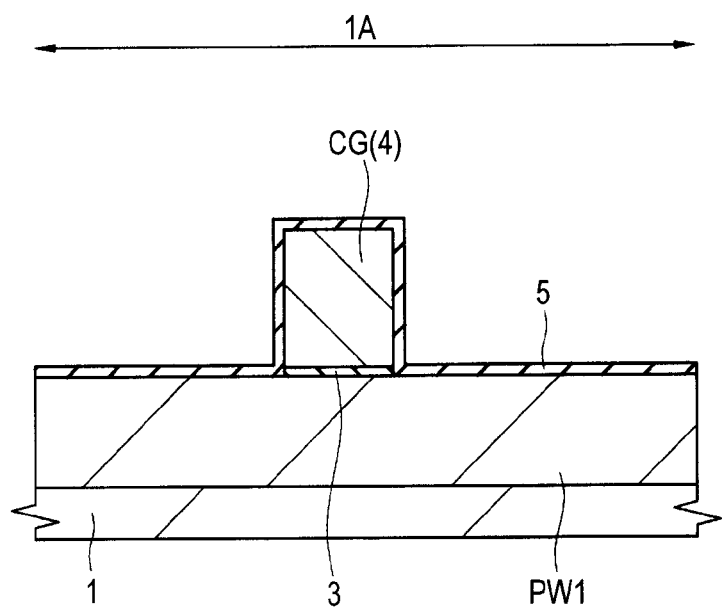
FIG. 23 is a cross-sectional view of a main part (memory cell region) of a manufacturing step of the semiconductor device, following the step shown in FIG. 19.
Figure 24:
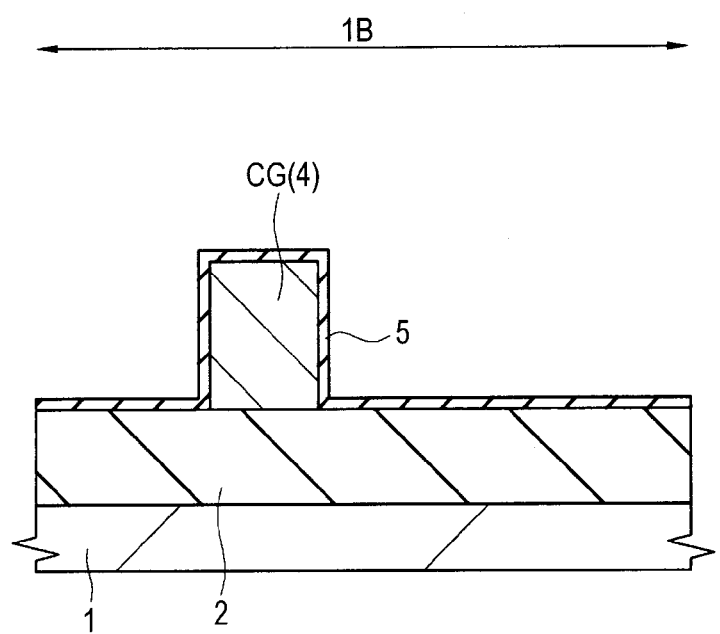
FIG. 24 is a cross-sectional view of a main part (memory gate shunt region) of the same manufacturing step of the semiconductor device as that in FIG. 23.
Figure 25:
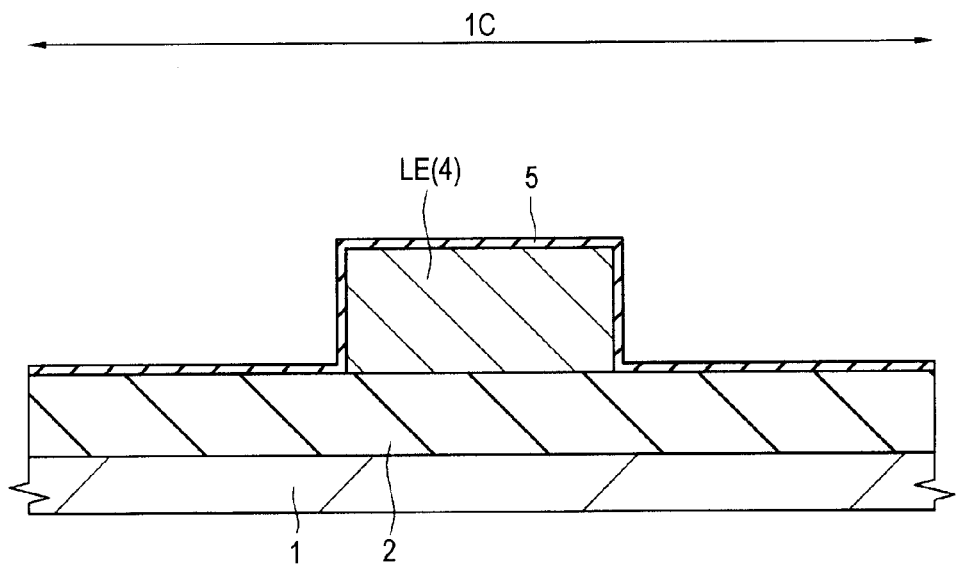
FIG. 25 is a cross-sectional view of a main part (capacitor formation region) of the same manufacturing step of the semiconductor device as that in FIG. 23.
Figure 26:
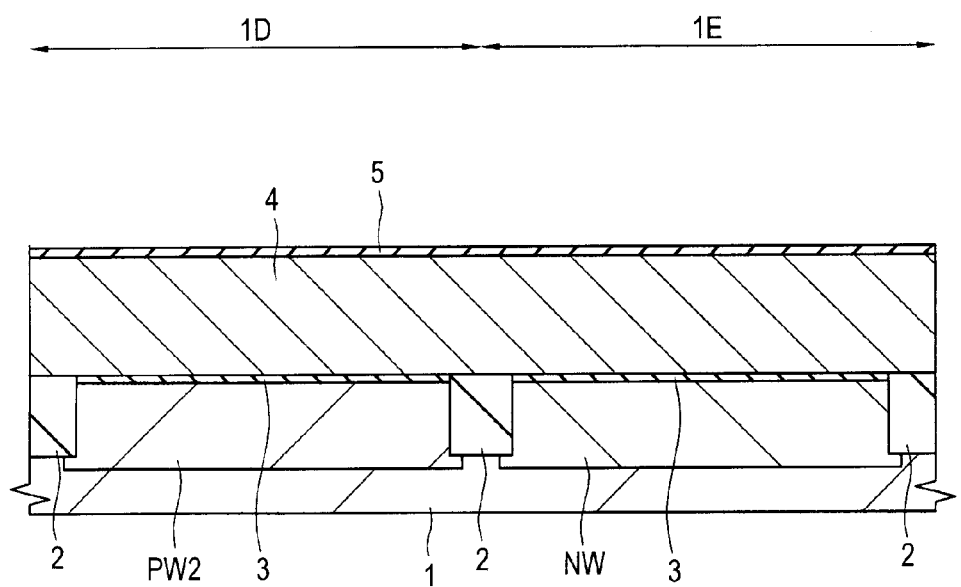
FIG. 26 is a cross-sectional view of main parts (peripheral nMIS region, and peripheral pMIS region) of the same manufacturing step of the same semiconductor device as that in FIG. 23.
Figure 27:
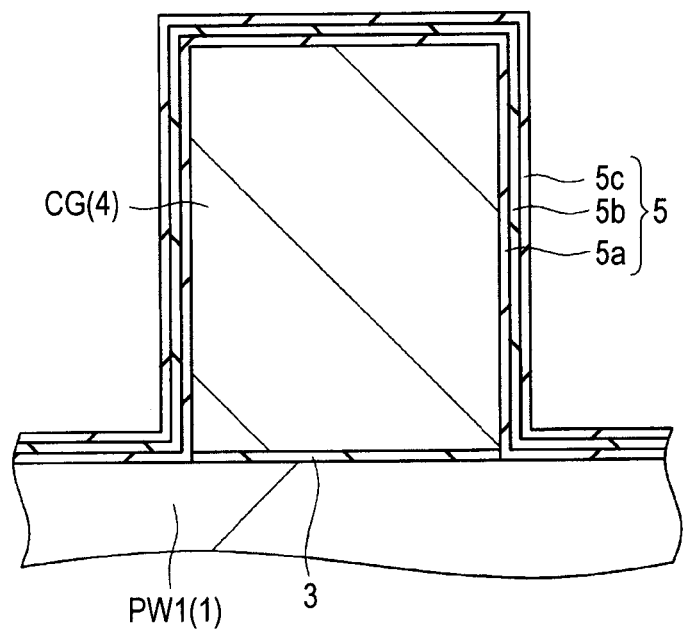
FIG. 27 is a partial enlarged cross-sectional view of FIG. 23.
Figure 28:
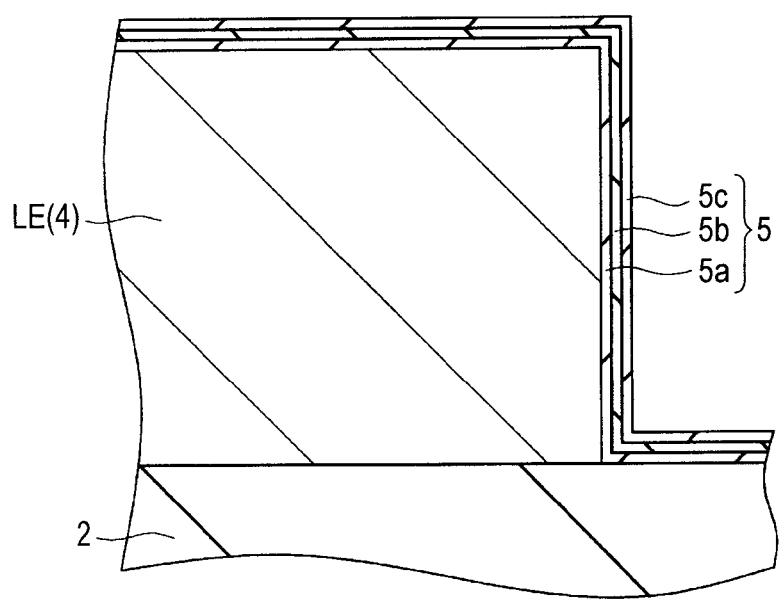
FIG. 28 is a partial enlarged cross-sectional view of FIG. 25.
Figure 29:
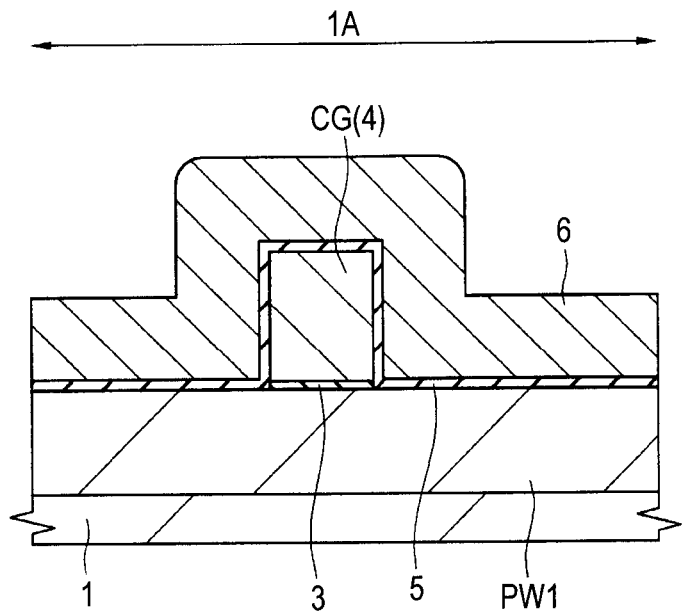
FIG. 29 is a cross-sectional view of a main part (memory cell region) of a manufacturing step of the semiconductor device, following the step shown in FIG. 23.
Figure 97:
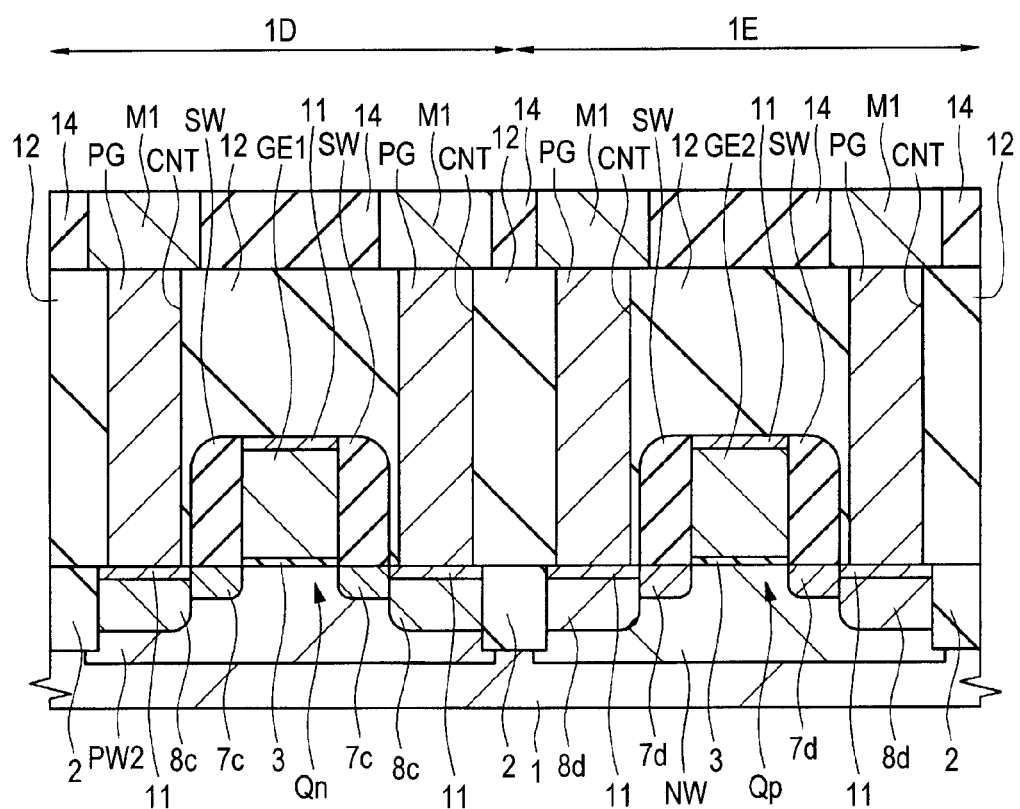
FIG. 97 is a cross-sectional view of a main part (peripheral nMIS region, peripheral pMIS region) of a manufacturing step of the semiconductor device, following the step shown in FIG. 96.

FIGS. 9 and 10 are process flowcharts showing parts of manufacturing steps of the semiconductor device in this embodiment. FIGS. 11 to 97 are cross-sectional views of main parts of manufacturing steps of the semiconductor device in this embodiment. Among these drawings, FIGS. 11, 15, 19, 23, 29, 33, 37, 41, 45, 49, 53, 57, 61, 65, 69, 73, 77, 81, 85, 89, and 93 are cross-sectional views of main parts of the memory cell region 1A. FIGS. 12, 16, 20, 24, 30, 34, 38, 42, 46, 50, 54, 58, 62, 66, 70, 74, 78, 82, 86, 90 and 94 are cross-sectional views of main parts of the memory gate shunt region 1B. FIGS. 13, 17, 21, 25, 31, 35, 39, 43, 47, 51, 55, 59, 63, 67, 71, 75, 79, 83, 87, 91 and 95 are cross-sectional views of main parts of the capacitor formation region 1C. FIGS. 14, 18, 22, 26, 32, 36, 40, 44, 48, 52, 56, 60, 64, 68, 72, 76, 80, 84, 88, 92, 96 and 97 are cross-sectional views of main parts of the peripheral nMIS region 1D and the peripheral pMIS region 1E. FIG. 27 is a partial enlarged cross-sectional view of FIG. 23, showing an enlarged part of FIG. 23 (a part of the memory cell region 1A). FIG. 28 is a partial enlarged cross-sectional view of FIG. 24, showing an enlarged part of FIG. 24 (capacitor formation region 1C). The peripheral nMIS region 1D is a region with an n-channel MISFET of a peripheral circuit formed therein, and the peripheral pMIS region 1E is a region with a p-channel MISFET of the peripheral circuit formed therein. The peripheral circuits are circuits other than the nonvolatile memory. The peripheral circuits include, for example, a processor, such as a CPU, a control circuit, a sense amplifier, a column decoder, a row decoder, an input/output circuit, and the like. The memory cell region 1A, the memory gate shunt region 1B, the capacitor formation region 1C, the peripheral nMIS region 1D, and the peripheral pMIS region 1E are formed over the same semiconductor substrate 1. The peripheral nMIS region 1D may not be adjacent to the peripheral pMIS region 1E. For easy understanding, in the cross-sectional view of FIG. 14 or the like, the peripheral pMIS region 1E is illustrated to be adjacent to the peripheral nMIS region 1D.

As can be seen from FIGS. 11 to 14, for example, first, the semiconductor substrate (semiconductor wafer) 1 composed of a p-type single crystal silicon having a specific resistance of about 1 to 10 Ωcm is previously provided (prepared) (in step S1 of FIG. 9). Then, the element isolation region (element isolation insulating region) 2 is formed for defining (deciding) an active region at the main surface of the semiconductor substrate 1 (in step S2 of FIG. 9). The element isolation region 2 is composed of an insulator, such as silicon oxide, and can be formed, for example, by a shallow trench isolation (STI) method or a local oxidization of silicon (LOCOS) method. For example, after forming a trench for isolation of elements at the main surface of the semiconductor substrate 1, an insulating film made of, for example, silicon oxide is embedded in the trench for isolation of the elements, so that the element isolation region 2 can be formed. In the memory gate shunt region 1B and the capacitor formation region 1C, the element isolation region 2 is formed at the entire main surface of the semiconductor substrate 1.

Then, the p-type well PW1 is formed in the memory cell region 1A of the semiconductor substrate 1, the p-type well PW2 is formed in the peripheral nMIS region 1D, and the n-type well NW is formed in the peripheral pMIS region 1E (in step S3 of FIG. 9). The p-type wells PW1 and PW2 can be formed by ion-implanting p-type impurities, such as boron (B), into the semiconductor substrate 1. The n-type well NW can be formed by ion-implanting n-type impurities, such as phosphorus (P) or arsenic (As), into the semiconductor substrate 1. The p-type wells PW1 and PW2 and the n-type well NW are formed from the main surface of the semiconductor substrate 1 in a predetermined depth.

Then, channel doped ion implantation is performed on the surface (superficial layer) of the p-type well PW1 in the memory cell region 1A, if necessary, so as to adjust the threshold voltage of the control transistor which is to be formed later in the memory cell region 1A. The channel doped ion implantation is further performed on the surface (superficial layer) of the p-type well PW2 in the peripheral nMIS region 1D, if necessary, so as to adjust the threshold voltage of the n-channel MISFET which is to be formed later in the peripheral nMIS region. The channel doped ion implantation is further performed on the surface (superficial layer) of the n-type well NW2 in the peripheral pMIS region 1D, if necessary, so as to adjust the threshold voltage of the p-channel MISFET which is to be formed later in the peripheral pMIS region.

Then, as shown in FIGS. 15 to 18, after cleaning the surface of the semiconductor substrate 1 (p-type wells PW1 and PW2 and n-type well NW) by diluted hydrofluoric acid or the like, the insulating film 3 for the gate insulating film is formed over the main surface of the semiconductor substrate 1 (surfaces of the p-type wells PW1 and PW2 and the n-type well NW) (in step S4 of FIG. 9). The insulating film 3 can be formed of, for example, a thin silicon oxide film or silicon oxynitride film. The thickness (formed thickness) of the insulating film 3 can be, for example, in a range of about 2 to 3 nm. When the insulating film 3 is formed by a thermal oxidation method, the insulating film 3 is not formed over the element isolation region 2.

Then, the silicon film 4 is formed (deposited) as the conductive film serving as both the formation of the control gate electrode CG and the formation of the lower electrode LE, over the main surface (entire main surface) of the semiconductor substrate 1, that is, over the insulating film 3 in the memory cell region 1A, the peripheral nMIS region 1D, and the peripheral pMIS region 1E, and over the element isolation region 2 in the memory shunt region 1B and the capacitor formation region 1C (in step S5 of FIG. 9).

The silicon film 4 is comprised of a polycrystalline silicon film (polysilicon film), and can be formed by a chemical vapor deposition (CVD) method or the like. The thickness (deposition thickness) of the silicon film 4 can be, for example, in a range of about 50 to 250 nm. During deposition, the silicon film 4 is formed as an amorphous silicon film, and then the amorphous silicon film can be converted into the polycrystalline silicon film by the following thermal treatment. The silicon film 4 can be a non-doped silicon film in the stage of deposition.

Then, a photoresist pattern RP1 is formed as a mask layer (resist pattern for a mask) over the main surface of the semiconductor substrate 1, that is, over the silicon film 4 by photolithography or the like. The photoresist pattern PR1 is formed so as to cover the entire peripheral nMIS region 1D and the entire pMIS region 1E and to expose the entire memory cell region 1A, the entire memory gate shunt region 1B, and the entire capacitor formation region 1C.

Then, n-type impurities (for example, arsenic (AS) or phosphoric (P)) are introduced (implanted) by ion implantation or the like into the silicon film 4 of each of the memory cell region 1A, the memory gate shunt region 1B, and the capacitor formation region 1C using the photoresist pattern RP1 as an ion implantation blocking mask (in step S6 of FIG. 9). Thus, the silicon film 4 in each of the memory cell region 1A, the memory gate shunt region 1B, and the capacitor formation region 1C is an n-type silicon film 4 into which n-type impurities are introduced. The amount of dose in the ion implantation in step S6 can be set to, for example, about $5 \times 10^{15}/cm^2$. The dose amount in the ion implantation at step S6 is more than that in the ion implantation for forming a semiconductor region for the source or drain, specifically, more than that in each of ion implantation processes at steps S19, S20, S21, S22, and S24 to be described later. In contrast, in the ion implantation at step S6, the silicon film 4 in the peripheral nMIS region 1D and the peripheral pMIS region 1E is covered with the photoresist pattern RP1, so that no impurities are introduced (implanted) into the film 4. Thus, the silicon film 4 exits as the n-type silicon film (polycrystalline silicon film into which n-type impurities are introduced, doped polysilicon film) into which n-type impurities are introduced, in the memory cell region 1A, the memory gate shunt region 1B, and the capacitor formation region 1C. The peripheral nMIS region 1D and the peripheral pMIS region 1E are non-doped silicon film (non-doped polysilicon film). Thereafter, the photoresist pattern RP1 is removed.

Then, as shown in FIGS. 19 to 22, the silicon film 4 in the memory cell region 1A, the memory gate shunt region 1B, and the capacitor formation region 1C is patterned using photolithography and dry etching to form the control gate electrode CG and the lower electrode LE (in step S7 of FIG. 9). The patterning process in step S7 can be performed, for example, as follows.

That is, another photoresist pattern (which is not shown, but is formed over the region for formation of the control gate electrode CG, the region for formation of the lower electrode LE, the entire peripheral nMIS region 1D, and the entire peripheral pMIS region 1E) is formed over the silicon region 4 by the photolithography. The silicon film 4 is patterned by being etched (dry-etched) using the photoresist pattern as an etching mask. Then, the photoresist pattern is removed.

Figure 19:
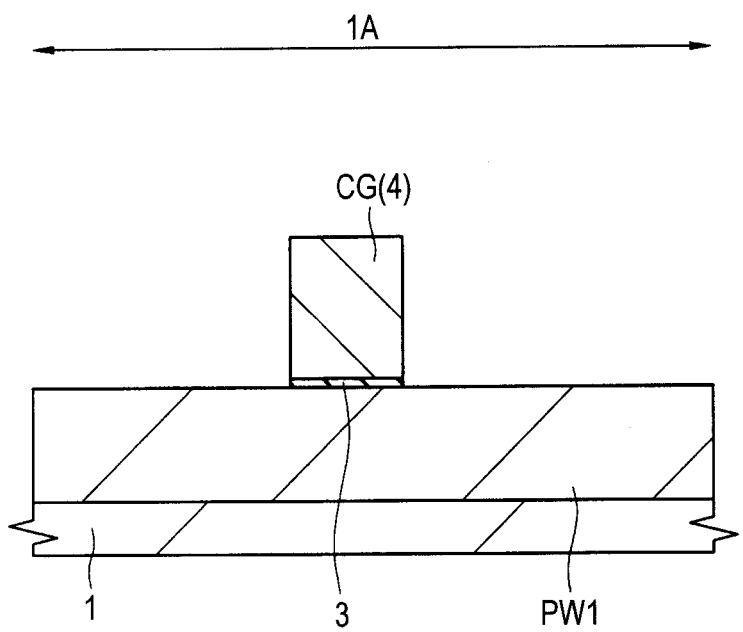
FIG. 19 is a cross-sectional view of a main part (memory cell region) of a manufacturing step of the semiconductor device, following the step shown in FIG. 15.
Figure 20:
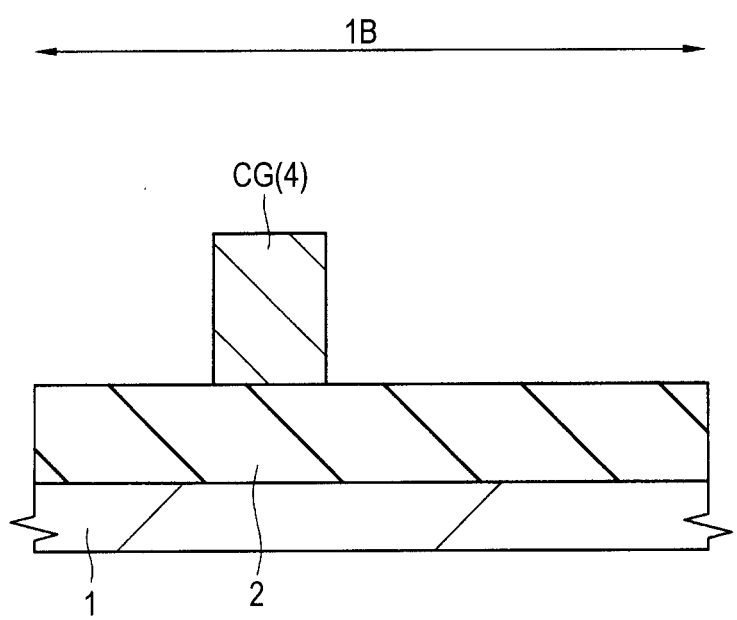
FIG. 20 is a cross-sectional view of a main part (memory gate shunt region) of the same manufacturing step of the semiconductor device as that in FIG. 19.
Figure 21:
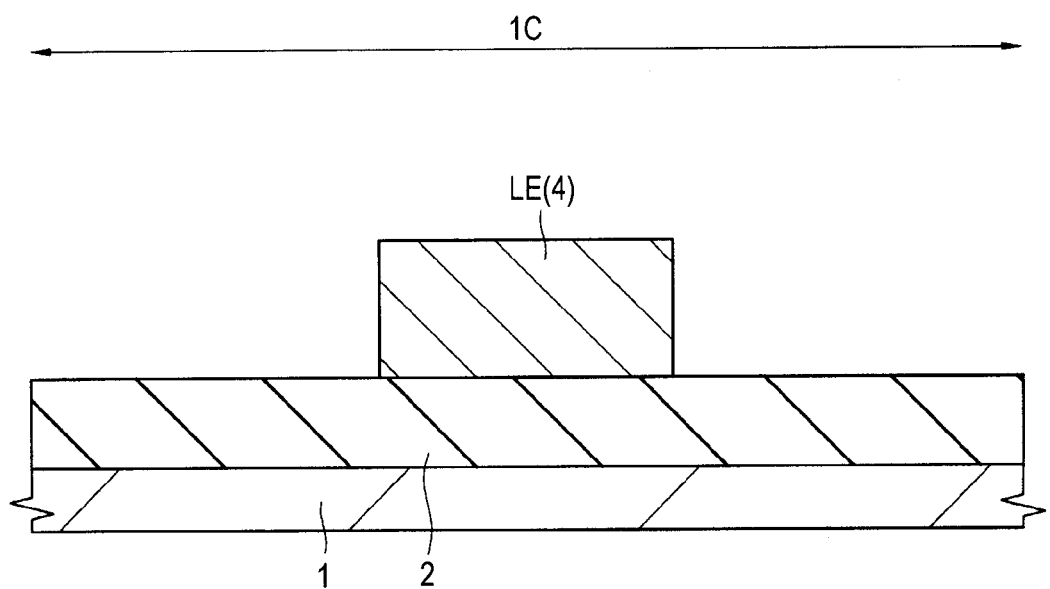
FIG. 21 is a cross-sectional view of a main part (capacitor formation region) of the same manufacturing step of the semiconductor device as that in FIG. 19.

In this way, the silicon film 4 is patterned in step S7. As shown in FIGS. 19 and 20, the control gate electrode CG comprised of the patterned silicon film 4 is formed in the memory cell region 1A and the memory gate shunt region 1B. As shown in FIG. 21, the lower electrode LE comprised of the patterned silicon film 4 is formed in the capacitor formation region 1C. The control gate electrode CG and the lower electrode LE each are formed of the same layer of the silicon film 4, and isolated from each other. At this time, since the above photoresist pattern is formed in the peripheral nMIS region 1D and the peripheral pMIS region 1E, the silicon film 4 in these regions are not patterned. Thus, as shown in FIG. 22, the silicon film 4 remains in the entire peripheral nMIS region 1D and the entire peripheral pMIS region 1E. In the memory cell region 1A, the insulating film 3 remaining under the control gate electrode CG serves as the gate insulating film of the control transistor. Thus, the control gate electrode CG comprised of the silicon film 4 is formed over the semiconductor substrate 1 (p-type well PW1) via the insulating film 3 as the gate insulating film. In the memory gate shunt region 1B, the control gate electrode CG is formed over the element isolation region 2.

As described above, the ion implantation in step S6 introduces n-type impurities into the silicon film 4 in the memory cell region 1A, the memory gate shunt region 1B, and the capacitor formation region 1C. The control gate electrode CG and the lower electrode LE formed by the patterning process in step S7 each are comprised of the n-type silicon film 4 (polycrystalline silicon film with n-type impurities introduced thereinto, doped polysilicon film) into which n-type impurities are introduced.

In the memory cell region 1A, a remaining part of the insulating film 3 except for the part of the insulating film 3 covered with the control gate electrode CG (the remaining part of the insulating film 3 other than the part thereof serving as the gate insulating film) can be removed by dry etching or wet etching after the dry etching in a patterning process in step S7.

Then, the channel doped ion implantation is performed on the surface (superficial layer) of the p-type well PW1 in the memory cell region 1A if necessary, in order to adjust the threshold voltage of the memory transistor which is to be formed later in the memory cell region 1A.

Then, after cleaning the main surface of the semiconductor substrate 1 by a cleaning process, as shown in FIGS. 23 to 28, the insulating film 5 serving as both a gate insulating film for the memory transistor and a capacity insulating film for the capacitive element is formed over the entire main surface of the semiconductor substrate 1, that is, the main surface (surface) of the semiconductor substrate 1, the surfaces (upper surface and sides) of the control gate electrode CG, and the surfaces (upper surface and sides) of the lower electrode LE (in step S8 shown in FIG. 9).

The insulating film 5 is an insulating film having a charge storing portion (charge storing layer) therein as mentioned above. The insulating film 5 is a laminated film of the silicon oxide film 5a, the silicon nitride film 5b, and the silicon oxide film 5c formed in that order from the bottom. For easy understanding, as shown in FIGS. 23 to 26 and FIGS. 26 to 97 (to be described later), the laminated film of the silicon oxide film 5a, the silicon nitride film 5b, and the silicon oxide film 5c is simply defined as the insulating film 5. Thus, actually, as shown in FIGS. 27 and 28, the insulating film 5 is comprised of the silicon oxide film (oxide film) 5a, the silicon nitride film (nitride film) 5b over the silicon oxide film 5a, and the silicon oxide film (oxide film) 5c over the silicon nitride film 5b. In step S8, as shown in FIGS. 23 to 28, the insulating film 5 is formed at the main surface (surface) of the semiconductor substrate 1 (including the p-type well PW1 and the element isolation region 2), the surfaces (upper surface and sides) of the control gate electrode CG, the surfaces (upper surface and sides) of the lower electrode LE, and the surfaces (upper surface and sides) of the silicon film 4 (note that the insulating film 5 is not formed under the control gate electrode CG, the lower electrode LE, and the silicon film 4). During the deposition process, the insulating film 5 is generally formed over the element isolation region 2, but the insulating film 5 may not be formed over the element isolation region 2.

Among the insulating films 5, the silicon oxide films 5a and 5c can be formed, for example, by the oxidation process (thermal oxidation process), the CVD method, or a combination thereof. The oxidation process (thermal oxidation process) at this time can be performed using In Situ Steam Generation (ISSG) oxidation. The silicon nitride film 5b of the insulating film 5 can be formed, for example, by the CVD method.

In this embodiment, the silicon nitride film 5b is formed as an insulating film (charge storing layer) having a trap level, and is preferable from the viewpoint of reliability. The insulating film is not limited to the silicon nitride film. Alternatively, for example, a high-dielectric-constant film having a higher dielectric constant than that of the silicon nitride film, such as an aluminum oxide film (alumina), a hafnium oxide film, or a tantalum oxide film, can be used as the charge storing layer (charge storing portion). The charge storing layer (charge storing portion) can be formed by silicon nanodot.

In order to form the insulating film 5, first, for example, a silicon oxide film 5a is formed by thermal oxidation (preferably, ISSG oxidation) over the surface of the semiconductor substrate 1 (p-type well PW1), over the surfaces (upper surface and sides) of the control gate electrode CG, over the surfaces (upper surface and sides) of the lower electrode LE, and over the surfaces (upper surface and sides) of the silicon film 4. Then, the silicon nitride film 5b is deposited over the silicon oxide film 5a by the CVD method, and the silicon oxide film 5c is formed over the silicon nitride film 5b by the CVD method or thermal oxidation or both thereof. Thus, the insulating film 5 comprised of a laminated film of the silicon oxide film 5a, the silicon nitride film 5b, and the silicon oxide film 5c can be formed.

The thickness of the silicon oxide film 5a can be, for example, in a range of about 2 to 10 nm. The thickness of the silicon nitride film 5b can be, for example, in a range of about 5 to 15 nm. The thickness of the silicon oxide film 5c can be, for example, in a range of 2 to 10 nm. The last oxide film (uppermost silicon oxide film 5c among the insulating films 5) can be formed as a high pressure resistance film by oxidizing the upper layer part of a nitride film (intermediate silicon nitride film 5b of the insulating films 5).

The insulating film 5 formed in the memory cell region 1A serves as a gate insulating film of the memory gate electrode MG to be formed later, and has a function of retaining charges (storing charges). The insulating film 5 formed in the capacitor formation region 1C serves as a capacity insulating film (dielectric constant film) of the capacitive element CP.

The insulating film 5 has at least three layered laminated structure so as to be capable of serving as a gate insulating film having a charge retaining (charge storing) function of the memory transistor, in which the inner layer (silicon nitride film 5b) has a lower potential barrier than that of the outer layer (silicon oxide films 5a and 5c). This can be achieved by forming a laminated film of the silicon oxide film 5a, the silicon nitride film 5b over the silicon oxide film 5a, and the silicon oxide film 5c over the silicon nitride film 5b as the insulating film 5, like this embodiment.

Then, as shown in FIGS. 29 to 32, the silicon film 6 is formed (deposited) over the main surface (entire main surface) of the semiconductor substrate 1, that is, over the insulating film 5, so as to cover the control gate electrode CG in the memory cell region 1A and the memory gate shunt region 1B, to cover the lower electrode LE in the capacitor formation region 1C, and to cover the silicon film 4 in the peripheral nMIS region 1D and the peripheral pMIS region 1E (in step S9 of FIG. 9).

The silicon film 6 is comprised of a polycrystalline silicon film, and can be formed using the CVD method or the like. The thickness (deposition thickness) of the silicon film 6 can be, for example, in a range of about 30 to 150 nm. During deposition, the silicon film 6 is formed as an amorphous silicon film, and then subjected to the heat treatment, so that the amorphous silicon film can be converted into the polycrystalline silicon film. The silicon film 6 is a silicon film used for both formation of the memory gate electrode MG and formation of the upper electrode UE.

The silicon film 6 formed in step S9 is preferably a non-doped (undoped) silicon film. When the silicon film 6 formed in step S9 is a non-doped silicon film, no impurities are introduced (added, or doped) into the silicon film 6 during deposition of the silicon film 6. Thus, in a formation (deposition) process of the silicon film 6 in step S9, preferably, gas for deposition of the silicon film 6 does not contain doping gas (gas for addition of impurities).

Figure 30:
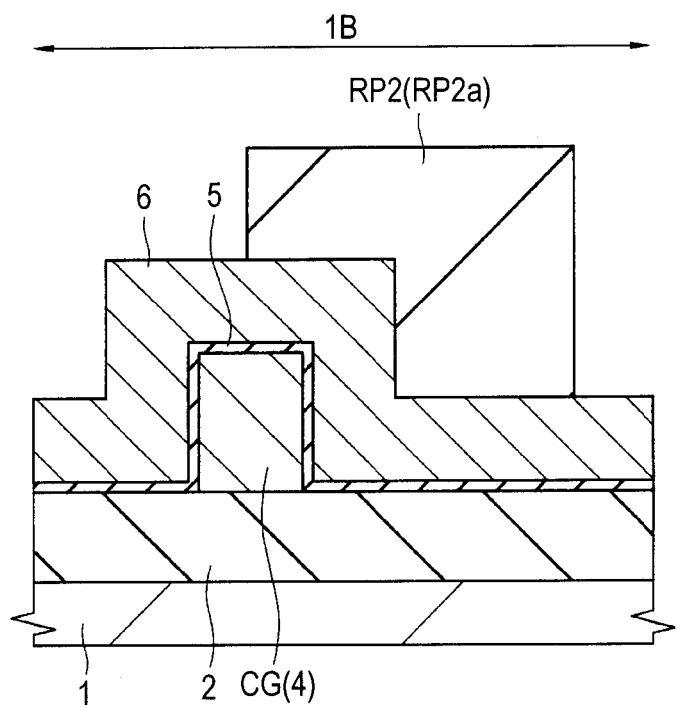
FIG. 30 is a cross-sectional view of a main part (memory gate shunt region) of the same manufacturing step of the semiconductor device as that in FIG. 29.
Figure 31:
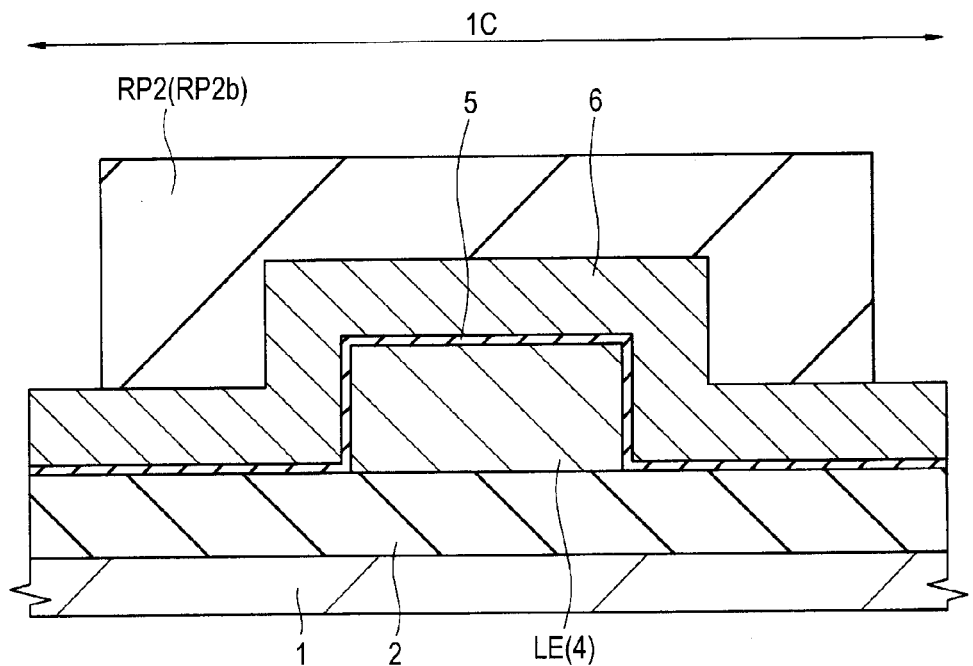
FIG. 31 is a cross-sectional view of a main part (capacitor formation region) of the same manufacturing step of the semiconductor device as that in FIG. 29
Figure 32:
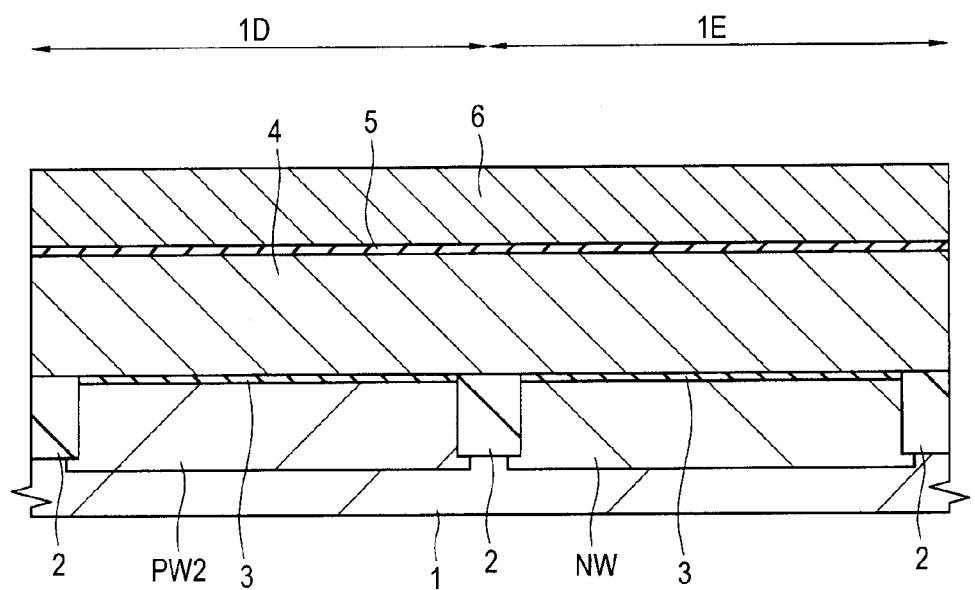
FIG. 32 is a cross-sectional view of main parts (peripheral nMIS region, and peripheral pMIS region) of the same manufacturing step of the semiconductor device as that in FIG. 29.

Then, a photoresist pattern RP2 is formed using photolithography as a mask layer (resist pattern for a mask) over the silicon film 6 in the region for formation of the contact MGa of the memory gate electrode MG in the memory gate shunt region 1B, and over the silicon film 6 in the region for formation of the upper electrode UE in the capacitor formation region 1C. As shown in FIG. 30, the photoresist pattern RP2 formed in the region for formation of the contact MGa of the memory gate electrode MG in the memory gate shunt region 1B (that is, over the silicon film 6 in a part to serve as the contact MGa) is referred to as a photoresist pattern RP2a, which is represented by reference character RP2a. As shown in FIG. 31, the photoresist pattern RP2 formed in the region for formation of the upper electrode UE (that is, over a part of the silicon film 6 to serve as the upper electrode UE) in the capacitor formation region 1C is referred to as a photoresist pattern RP2, which is represented by reference character RP2b. Thus, the photoresist pattern RP2a and the photoresist pattern RP2b each are formed of the same layer of photoresist pattern RP2 formed in the same process (that is, in the same photolithography process), but are isolated from each other.

Then, as shown in FIGS. 33 to 36, the silicon film 6 is etched back (subjected to etching, dry etching, or anisotropic etching) by the anisotropic etching technique (in step S10 of FIG. 9). In the etching back process in step S10, the photoresist pattern RP2 serves as an etching mask. Thereafter, the photoresist pattern RP2 (that is, the photoresist patterns RP2a, and RP2b) are removed.

Figure 33:
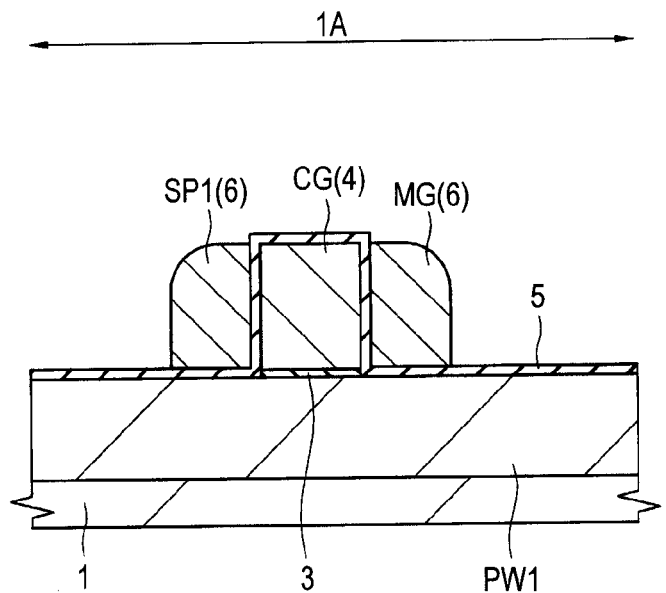
FIG. 33 is a cross-sectional view of a main part (memory cell region) of a manufacturing step of the semiconductor device, following the step shown in FIG. 29.

In the etching back process in step S10, the silicon film 6 is subjected to anisotropic etching (etched back) by the thickness of deposited silicon film 6. The silicon films 6 are left in the form of sidewall spacer at both sidewalls of the control gate electrode CG (via the insulating film 5), a part of the silicon film 6 under the photoresist pattern RP2 is left, and other parts of the silicon film 6 in other regions are removed. As shown in FIG. 33, in the memory cell region 1A, the silicon film 6 remains in the form of sidewall spacer over one of both sidewalls of the control gate electrode CG via the insulating film 5 to thereby form the memory gate electrode MG. The silicon film 6 remains in the form of sidewall spacer over the other sidewall via the insulating film 5 to thereby form the silicon spacer SP1. The memory gate electrode MG is formed over the insulating film 5 so as to be adjacent to the control gate electrode CG via the insulating film 5. The insulating film 5 intervenes in between the memory gate electrode MG and the semiconductor substrate 1 (p-type well PW1), and between the memory gate electrode MG and the control gate electrode CG.

The silicon spacer SP1 can be regarded as the sidewall spacer made of silicon. The memory gate electrode MG and the silicon spacer SP1 are formed at opposite sidewalls of the control gate electrode CG and symmetric to each other with the control gate electrode CG sandwiched therebetween. Although not shown, the silicon spacer SP1 can be formed via the insulating film 5 over the sidewall of the silicon film 4 remaining in each of the peripheral nMIS region 1D and the peripheral pMIS region 1E.

Figure 34:
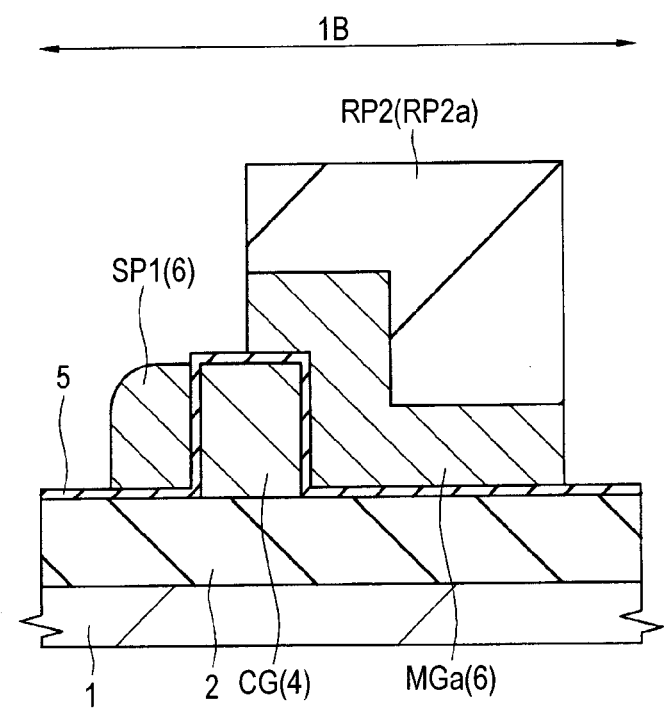
FIG. 34 is across-sectional view of a main part (memory gate shunt region) of the same manufacturing step of the semiconductor device as that in FIG. 33.
Figure 35:
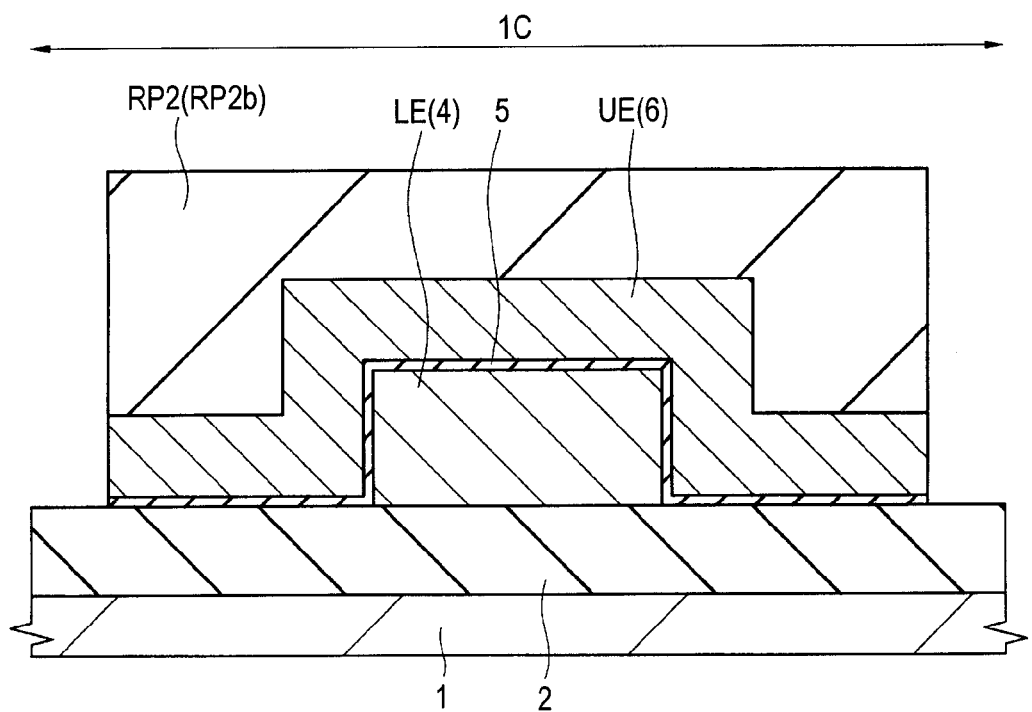
FIG. 35 is a cross-sectional view of a main part (capacitor formation region) of the same manufacturing step of the semiconductor device as that in FIG. 33.
Figure 36:
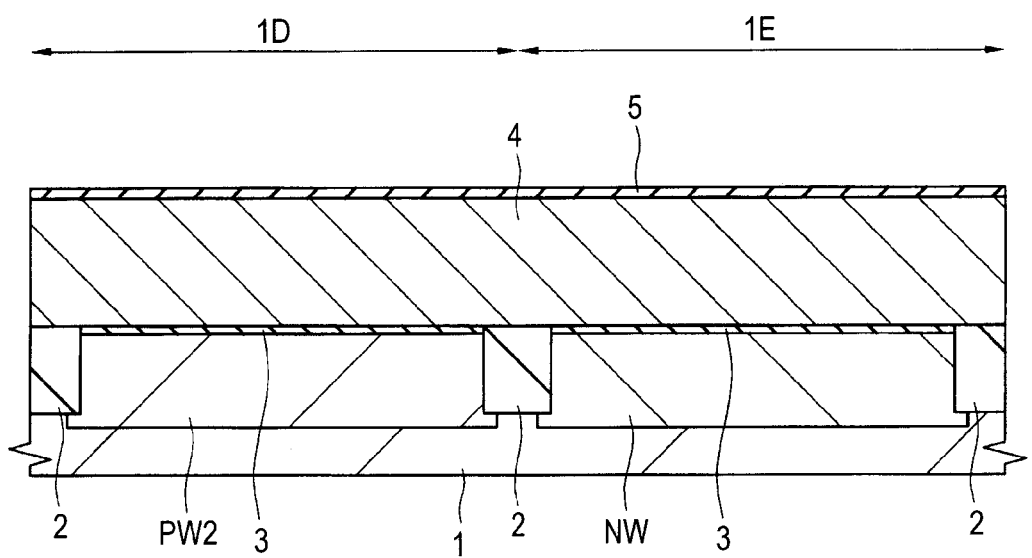
FIG. 36 is a cross-sectional view of a main part (peripheral nMIS region, peripheral pMIS region) of the same manufacturing step of the semiconductor device as that in FIG. 33.

In an etching back process of step S10, the photoresist pattern RP2 (that is, photoresist patterns RP2a and RP2b) serves as an etching mask, so that as shown in FIG. 35, the silicon film 6 remains under the photoresist pattern RP2b in the capacitor formation region 1C without being etched. The silicon film 6 remaining under the photoresist pattern RP2b without being etched forms the upper electrode UE. As shown in FIG. 34, the silicon film 6 remains under the photoresist pattern RP2a in the memory gate shunt region 1B without being etched. Further, the silicon film 6 remaining under the photoresist pattern RP2b without being etched forms the contact MGa. Since the etching back process in step S10 is anisotropic etching, the formed contact MGa has the same pattern shape (planer shape) as that of the photoresist pattern RP2a. The formed upper electrode UE has the same pattern shape (planar shape) as that of the photoresist pattern RP2b.

After the etching back process in step S10 is performed, the insulating film 5 is exposed in regions not covered with the memory gate electrode MG (including the contact MGa), the silicon spacer SP1, and the upper electrode. UE. The insulating film 5 under the memory gate electrode MG in the memory cell region 1A serves as the gate insulating film of the memory transistor. Since the memory gate length (gate length of the memory gate electrode MG) is determined by the thickness of the deposited silicon film 6, the memory gate length can be adjusted by adjusting the deposition length of the silicon film 9 deposited in the above step S9.

Then, a photoresist pattern (not shown) is formed over the semiconductor substrate 1 using the photolithography so as to cover the memory gate electrode MG (including the contact MGa) and the upper electrode UE and to expose the silicon spacer SP1. Then, the silicon spacer SP1 is removed by dry-etching using the photoresist pattern as an etching mask (in step S11 of FIG. 9). Thereafter, the photoresist pattern is removed. FIGS. 37 to 40 show this stage.

Figure 37:
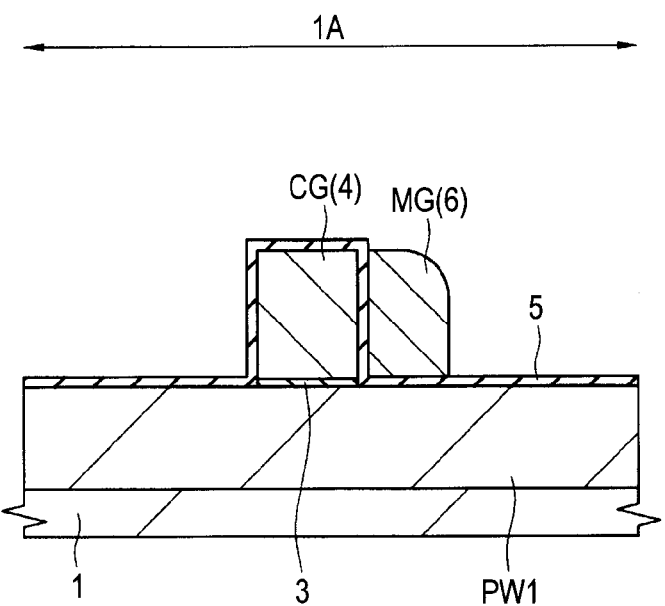
FIG. 37 is a cross-sectional view of a main part (memory cell region) of a manufacturing step of the semiconductor device, following the step shown in FIG. 33.
Figure 38:
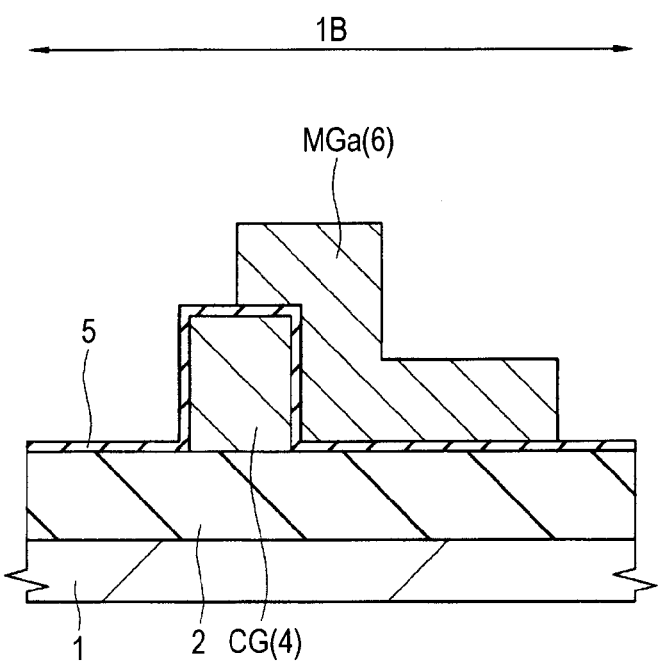
FIG. 38 is a cross-sectional view of a main part (memory gate shunt region) of the same manufacturing step of the semiconductor device as that in FIG. 37.
Figure 39:
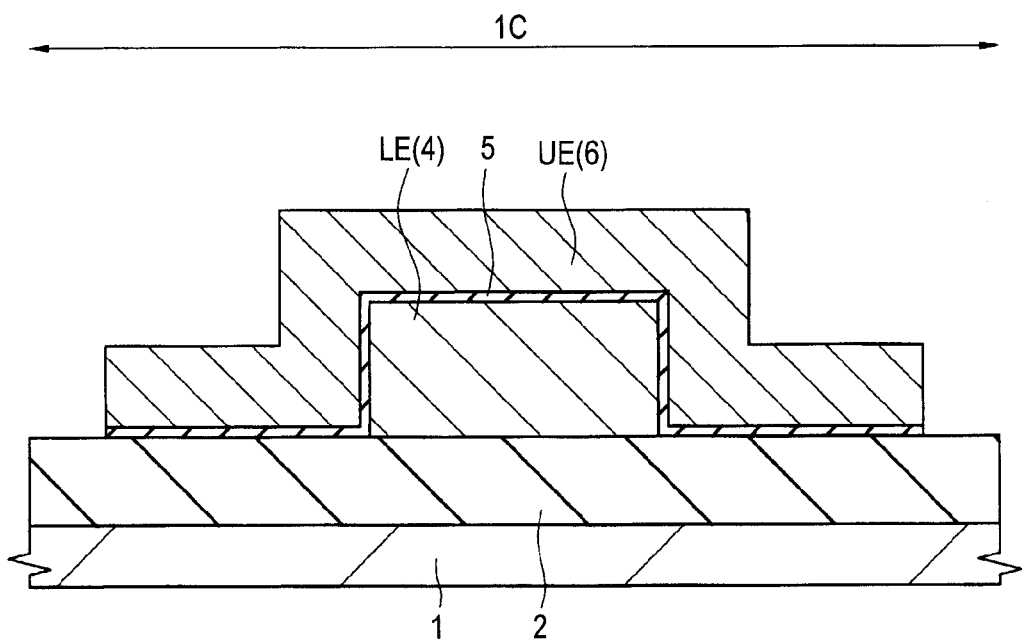
FIG. 39 is a cross-sectional view of a main part (capacitor formation region) of the same manufacturing step of the semiconductor device as that in FIG. 37.
Figure 40:
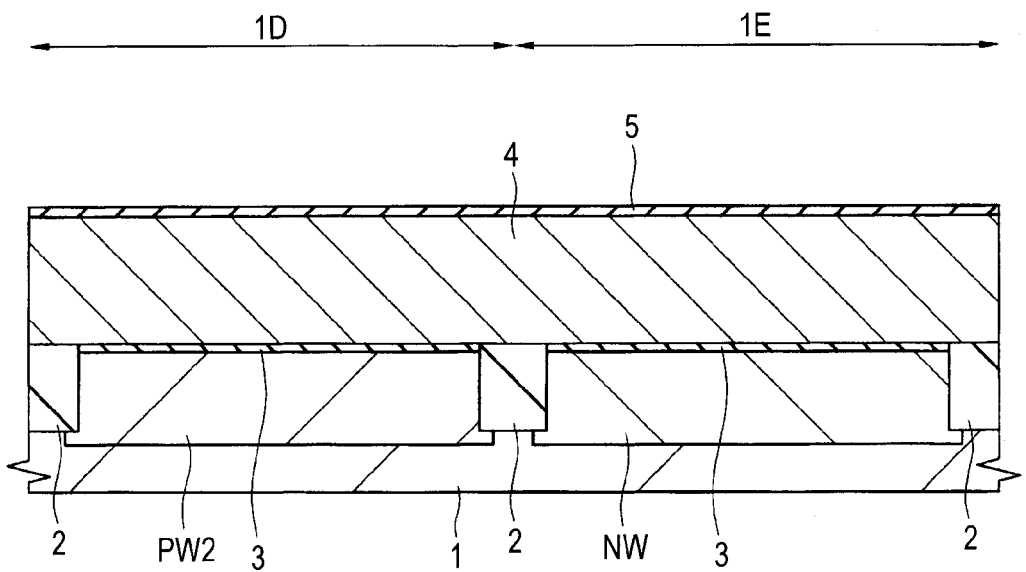
FIG. 40 is a cross-sectional view of a main part (peripheral nMIS region, peripheral pMIS region) of the same manufacturing step of the semiconductor device as that in FIG. 37.
Figure 41:
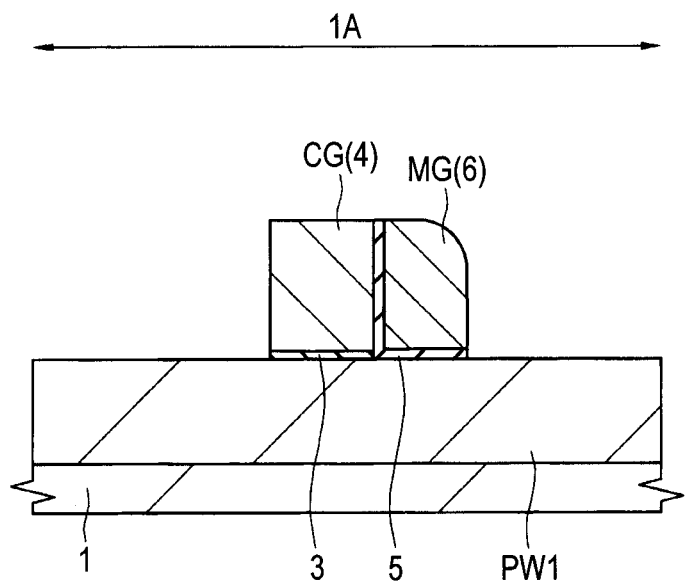
FIG. 41 is a cross-sectional view of a main part (memory cell region) of a manufacturing step of the semiconductor device, following the step shown in FIG. 37.
Figure 42:
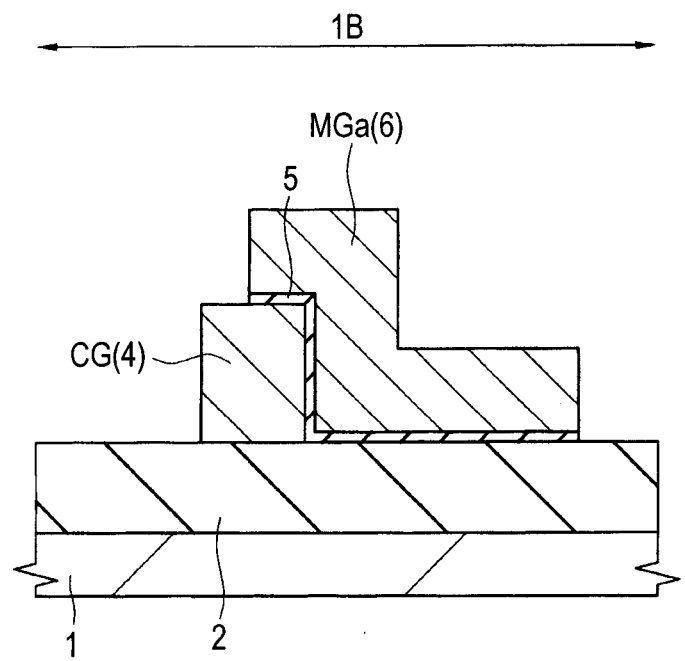
FIG. 42 is a cross-sectional view of a main part (memory gate shunt region) of the same manufacturing step of the semiconductor device as that in FIG. 41.
Figure 43:
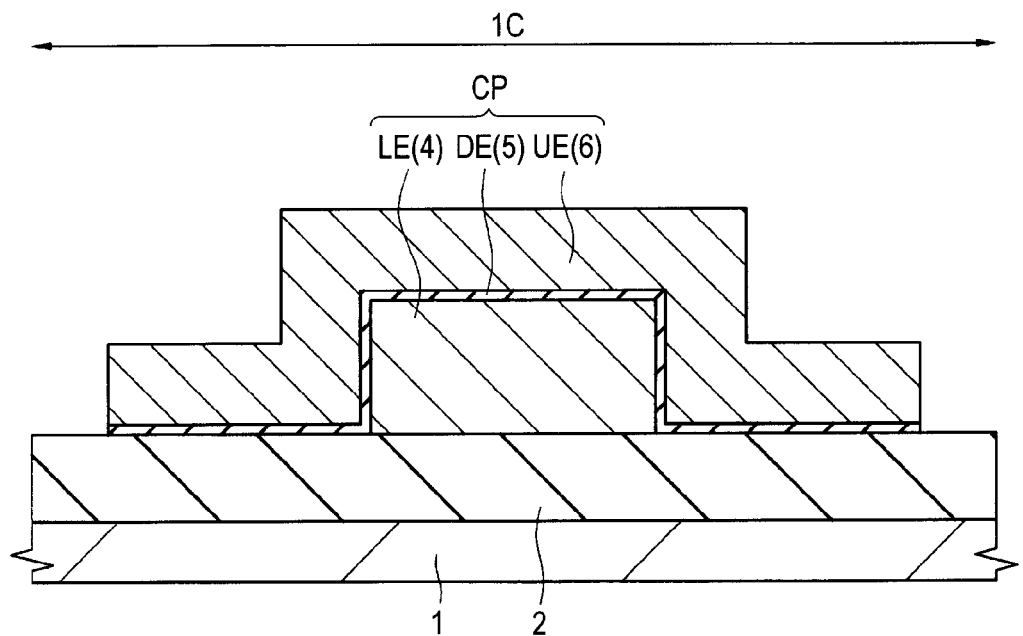
FIG. 43 is a cross-sectional view of a main part (capacitor formation region) of the same manufacturing step of the semiconductor device as that in FIG. 41.
Figure 44:
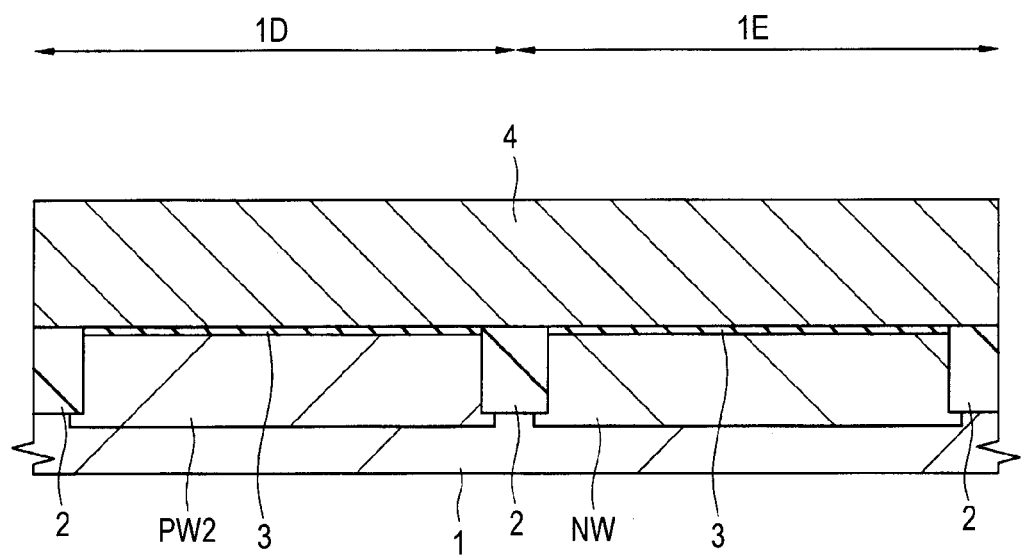
FIG. 44 is a cross-sectional view of a main part (peripheral nMIS region, peripheral pMIS region) of the same manufacturing step of the semiconductor device as that in FIG. 41.
Figure 45:
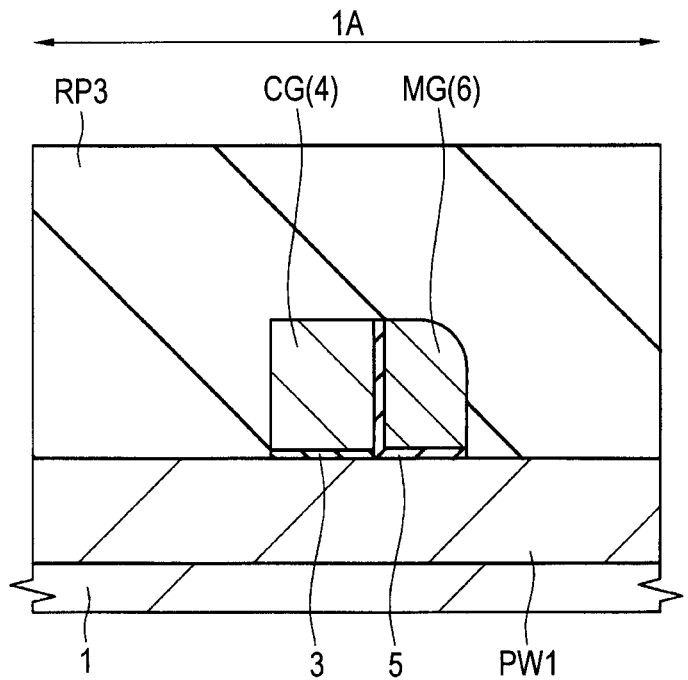
FIG. 45 is a cross-sectional view of a main part (memory cell region) of a manufacturing step of the semiconductor device, following the step shown in FIG. 41.
Figure 46:
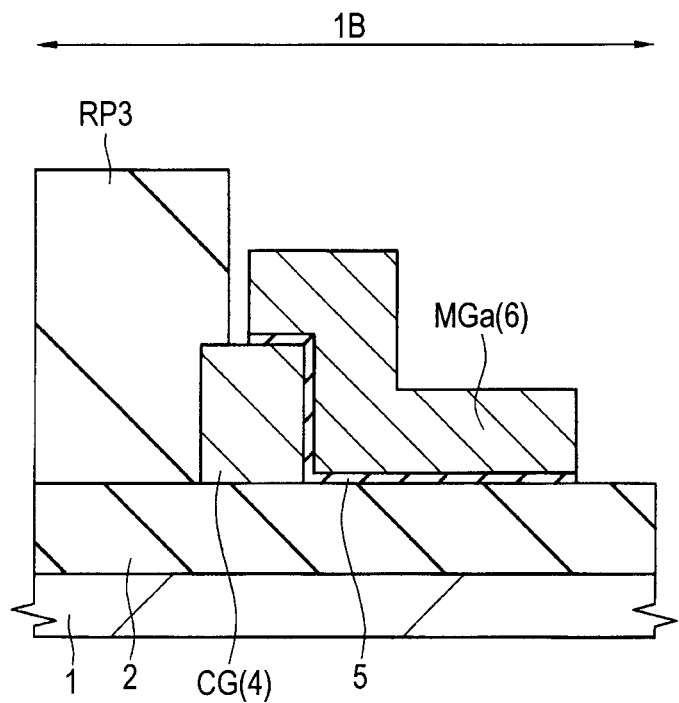
FIG. 46 is a cross-sectional view of a main part (memory gate shunt region) of the same manufacturing step of the semiconductor device as that in FIG. 45.
Figure 47:
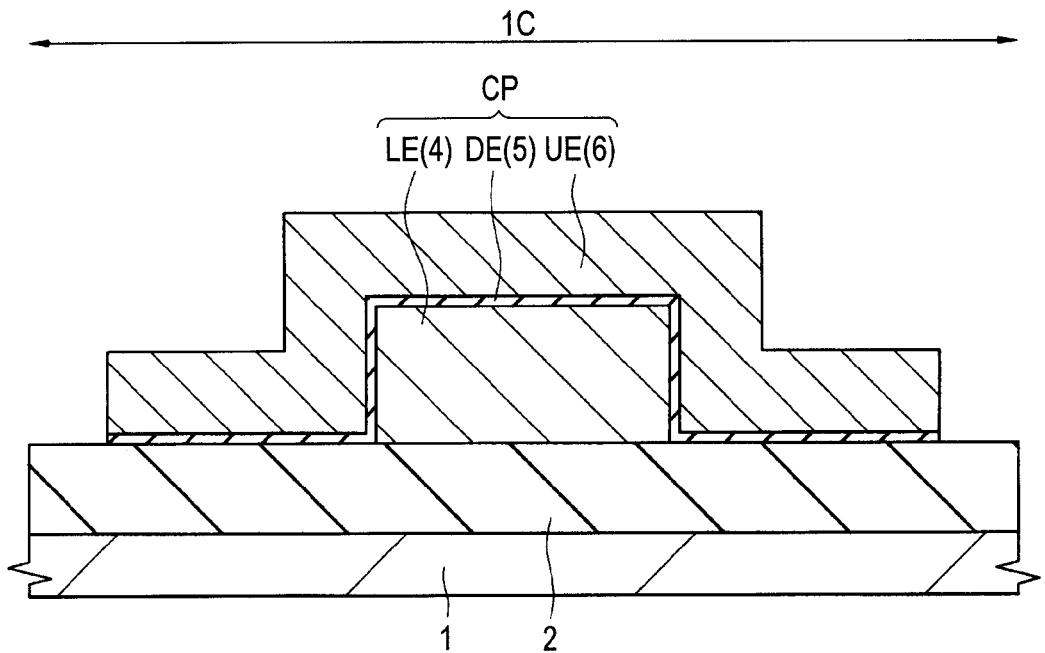
FIG. 47 is a cross-sectional view of a main part (capacitor formation region) of the same manufacturing step of the semiconductor device as that in FIG. 45.
Figure 48:
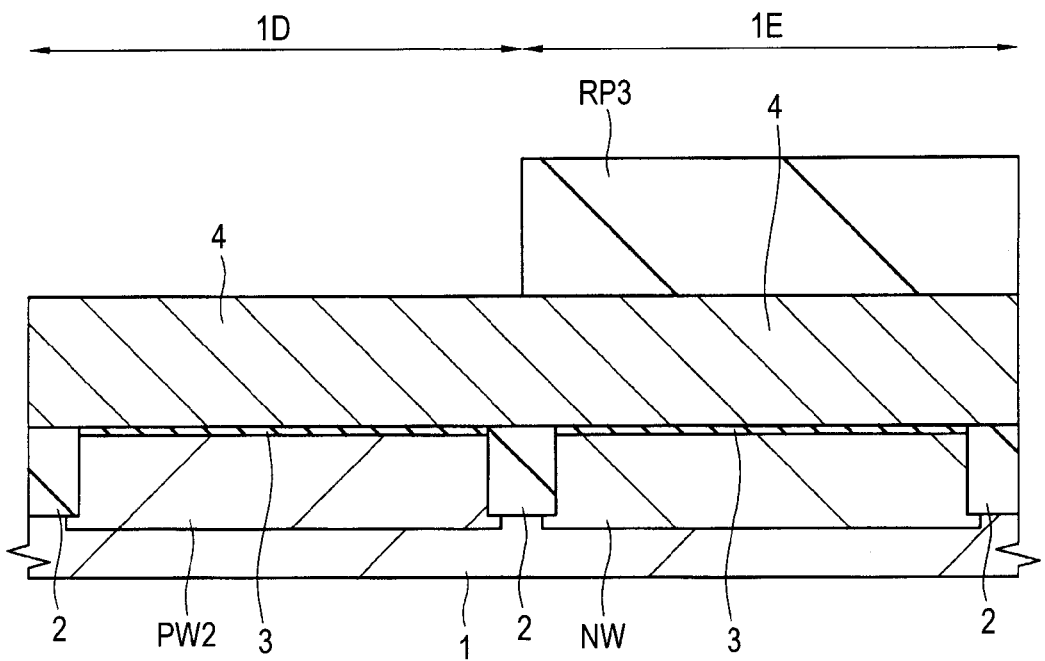
FIG. 48 is a cross-sectional view of a main part (peripheral nMIS region, peripheral pMIS region) of the same manufacturing step of the semiconductor device as that in FIG. 45.
Figure 49:
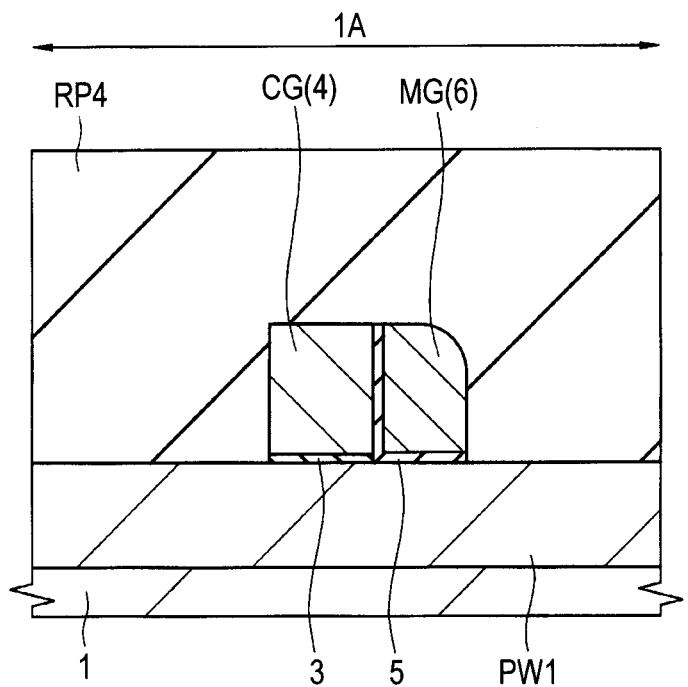
FIG. 49 is a cross-sectional view of a main part (memory cell region) of a manufacturing step of the semiconductor device, following the step shown in FIG. 45.
Figure 50:
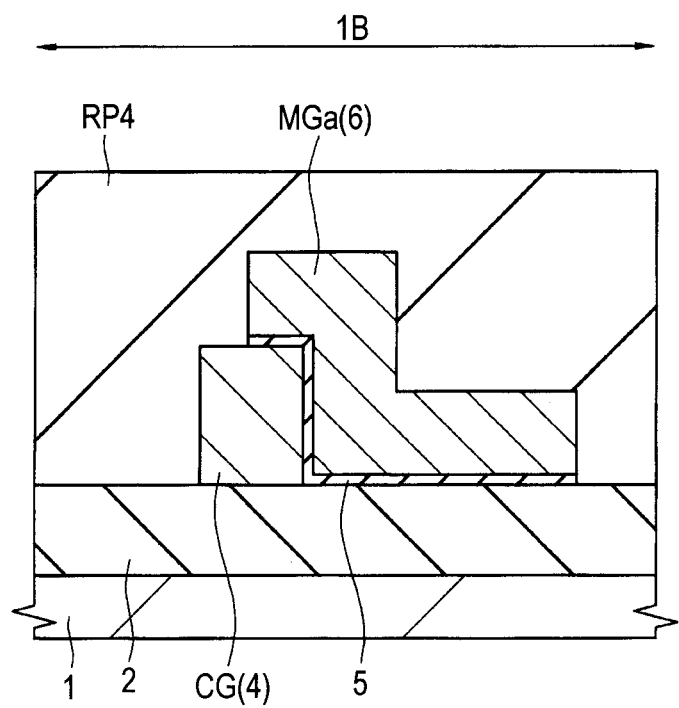
FIG. 50 is a cross-sectional view of a main part (memory gate shunt region) of the same manufacturing step of the semiconductor device as that in FIG. 49.
Figure 51:
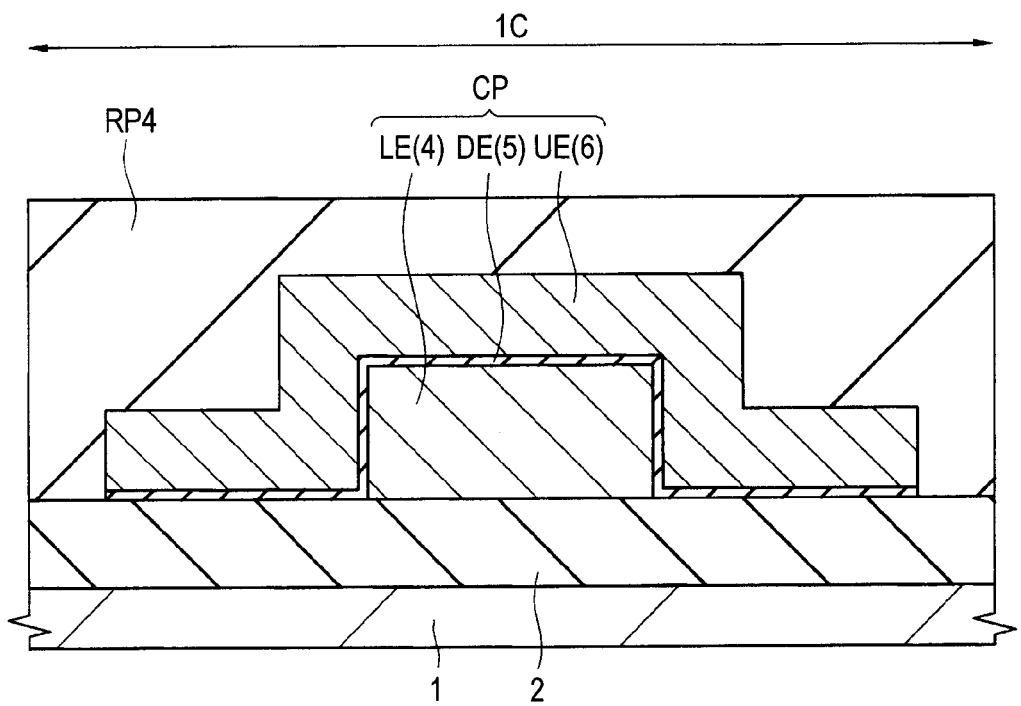
FIG. 51 is a cross-sectional view of a main part (capacitor formation region) of the same manufacturing step of the semiconductor device as that in FIG. 49.
Figure 52:
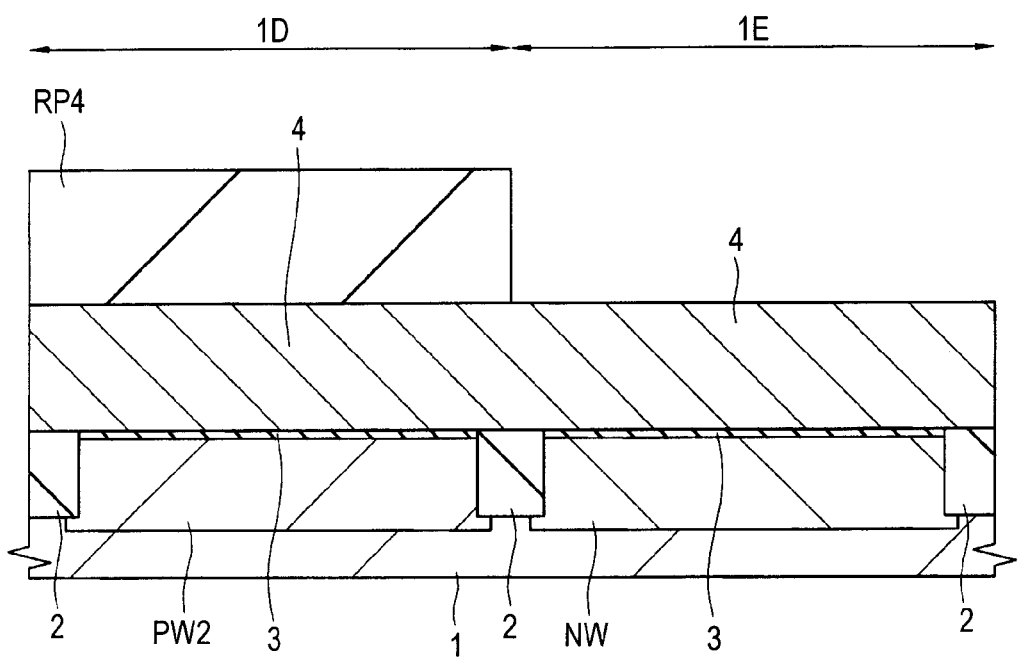
FIG. 52 is a cross-sectional view of a main part (peripheral nMIS region, peripheral pMIS region) of the same manufacturing step of the semiconductor device as that in FIG. 49.
Figure 53:
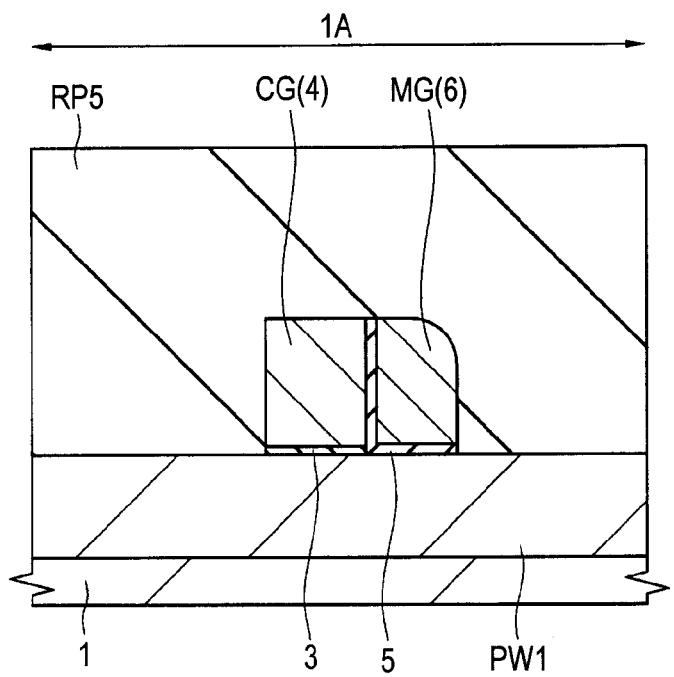
FIG. 53 is a cross-sectional view of a main part (memory cell region) of a manufacturing step of the semiconductor device, following the step shown in FIG. 49.
Figure 54:
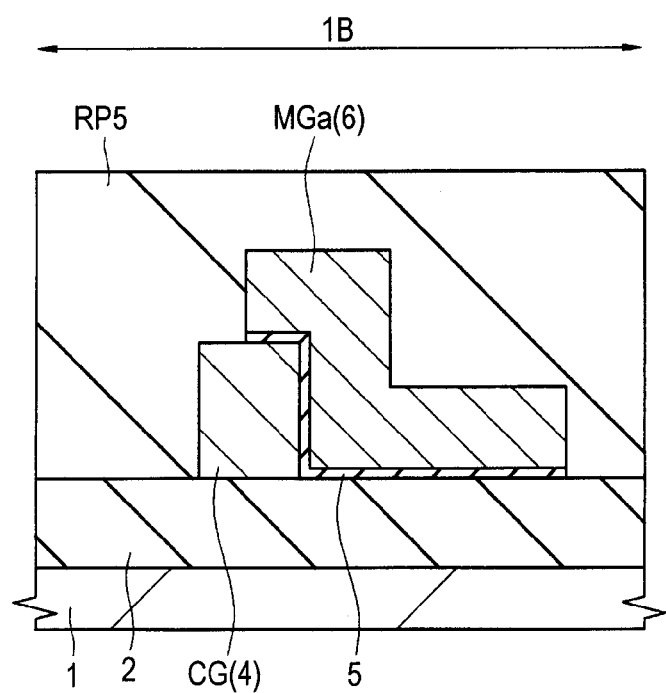
FIG. 54 is a cross-sectional view of a main part (memory gate shunt region) of the same manufacturing step of the semiconductor device as that in FIG. 53.
Figure 55:
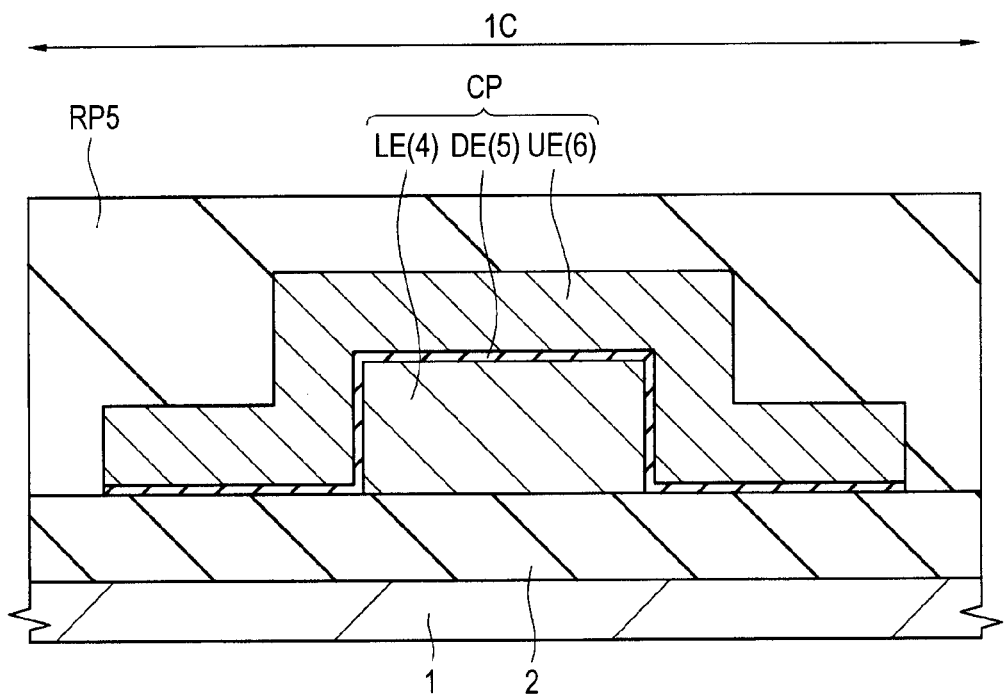
FIG. 55 is a cross-sectional view of a main part (capacitor formation region) of the same manufacturing step of the semiconductor device as that in FIG. 53.

In the etching process at step S11, as shown in FIGS. 37 and 38, the silicon spacer SP1 is removed, and the memory gate electrode MG (including the contact MGa) and the upper electrode UE remain without being etched because they are covered with the photoresist pattern.

Then, as shown in FIGS. 41 to 44, the parts of the insulating film 5 exposing to the outside and not covered with the memory gate electrode MG (including the contact MGa) and the upper electrode UE are removed by etching (for example, wet etching) (in step S12 shown in FIG. 9). At this time, in the memory cell region 1A and the memory gate shunt region 1B, the insulating film 5 positioned under the memory gate electrode MG and between the memory gate electrode MG and the control gate electrode CG remain without being removed. In the capacitor formation region 1C, the insulating film 5 positioned under the upper electrode UE remains without being removed, and the insulating films 5 in other regions are removed. In the capacitor formation region 1C, the insulating film 5 remaining under the upper electrode UE becomes a capacity insulating film DE of the capacitive element CP.

Then, as shown in FIGS. 45 to 48, a photoresist pattern RP3 is formed over the main surface of the semiconductor substrate 1 as the mask layer (resist pattern for the mask) using the photolithography (in step S13 shown in FIG. 9).

The photoresist pattern RP3 is formed to cover the entire memory cell region 1A and the entire peripheral pMIS region 1E and to expose the entire capacitor formation region 1C and the entire peripheral nMIS region 1D. The photoresist pattern RP3 is formed to expose the contact MGa in the memory gate shunt region 1B. Thus, the memory gate electrode MG and the control gate electrode CG in the memory cell region 1A are covered with the photoresist pattern RP3. The contact MGa in the memory gate shunt region 1B is exposed to the outside without being covered with the photoresist pattern RP3. The upper electrode UE in the capacitor formation region 1C is exposed without being covered with the photoresist pattern RP3. The silicon film 4 in the peripheral nMIS region 1D is exposed without being covered with the photoresist pattern RP3. The silicon film 4 in the peripheral pMIS region 1E is covered with the photoresist pattern RP3.

Then, ion implantation is performed using the photoresist pattern RP3 as a mask (ion implantation blocking mask) (in step S14 shown in FIG. 10). In ion implantation in step S14, n-type impurities can be implanted with the dose amount set to, for example, about $5 \times 10^{15}/cm^2$.

In the ion implantation in step S14, n-type impurities are introduced (implanted) into the silicon film 4 in the peripheral nMIS region 1D, the upper electrode UE in the capacitor formation region 1C (silicon film 6 included therein), and the contact MGa in the memory gate shunt region 1B (silicon film 6 included therein). In the ion implantation in step S14, the memory gate electrode MG (silicon film 6 included therein) and the control gate electrode CG (silicon film 4 included therein) in the memory cell region 1A and the silicon film 4 in the peripheral pMIS region 1E are covered with the photoresist pattern RP3, and thus no n-type impurities are ion-implanted (introduced). After the ion implantation in step S14, the concentration of impurities of the upper electrode UE (silicon film 6 included therein) in the capacitor formation region 1C and the concentration of impurities of the contact MGa in the memory gate shunt region 1B (silicon film 6 included therein) become higher than that of the memory gate electrode MG (silicon film 6 included therein) in the memory cell region 1A. In contrast, before the process in step S14, the above-mentioned concentrations of impurities are the same. Thereafter, the photoresist pattern RP3 is removed.

Then, as shown in FIGS. 49 to 52, a photoresist pattern RP4 is formed over the main surface of the semiconductor substrate 1 as a mask layer (resist pattern for the mask) using the photolithography (in step S15 shown in FIG. 10). The photoresist pattern RP4 is formed to cover the entire memory cell region 1A, the entire memory gate shunt region 1B, the entire capacitor formation region 1C, and the entire peripheral nMIS region 1D, and to expose the peripheral pMIS region 1E.

Then, p-type impurities (for example, boron (B)) are introduced (implanted) by ion implantation into the silicon film 4 in the peripheral pMIS region 1E using the photoresist pattern RP4 as a mask (ion implantation blocking mask) (in step S16 shown in FIG. 10). Thereafter, the photoresist pattern RP4 is removed. In the ion implantation in step S16, the silicon film 4 in the peripheral nMIS region 1D, the control gate electrode CG and memory gate electrode MG in the memory cell region 1A, the control gate electrode CG and the contact MGa in the memory gate shunt region 1B, and the lower electrode LE and the upper electrode UE in the capacitor formation region 1C are covered with the photoresist pattern, and thus p-type impurities are not ion-implanted thereinto.

Then, the impurities introduced by the ion implantation in steps S14 and S16 are diffused by heat treatment (in step S17 shown in FIG. 10). The heat treatment in step S17 can be performed, for example, at a heat treatment temperature of 700 to 1000° C. under an inert gas, more preferably, under a nitrogen atmosphere.

The impurities introduced (implanted) into the contact MGa in the memory gate shunt region 1B (silicon film 6 included therein), into the upper electrode UE in the capacitor formation region 1C (silicon film 6 included therein), and into the silicon films 4 in the peripheral nMIS region 1D and the peripheral pMIS region 1E (in the ion implantation in steps S14 and S15) are activated and diffused by the heat treatment in step S17. At this time, in the heat treatment in step S17, the impurities are preferably diffused into the entire silicon films 4 and 6 in the thickness direction.

That is, in the ion implantation at step S14, the implantation depth of impurity ions is controlled by adjusting an ion implantation energy. Then, the n-type impurities are implanted (introduced) into the upper layer parts of the silicon film 4 and 6 included in the contact MGa in the memory gate shunt region 1B, the silicon film 6 included in the upper electrode UE in the capacitor formation region 1C, and the silicon film 4 in the peripheral nMIS region 1D. In the ion implantation at step S16, the implantation depth of the impurity ions is controlled by adjusting the ion implantation energy, whereby p-type impurities are implanted (introduced) into the upper layer part of the silicon film 4. The impurities implanted (introduced) into the upper layer parts of the silicon films 4 and 6 by the ion implantation in steps S14 and S16 are diffused by the heat treatment in step S17, so that the impurities can be diffused into the entire silicon films 4 and 6 in the thickness direction.

The n-type impurities ion-implanted in step S14 in use can be phosphorus (P) or arsenic (As), but phosphorus (P) is preferably used. This is because the phosphorus (P) element tends to be diffused more easily than the arsenic (As) element, and thus the ion implantation of the phosphorus (P) element in step S14 is apt to cause the impurities (phosphorus elements) to be diffused into the entire silicon films 4 and 6 in the thickness direction by the heat treatment in step S17.

Even after the heat treatment in step S17, the impurities implanted in steps S14 and S16 are not diffused into the memory gate electrode MG (silicon film 6 included therein) in the memory cell region 1A. This is because the contact MGa in the memory gate shunt region 1B is integrally coupled to the memory gate electrode MG in the memory cell region 1A, but is spaced apart to some degree, so that the impurities implanted into the contact MG in the memory gate shunt region 1B in step S14 cannot be diffused into and reach up to the memory gate electrode MG in the memory cell region 1A even after the heat treatment in step S17. That is, the impurities implanted into the contact MG in the memory shunt region 1B in step S14 cannot be diffused into the memory gate electrode MG in the memory cell region 1A. However, the heat treatment should be preferably performed in step S17 under the conditions for the heat treatment that can diffuse the impurities implanted into the silicon film 4 and 6 within the memory gate shunt region 1B, the capacitor formation region 1C, the peripheral nMIS region 1D, and the peripheral pMIS region 1E in the thickness direction of the silicon films 4 and 6.

By the ion implantation in step S14 and the heat treatment in step S17, the silicon film 6 included in the contact MGa in the memory gate shunt region 1B, the silicon film 6 included in the upper electrode UE in the capacitor formation region 1C, and the silicon film 4 in the peripheral nMIS region 1D are converted into the n-type silicon film (polycrystalline silicon film with n-type impurities introduced thereinto, n-type doped polysilicon film). By the ion implantation in step S16 and the heat treatment in step S17, the silicon film 4 in the peripheral pMIS region 1E becomes a p-type silicon film (polycrystalline silicon film with p-type impurities introduced thereinto, p-type doped polysilicon film).

In this embodiment, after the processes in step S13 and S14, the processes in step S15 and S16 will be performed. In another embodiment, after the processes in steps S15 and S16, the processes in steps S13 and S14 can be performed.

Then, as shown in FIGS. 53 to 56, a photoresist pattern RP5 is formed as the mask layer (resist pattern for the mask) over the main surface of the semiconductor substrate 1 using the photolithography. The photoresist pattern RP5 is formed to cover the entire memory cell region 1A, the entire memory gate shunt region 1B, the entire capacitor formation region 1C, and the regions for formation of the gate electrodes GE1 and GE2 in the peripheral nMIS region 1D and the peripheral pMIS region 1E. In the peripheral nMIS region 1D and the peripheral pMIS region 1E, the silicon film 4 except for the regions thereof for forming the gate electrodes GE1 and GE2 is exposed without being covered with the photoresist pattern RP5.

Figure 56:
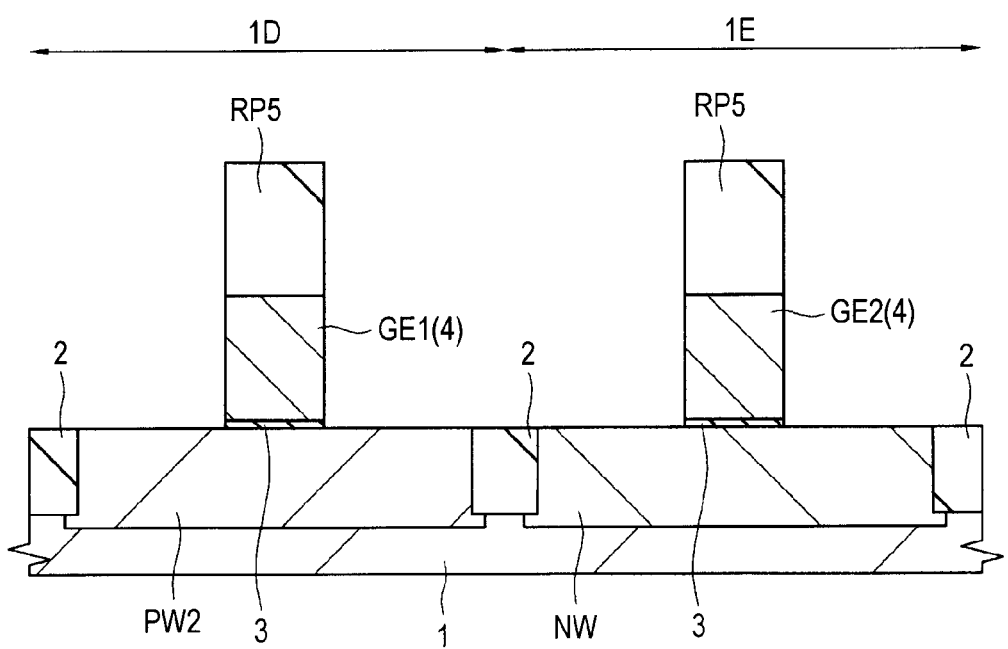
FIG. 56 is a cross-sectional view of a main part (peripheral nMIS region, peripheral pMIS region) of the same manufacturing step of the semiconductor device as that in FIG. 53.

Then, the silicon film 4 in the peripheral nMIS region 1D and the peripheral pMIS region 1E is etched (dry-etched) and patterned using the photoresist pattern RP5 as an etching mask, so that the gate electrodes GE1 and GE2 are formed as shown in FIG. 56 (in step S18 shown in FIG. 10). Thereafter, the photoresist pattern RP5 is removed.

The gate electrode GE1 is comprised of the patterned silicon film 4, and formed in the peripheral nMIS region 1D. The gate electrode GE2 is comprised of the patterned silicon film 4, and formed in the peripheral pMIS region 1E. The gate electrode GE1 is a gate electrode for the n-channel MISFET. The gate electrode GE2 is a gate electrode for the p-channel MISFET. As described above, the silicon film 4 in the peripheral nMIS region 1D is an n-type silicon film. The gate electrode GE1 formed in the peripheral nMIS region 1D (gate electrode GE1 for the n-channel MISFET) is an n-type silicon film (that is, the silicon film 4 with n-type impurities introduced thereinto). As described above, the silicon film 4 in the peripheral pMIS region 1E becomes a p-type silicon film, and thus the gate electrode GE2 formed in the peripheral pMIS region 1E (gate electrode GE2 for the p-channel MISFET) is formed of the p-type silicon film (that is, the silicon film 4 with p-type impurities introduced thereinto). When etching the silicon film 4 in the peripheral nMIS region 1D and the peripheral pMIS region 1E so as to form the gate electrodes GE1 and GE2, the memory cell region 1A, the memory gate shunt region 1B, and the capacitor formation region 1C are covered with the photoresist pattern RP5, and thus not etched.

Then, as shown in FIGS. 57 to 60, a photoresist pattern RP6 is formed as the mask layer (resist pattern for the mask) over the main surface of the semiconductor substrate 1 using the photolithography. The photoresist pattern RP6 is formed to cover the entire memory gate shunt region 1B, the entire capacitor formation region 1C, the entire peripheral nMIS region 1D, and the entire peripheral pMIS region 1E, to expose the source in the memory cell region 1A, and to cover the drain in the memory cell region. The source in the memory cell region 1A corresponds to a region in which a source region (semiconductor region MS) of the memory transistor is to be formed later. The drain in the memory cell region 1A corresponds to a region in which a drain region (semiconductor region MD) of the memory transistor is to be formed later.

Figure 57:
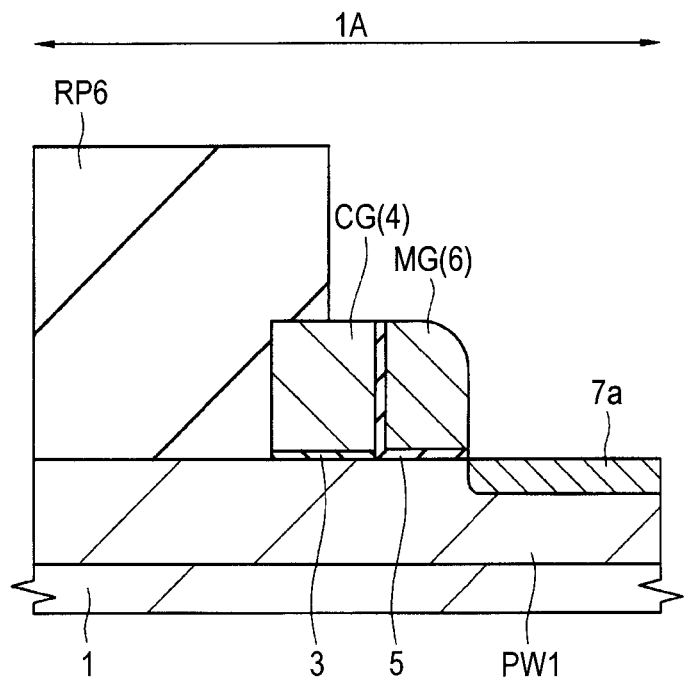
FIG. 57 is a cross-sectional view of a main part (memory cell region) of a manufacturing step of the semiconductor device, following the step shown in FIG. 53.
Figure 58:
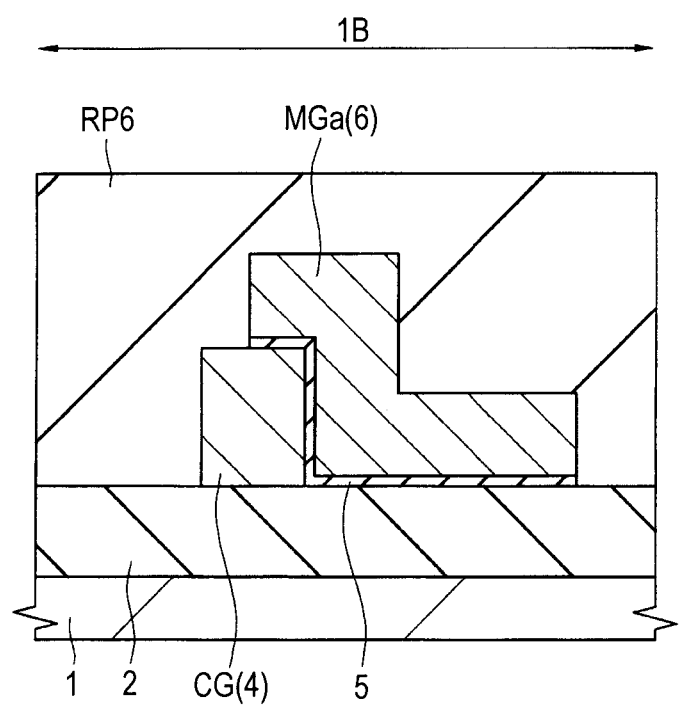
FIG. 58 is a cross-sectional view of a main part (memory gate shunt region) of the same manufacturing step of the semiconductor device as that in FIG. 57.
Figure 59:
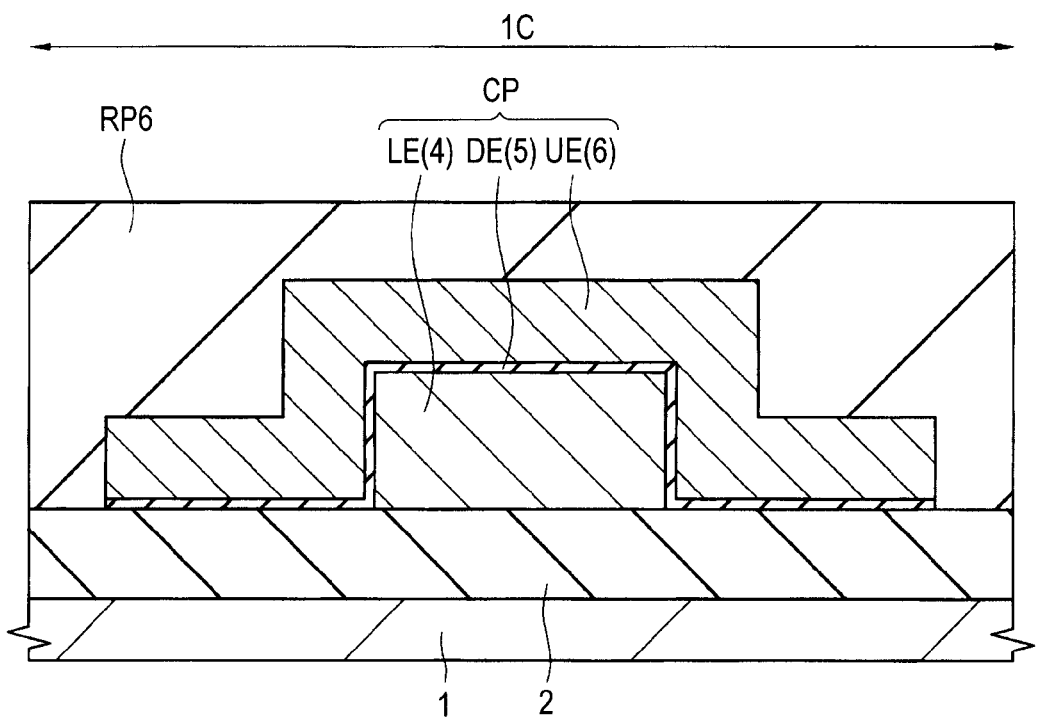
FIG. 59 is a cross-sectional view of a main part (capacitor formation region) of the same manufacturing step of the semiconductor device as that in FIG. 57.
Figure 60:
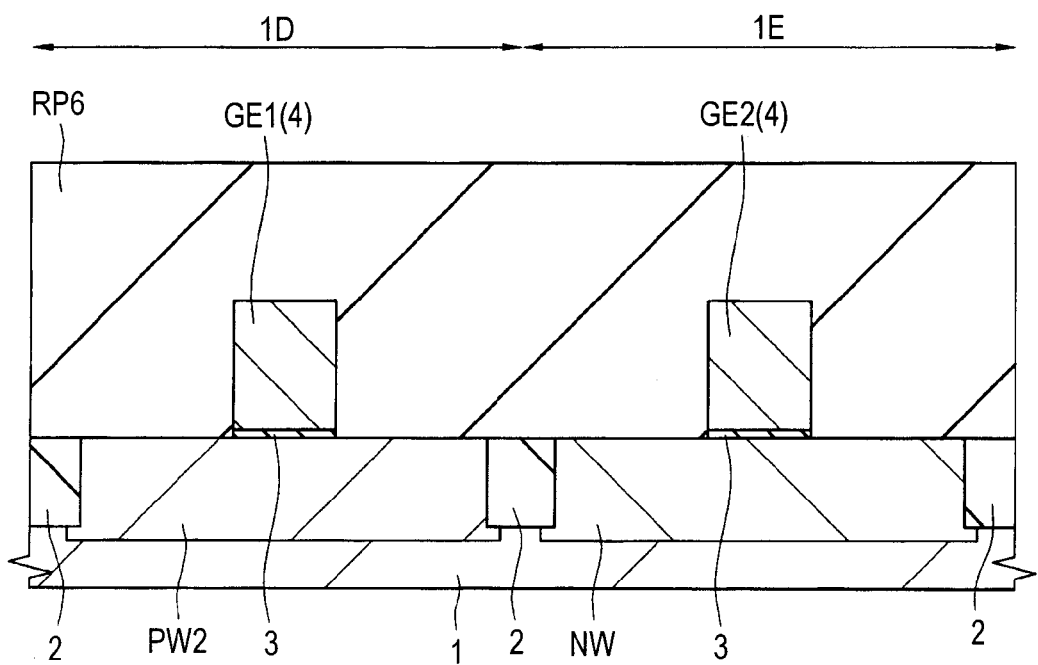
FIG. 60 is a cross-sectional view of a main part (peripheral nMIS region, peripheral pMIS region) of the same manufacturing step of the semiconductor device as that in FIG. 57.

Then, ion implantation is performed using a photoresist pattern RP6 as a mask (ion implantation blocking mask) (in step S19 shown in FIG. 10). In ion implantation in step S19, n-type impurities are introduced (implanted) by ion implantation into the semiconductor substrate 1 of the source in the memory cell region 1A (p-type well PW1) to thereby from an n⁻-type semiconductor region 7a as shown in FIG. 57. At this time, in the semiconductor substrate 1 (p-type well PW1) of the memory cell region 1A, the n⁻-type semiconductor region 7a is formed in self-alignment with the sidewall of the memory gate electrode MG (sidewall opposite to the side adjacent to the control gate electrode CG via the insulating film 5). This is because the memory gate electrode MG can serve as the ion implantation blocking mask. The n⁻-type semiconductor region 7a can serve as a part of the source regions (semiconductor region MS) of the memory cell formed in the memory cell region 1A. In the ion implantation at step S19, n-type impurities are introduced with the amount of dose in the ion implantation in step S6 set to, for example, about $5 \times 10^{14}/cm^2$.

In the ion implantation at step S19, the memory gate shunt region 1B, the capacitor formation region 1C, the peripheral nMIS region 1D, and the peripheral pMIS region 1E are covered with the photoresist pattern RP6, and thus, no impurities are ion-implanted into the semiconductor substrate 1 in these regions, the gate electrodes GE1 and GE2, the lower electrode LE, the upper electrode UE, and the contact MGa. In the ion implantation at step S19, the drain of the memory cell region 1A is also covered with the photoresist pattern RP6, and thus no impurities are ion-implanted into the semiconductor substrate 1 (p-type well PW1) of the drain in the memory cell region 1A. After the ion implantation process in step S19, the photoresist pattern RP6 is removed.

The photoresist pattern RP6 needs to expose the source in the memory cell region 1A. Since the source is adjacent to the memory gate electrode MG, a part or all of the memory gate electrode MG (silicon film 6 included therein) in the memory cell region 1A can be exposed without being covered with the photoresist pattern RP6. In such a case, in the ion implantation at step S19, impurities (n-type impurities) are introduced (implanted) into the memory gate electrode MG (silicon film 6 included therein) in the memory cell region 1A.

Then, as shown in FIGS. 61 to 64, a photoresist pattern RP7 is formed as the mask layer (resist pattern for the mask) over the main surface of the semiconductor substrate 1 using the photolithography. The photoresist pattern RP7 is formed to cover the entire memory gate shunt region 1B, the entire capacitor formation region 1C, the entire peripheral nMIS region 1D, and the entire peripheral pMIS region 1E, to expose the drain in the memory cell region 1A, and to cover the source in the memory cell region 1A.

Figure 61:
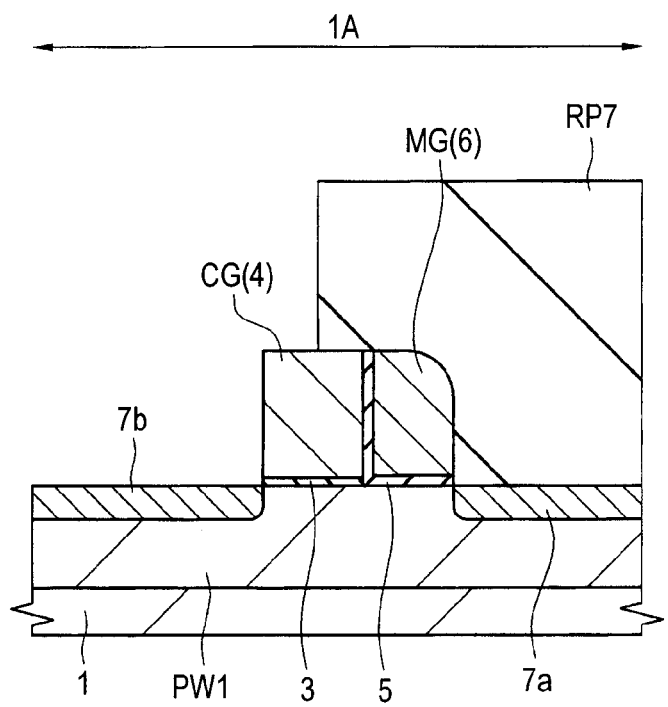
FIG. 61 is a cross-sectional view of a main part (memory cell region) of a manufacturing step of the semiconductor device, following the step shown in FIG. 57.
Figure 62:
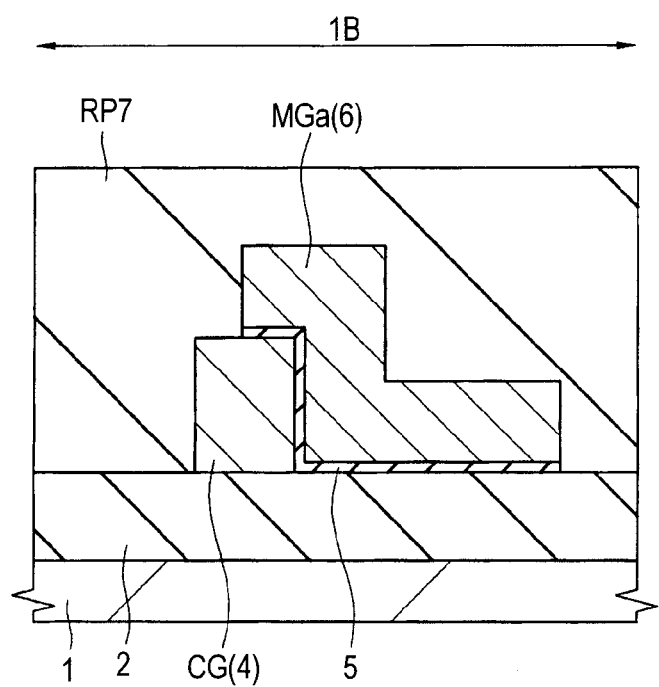
FIG. 62 is a cross-sectional view of a main part (memory gate shunt region) of the same manufacturing step of the semiconductor device as that in FIG. 61.
Figure 63:
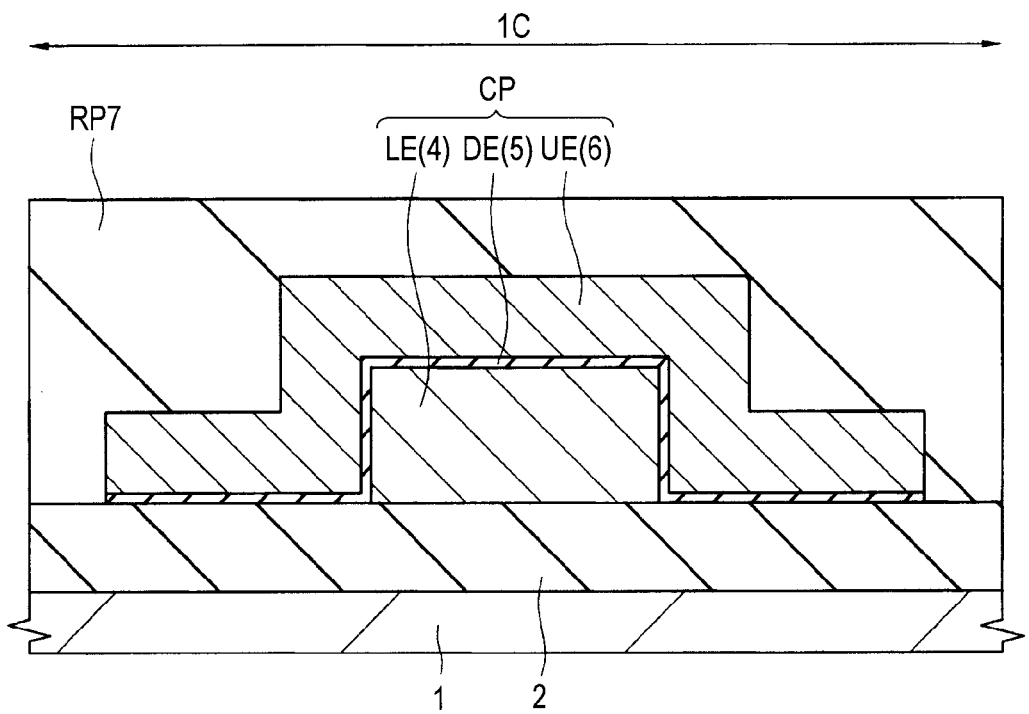
FIG. 63 is a cross-sectional view of a main part (capacitor formation region) of the same manufacturing step of the semiconductor device as that in FIG. 61.
Figure 64:
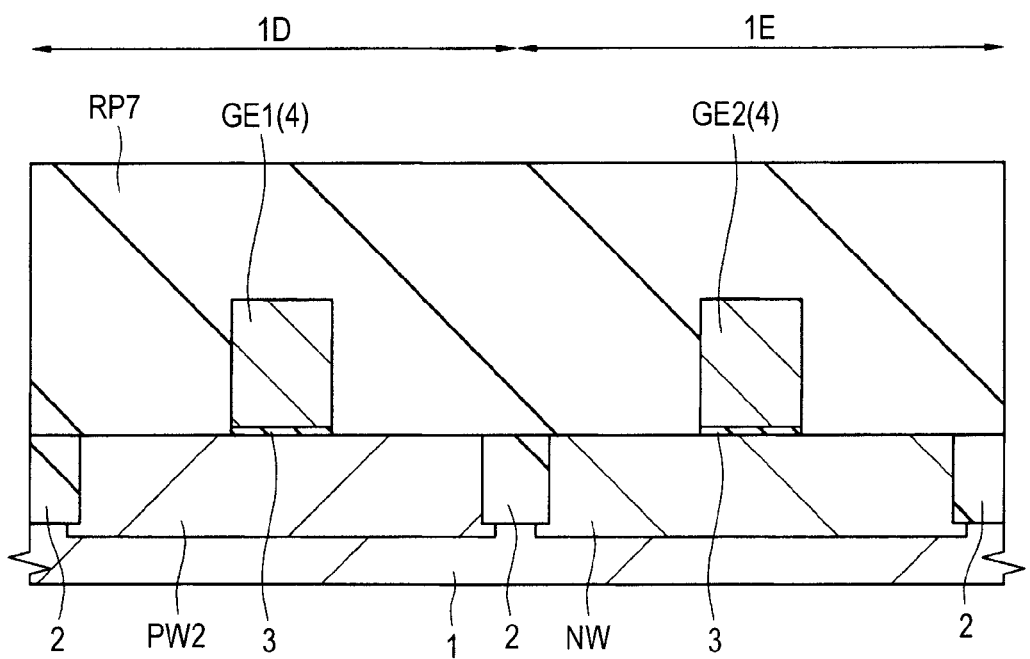
FIG. 64 is a cross-sectional view of a main part (peripheral nMIS region, peripheral pMIS region) of the same manufacturing step of the semiconductor device as that in FIG. 61.
Figure 65:
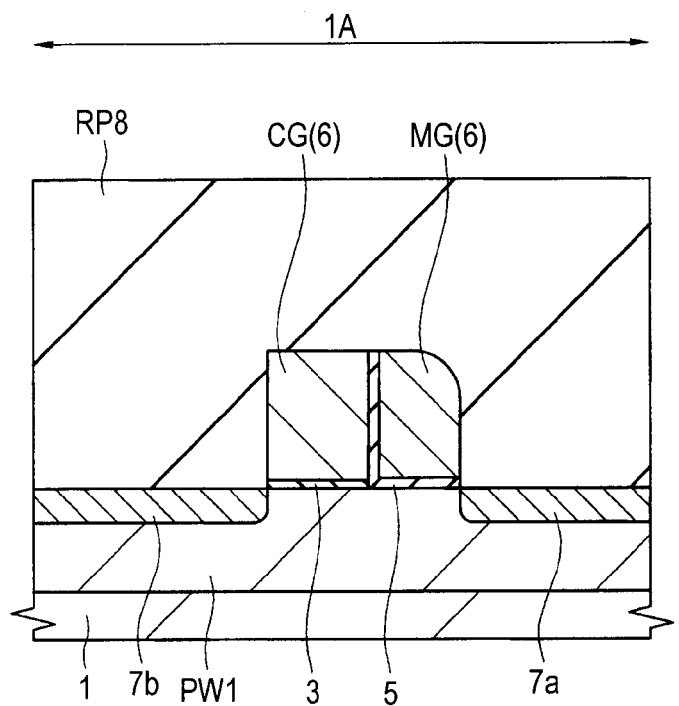
FIG. 65 is a cross-sectional view of a main part (memory cell region) of a manufacturing step of the semiconductor device, following the step shown in FIG. 61.
Figure 66:
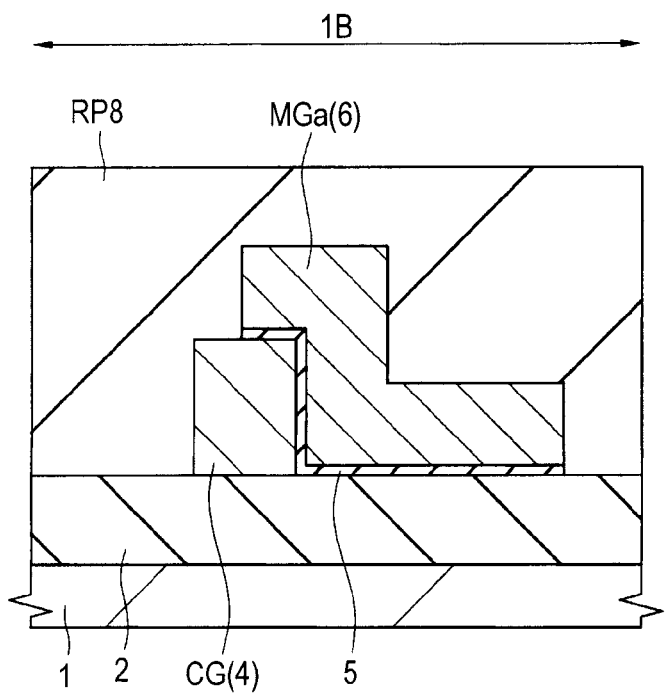
FIG. 66 is a cross-sectional view of a main part (memory gate shunt region) of the same manufacturing step of the semiconductor device as that in FIG. 65.
Figure 67:
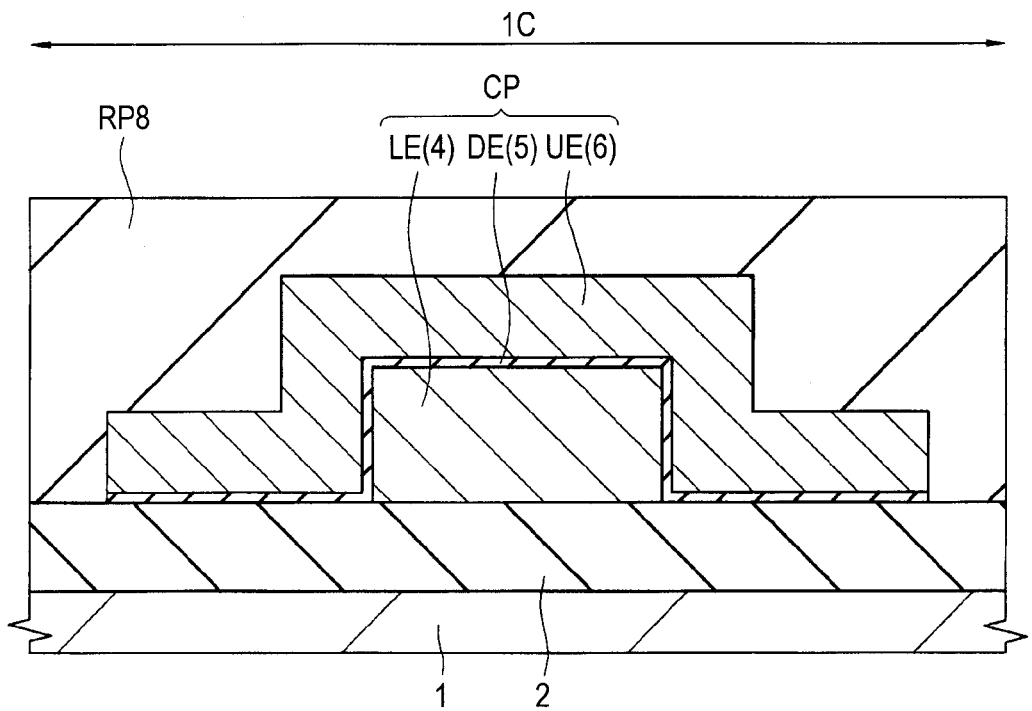
FIG. 67 is a cross-sectional view of a main part (capacitor formation region) of the same manufacturing step of the semiconductor device as that in FIG. 65.

Then, the ion implantation is performed using the photoresist pattern RP7 as a mask (ion implantation blocking mask) (in step S20 of FIG. 10). In the ion implantation at step S20, n-type impurities are introduced (implanted) into the semiconductor substrate 1 (p-type well PW1) of the drain in the memory cell region 1A to thereby form an n⁻-type semiconductor region 7b as shown in FIG. 61. At this time, the n⁻-type semiconductor substrate 7b is formed in self-alignment with the sidewall of the control gate electrode CG (sidewall opposite to the side adjacent to the memory gate electrode MG via the insulating film 5) at the semiconductor substrate 1 (p-type well PW1) in the memory cell region 1A. This is because the control gate electrode CG can serve as an ion implantation blocking mask. The n⁻-type semiconductor region 7b can serve as a part of the drain region (semiconductor region MD) of the memory cell formed in the memory cell region 1A. In the ion implantation at step S20, n-type impurities can be introduced with the amount of dose set to, for example, about 5×10¹⁴/cm².

In the ion implantation at step S20, the memory gate shunt region 1B, the capacitor formation region 1C, the peripheral nMIS region 1D, and the peripheral pMIS region 1E are covered with the photoresist pattern RP7, and thus no impurities are ion-implanted into the semiconductor substrate 1 in these regions, the gate electrodes GE1 and GE2, the lower electrode LE, the upper electrode UE, and the contact MGa. In the ion implantation at step S20, the source of the memory cell region 1A is covered with the photoresist pattern RP7, and thus no impurities are ion-implanted into the semiconductor substrate 1 (p-type well PW1) of the source in the memory cell region 1A. After the ion implantation process in step S20, the photoresist pattern RP7 is removed.

The photoresist pattern RP6 needs to expose the drain in the memory cell region 1A. Since the drain is adjacent to the control gate electrode CG, a part or all of the control gate electrode CG (silicon film 4 included therein) in the memory cell region 1A can be exposed without being covered with the photoresist pattern RP7. In such a case, however, the memory gate electrode MG (silicon film 6 included therein) in the memory cell region 1A is preferably covered with the photoresist pattern RP6 (that is, such that the end of an opening of the photoresist pattern RP6 is located not directly above the memory gate electrode MG, but directly above the control gate electrode CG). With this arrangement, in the ion implantation at step S19, the impurities (n-type impurities) can be prevented from being introduced (implanted) into the memory gate electrode MG (silicon film 6 included therein) in the memory cell region 1A.

Although the n⁻-type semiconductor region 7a and the n⁻-type semiconductor region 7b are formed in different ion implantation processes (in the ion implantation process in step S19 and in the ion implantation process in step S20), in a further embodiment, n⁻-type semiconductor region 7a and the n⁻-type semiconductor region 7b can be formed in the same ion implantation process. When the n⁻-type semiconductor region 7a and the n⁻-type semiconductor region 7b are intended to be formed in the same ion implantation process, the photoresist pattern RP6 exposes not only the source, but also the drain in the memory cell region 1A (more specifically, the entire memory cell region 1A). In the ion implantation at step S19, the n⁻-type semiconductor region 7a and the n⁻-type semiconductor region 7b may be formed. In this case, the formation process of the photoresist pattern RP7 and the ion implantation process in step S20 can be omitted below, and thus the effect of reducing the number of manufacturing steps can be obtained.

As mentioned above, when the n⁻-type semiconductor region 7a and the n⁻-type semiconductor region 7b are formed in different ion implantation processes (in the ion implantation process at step S19 and the ion implantation process at step S20), the conditions for ion implantation for forming the n⁻-type semiconductor region 7a (ion implantation in step S19) can be different from those for forming the n⁻-type semiconductor region 7b (ion implantation in step S20). Thus, the ion implantation conditions appropriate for the n⁻-type semiconductor region 7a enables formation of the n⁻-type semiconductor region 7a, and the ion implantation conditions appropriate for the n⁻-type semiconductor region 7b enables formation of the n⁻-type semiconductor region 7b. For example, a punch through stopper (p-type halo region) is desirably provided in a drain. Upon performing ion implantation for forming an n⁻-type semiconductor region 7b in the drain (ion implantation in step S20), p-type impurities (for example, boron (B)), can be ion-implanted together with n-type impurities. In contrast, upon performing ion implantation for forming n⁻-type semiconductor region 7a in a source without a punch through stopper (p-type halo region) (in the ion implantation in step S20), only n-type impurities (while p-type impurities are not ion-implanted), can be ion-implanted. The depth (junction depth) of the n⁻-type semiconductor region 7b of the drain can be made deeper than that of the n⁻-type semiconductor region 7a of the source. The concentration of impurities of the n⁻-type semiconductor region 7b (n-type impurity concentration) of the drain can be lower (smaller) than that of the n⁻-type semiconductor region 7a drain (n-type impurity concentration) of the source.

Then, as shown in FIGS. 65 to 68, a photoresist pattern RP8 is formed over the main surface of the semiconductor substrate 1 as a mask layer (resist pattern for a mask) using the photolithography. The photoresist pattern RP8 is formed to cover the entire memory cell region 1A, the entire memory gate shunt region 1B, the entire capacitor formation region 1C, and the peripheral pMIS region 1E, and to expose the peripheral nMIS region 1D.

Figure 68:
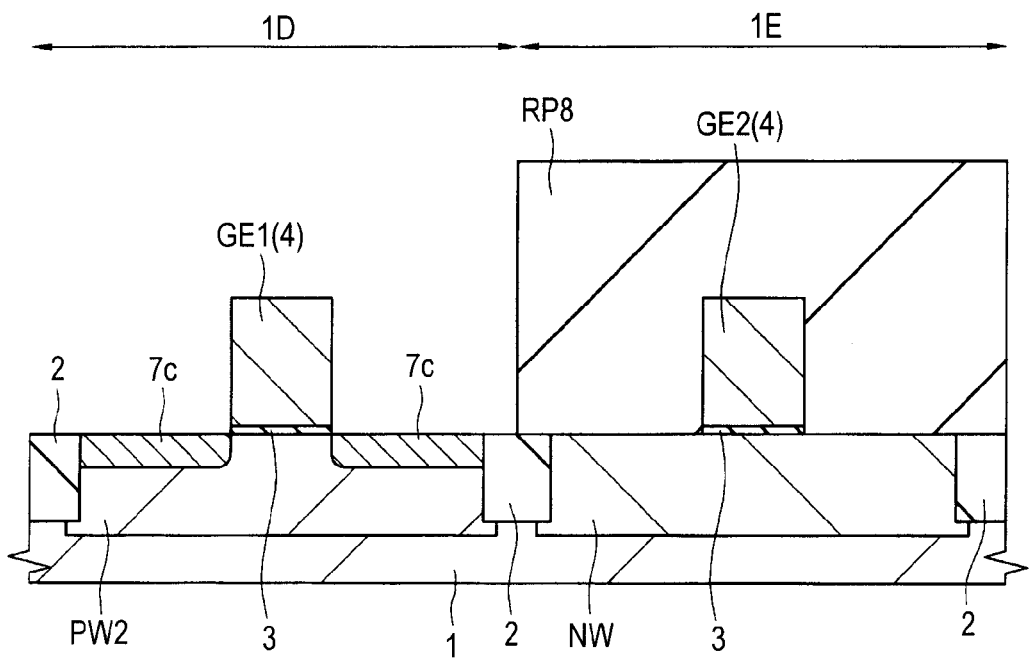
FIG. 68 is a cross-sectional view of a main part (peripheral nMIS region, peripheral pMIS region) of the same manufacturing step of the semiconductor device as that in FIG. 65.
Figure 69:
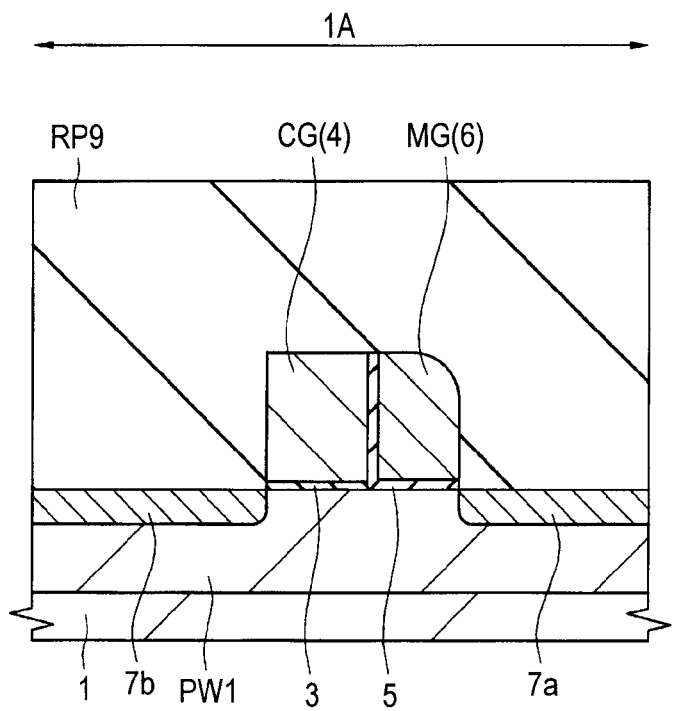
FIG. 69 is a cross-sectional view of a main part (memory cell region) of a manufacturing step of the semiconductor device, following the step shown in FIG. 65.
Figure 70:
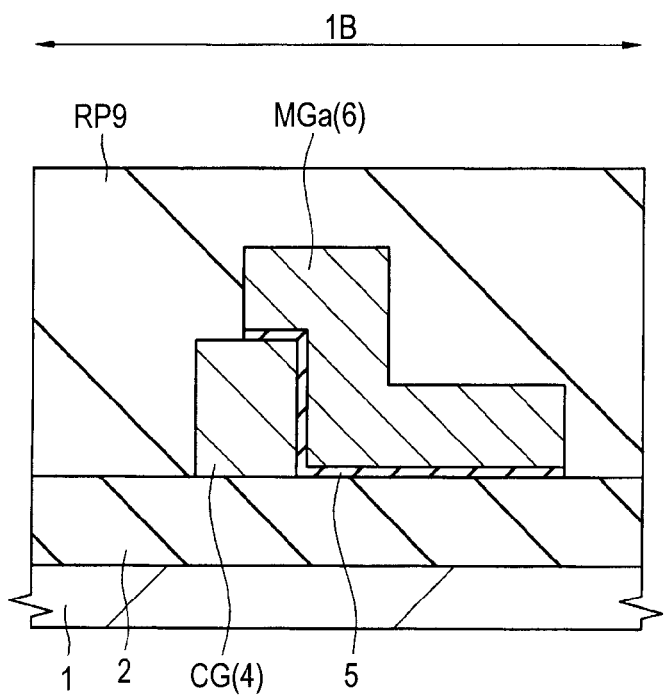
FIG. 70 is a cross-sectional view of a main part (memory gate shunt region) of the same manufacturing step of the semiconductor device as that in FIG. 69.
Figure 71:
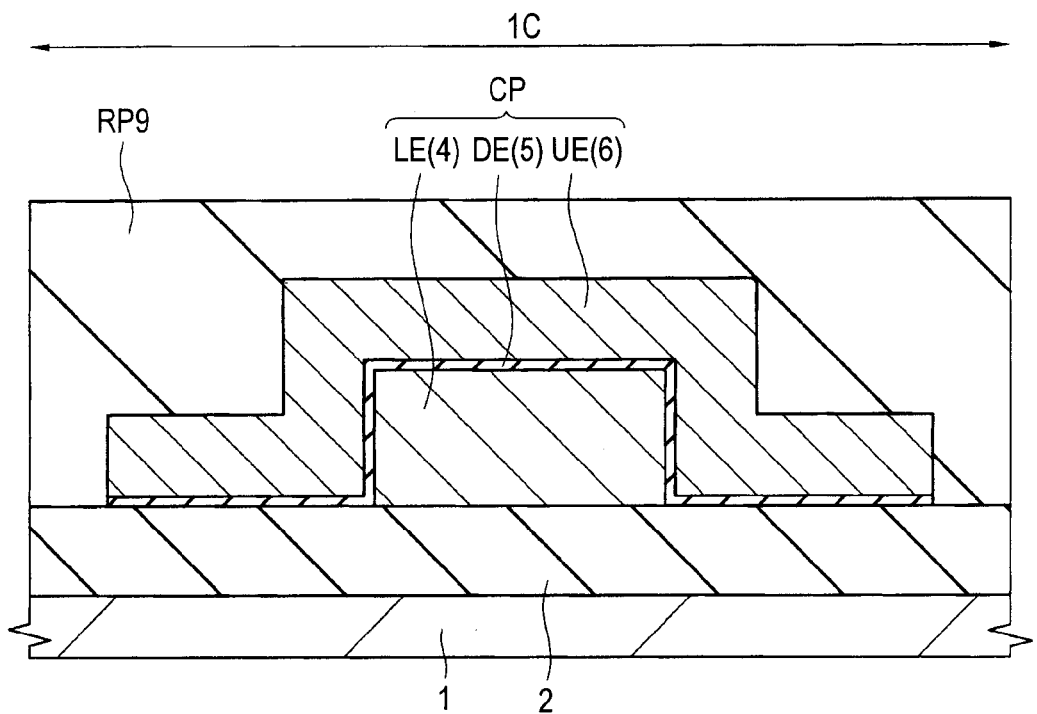
FIG. 71 is a cross-sectional view of a main part (capacitor formation region) of the same manufacturing step of the semiconductor device as that in FIG. 69.

Then, ion implantation is performed using the photoresist pattern RP8 as a mask (ion implantation blocking mask) (in step S21 shown in FIG. 10). In the ion implantation at step S21, n-type impurities (for example, arsenic (As) or phosphorous (P)) are introduced (implanted) into the semiconductor substrate 1 of the peripheral nMIS region 1D (p-type well PW2), whereby an n⁻-type semiconductor region 7c is formed as shown in FIG. 68. At this time, in the semiconductor substrate 1 (p-type well PW2) within the peripheral nMIS region 1D, the n⁻-type semiconductor region 7c is formed in self-alignment with the sidewall of the gate electrode GE1. This is because the gate electrode GE1 can serve as the ion implantation blocking mask. The n⁻-type semiconductor region 7c can serve as a part of the source/drain region of the n-channel MISFET formed in the peripheral nMIS region 1D.

In the ion implantation at step S21, the memory cell region 1A, the memory gate shunt region 1B, the capacitor formation region 1C, and the peripheral pMIS region 1E are covered with the photoresist pattern RP8. No impurities are ion-implanted into the semiconductor substrate 1 in these regions, the control gate electrode CG, the memory gate electrode MG, the contact MGa, the lower electrode LE, the upper electrode UE, and the gate electrode GE2. After the ion implantation process in step S21, the photoresist pattern RP8 is removed.

Then, as shown in FIGS. 69 to 72, a photoresist pattern RP9 is formed over the main surface of the semiconductor substrate as a mask layer (resist pattern for a mask) using the photolithography. The photoresist pattern RP9 is formed to cover the entire memory cell region 1A, the memory gate shunt region 1B, the entire capacitor formation region 1C, and the peripheral nMIS region 1D, and to expose the peripheral pMIS region 1E.

Figure 72:
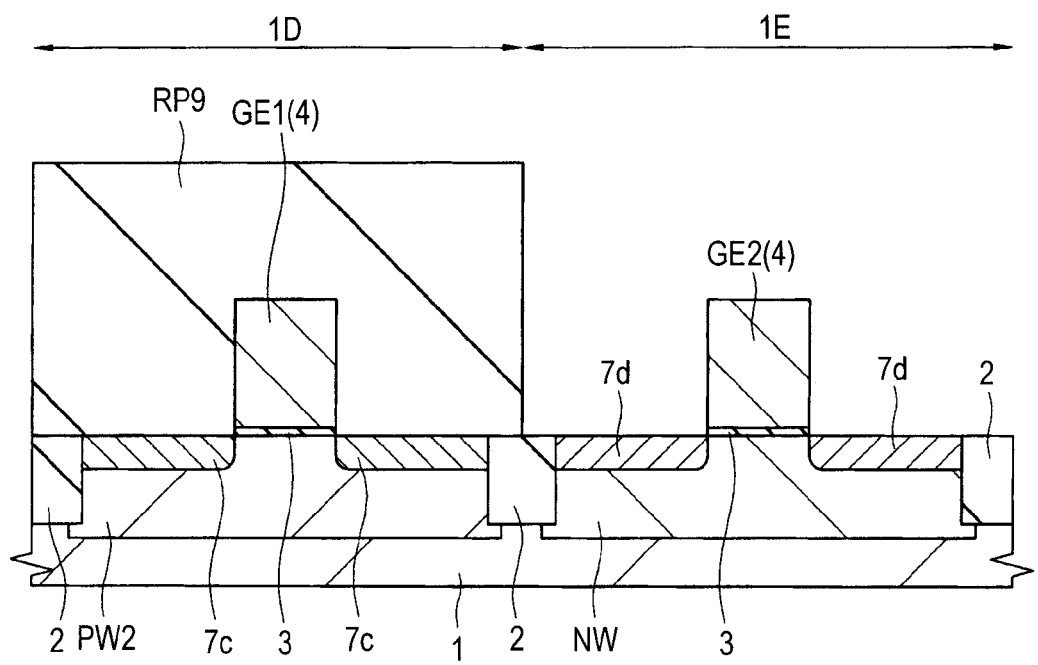
FIG. 72 is a cross-sectional view of a main part (peripheral nMIS region, peripheral pMIS region) of the same manufacturing step of the semiconductor device as that in FIG. 69.
Figure 73:
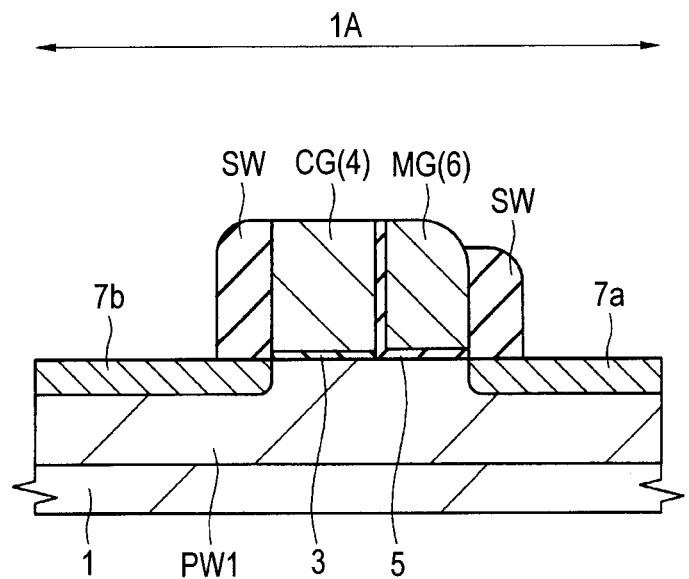
FIG. 73 is a cross-sectional view of a main part (memory cell region) of a manufacturing step of the semiconductor device, following the step shown in FIG. 69.

Then, ion implantation is performed using the photoresist pattern RP9 as a mask (ion implantation blocking mask) (in step S22 shown in FIG. 10). In the ion implantation at step S22, p-type impurities (for example, boron (B)) are introduced (implanted) into the semiconductor substrate 1 (n-type well NW) within the peripheral pMIS region 1E (n-type well NW) to thereby form the p$^-$-type semiconductor region 7d as shown in FIG. 72. At this time, the p$^-$-type semiconductor region 7d is formed in self-alignment with the sidewalls of the gate electrode GE2 in the semiconductor substrate 1 (n-type well NW) within the peripheral pMIS region 1E. This is because the gate electrode GE2 can serve as the ion implantation blocking mask. The p$^-$-type semiconductor region 7d can serve as a part of the source/drain region of a p-channel MISFET formed in the peripheral pMIS region 1E.

In the ion implantation at step S22, the memory cell region 1A, the memory gate shunt region 1B, the capacitor formation region 1C, and the peripheral nMIS region 1D are covered with the photoresist pattern RP9. No impurities are ion-implanted into the semiconductor substrate 1 in these regions, the control gate electrode CG, the memory gate electrode MG, the contact MGa, the lower electrode LE, the upper electrode UE, and the gate electrode GE1. After the ion implantation process in step S22, the photoresist pattern RP9 is removed.

Figure 74:
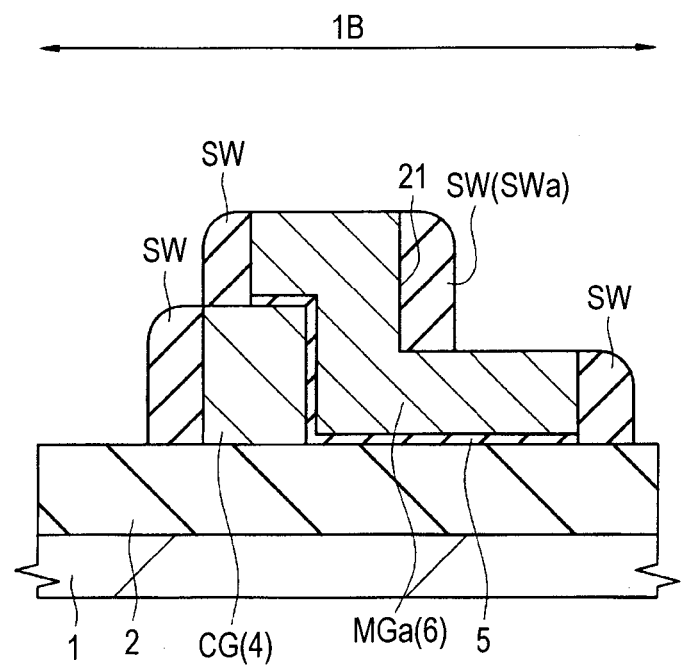
FIG. 74 is a cross-sectional view of a main part (memory gate shunt region) of the same manufacturing step of the semiconductor device as that in FIG. 73.
Figure 75:
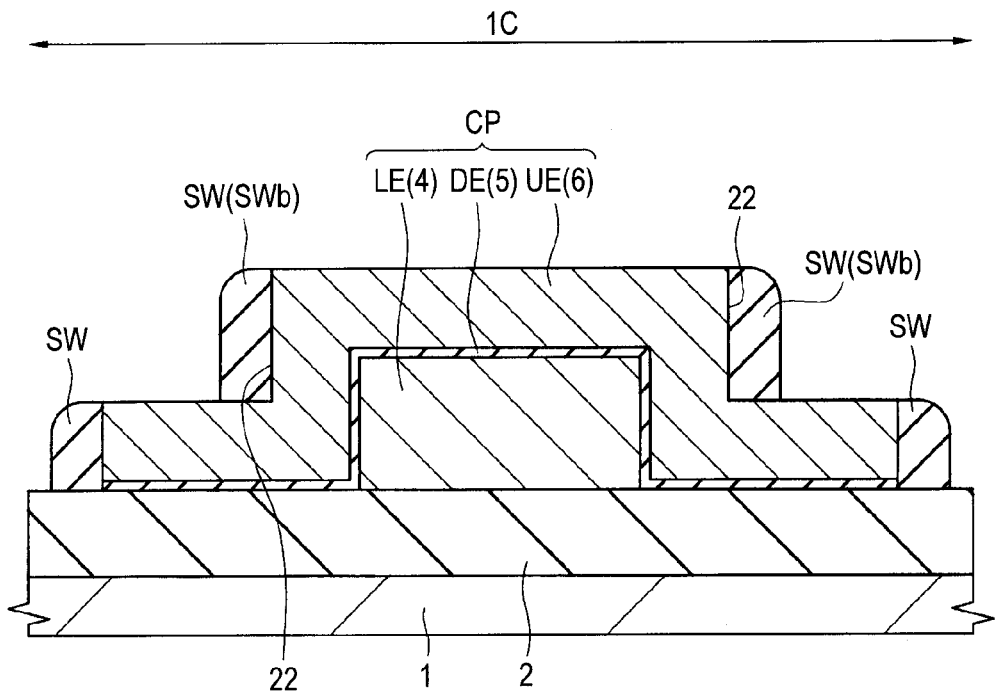
FIG. 75 is a cross-sectional view of a main part (capacitor formation region) of the same manufacturing step of the semiconductor device as that in FIG. 73.
Figure 76:
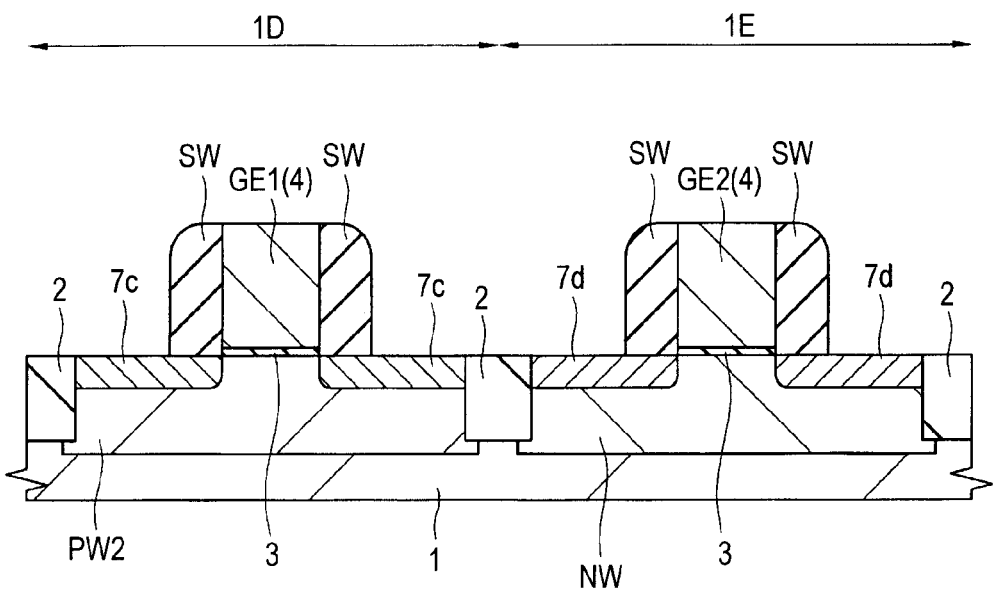
FIG. 76 is a cross-sectional view of a main part (peripheral nMIS region, peripheral pMIS region) of the same manufacturing step of the semiconductor device as that in FIG. 73.
Figure 77:
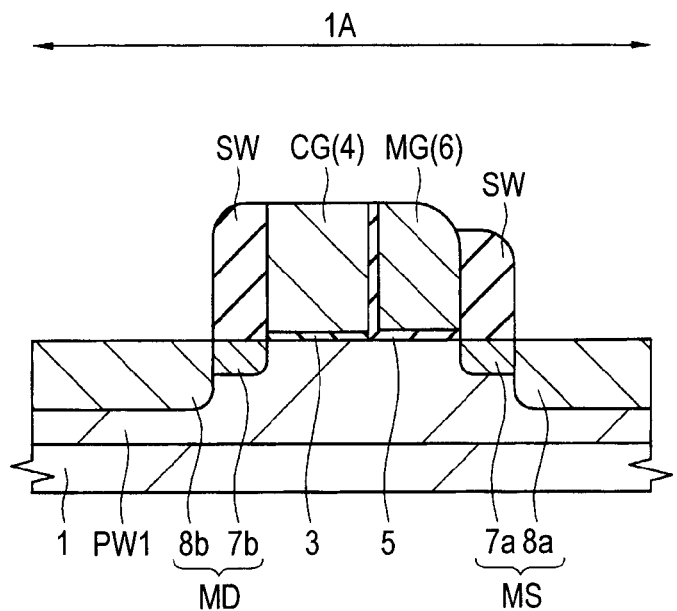
FIG. 77 is a cross-sectional view of a main part (memory cell region) of a manufacturing step of the semiconductor device, following the step shown in FIG. 73.
Figure 78:
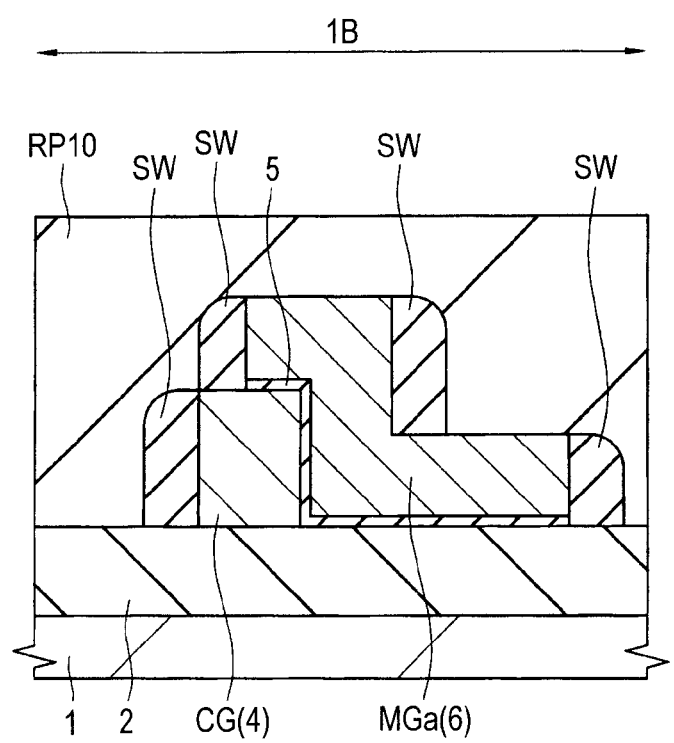
FIG. 78 is a cross-sectional view of a main part (memory gate shunt region) of the same manufacturing step of the semiconductor device as that in FIG. 77.
Figure 79:
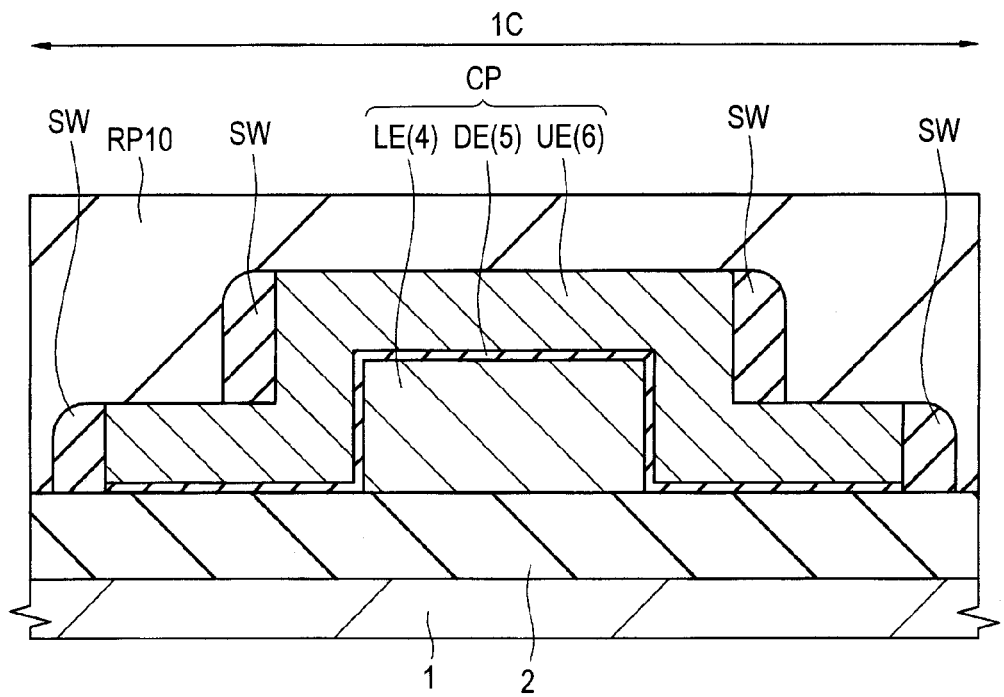
FIG. 79 is a cross-sectional view of a main part (capacitor formation region) of the same manufacturing step of the semiconductor device as that in FIG. 77.
Figure 80:
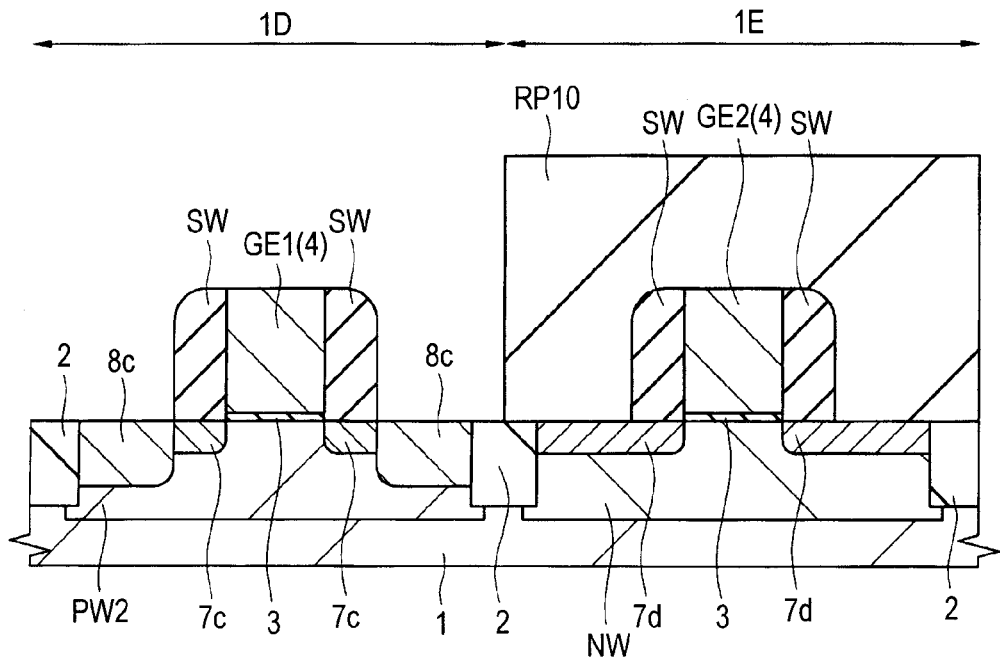
FIG. 80 is a cross-sectional view of a main part (peripheral nMIS region, peripheral pMIS region) of the same manufacturing step of the semiconductor device as that in FIG. 77.
Figure 81:
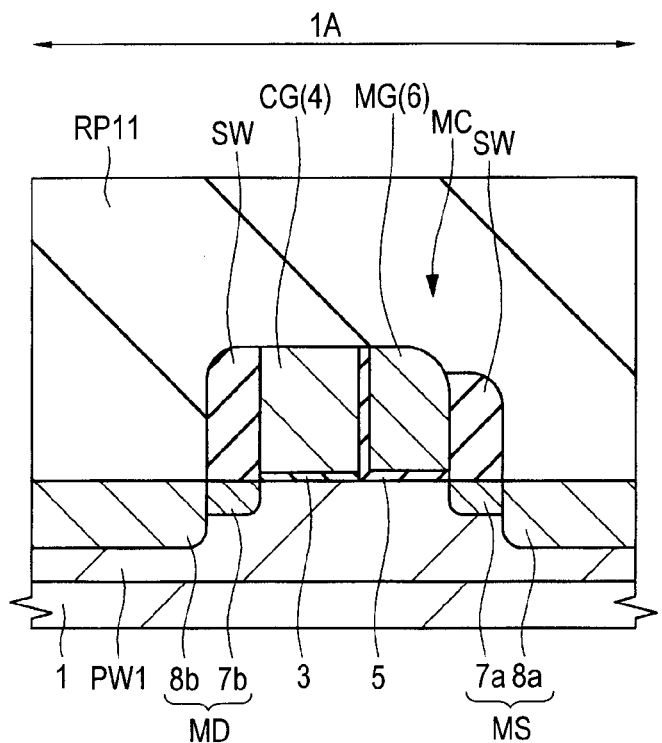
FIG. 81 is a cross-sectional view of a main part (memory cell region) of a manufacturing step of the semiconductor device, following the step shown in FIG. 77.
Figure 82:
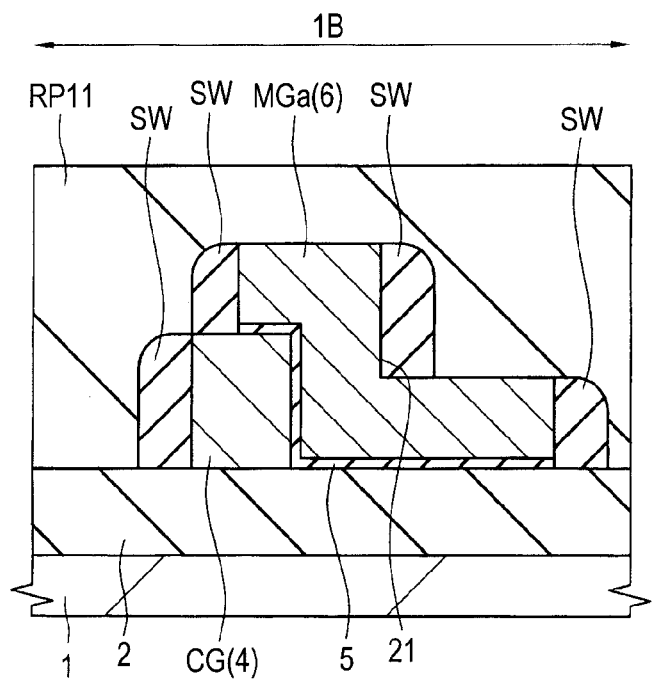
FIG. 82 is a cross-sectional view of a main part (memory gate shunt region) of the same manufacturing step of the semiconductor device as that in FIG. 81.
Figure 83:
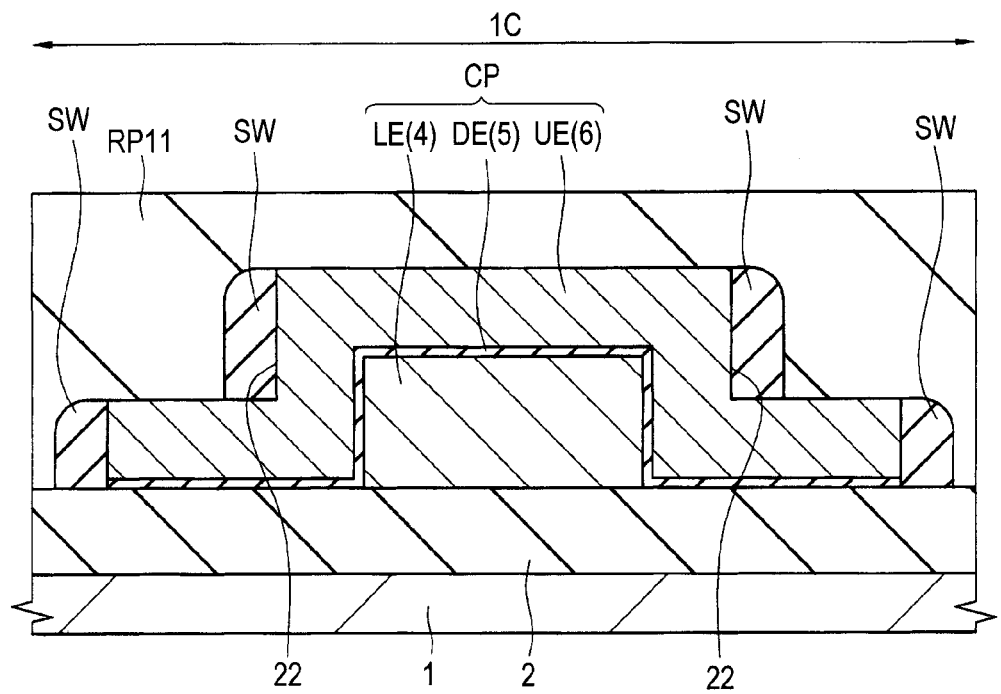
FIG. 83 is a cross-sectional view of a main part (capacitor formation region) of the same manufacturing step of the semiconductor device as that in FIG. 81.
Figure 84:
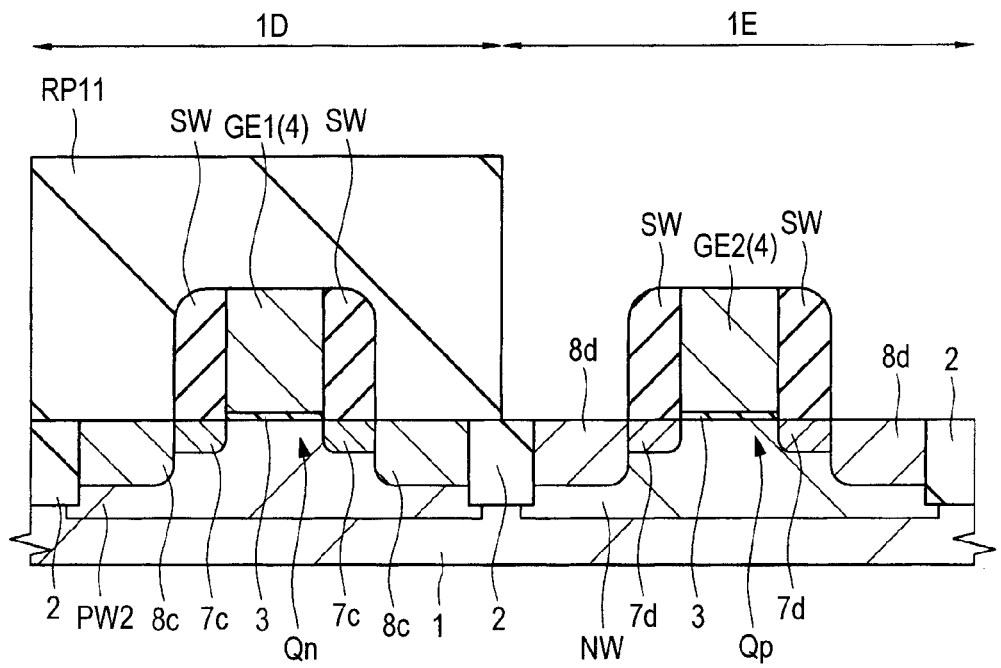
FIG. 84 is a cross-sectional view of a main part (peripheral nMIS region, peripheral pMIS region) of the same manufacturing step of the semiconductor device as that in FIG. 81.
Figure 85:
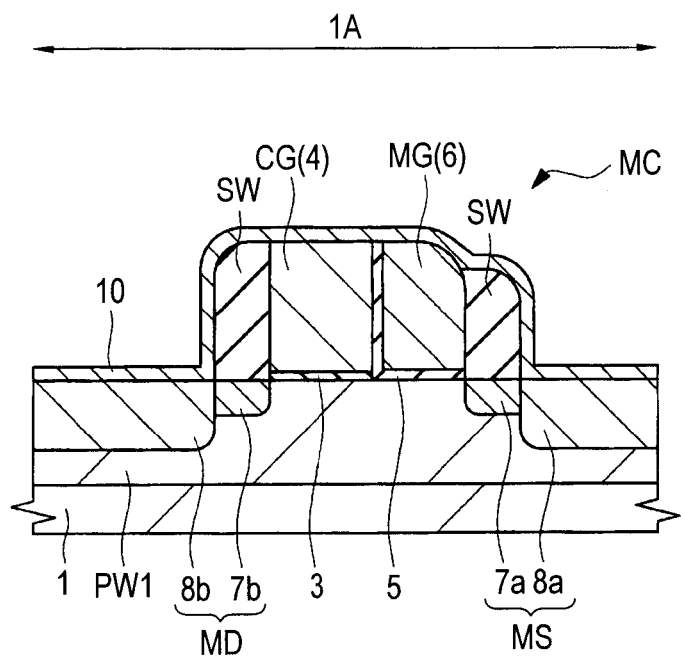
FIG. 85 is a cross-sectional view of a main part (memory cell region) of a manufacturing step of the semiconductor device, following the step shown in FIG. 81.
Figure 86:
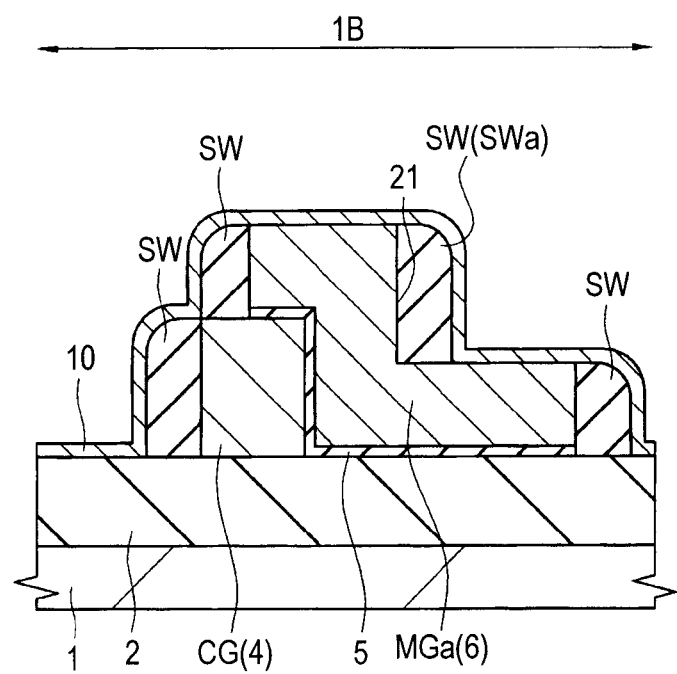
FIG. 86 is a cross-sectional view of a main part (memory gate shunt region) of the same manufacturing step of the semiconductor device as that in FIG. 85.
Figure 87:
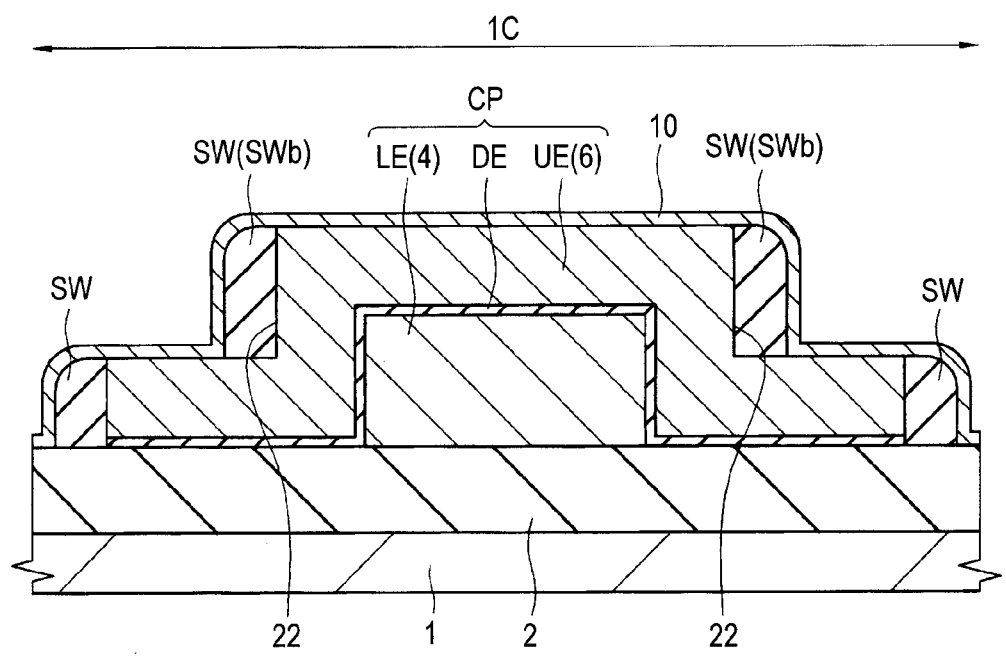
FIG. 87 is a cross-sectional view of a main part (capacitor formation region) of the same manufacturing step of the semiconductor device as that in FIG. 85.
Figure 88:
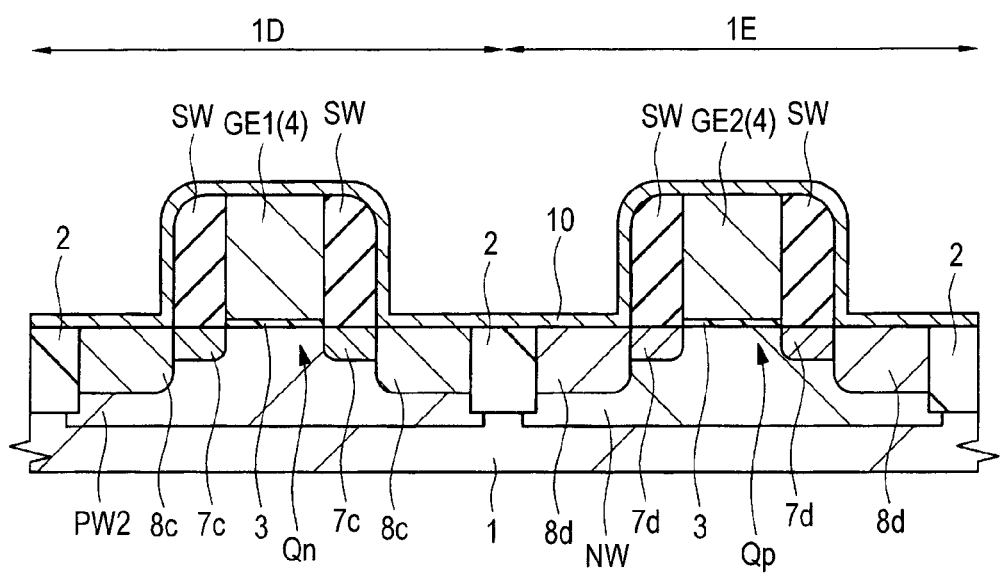
FIG. 88 is a cross-sectional view of a main part (peripheral nMIS region, peripheral pMIS region) of the same manufacturing step of the semiconductor device as that in FIG. 85.
Figure 89:
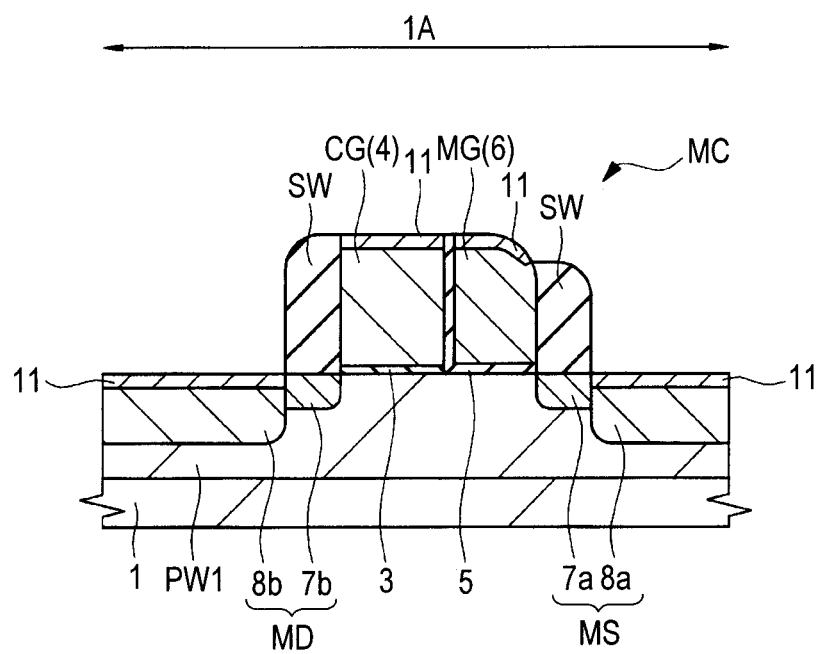
FIG. 89 is a cross-sectional view of a main part (memory cell region) of a manufacturing step of the semiconductor device, following the step shown in FIG. 85.
Figure 90:
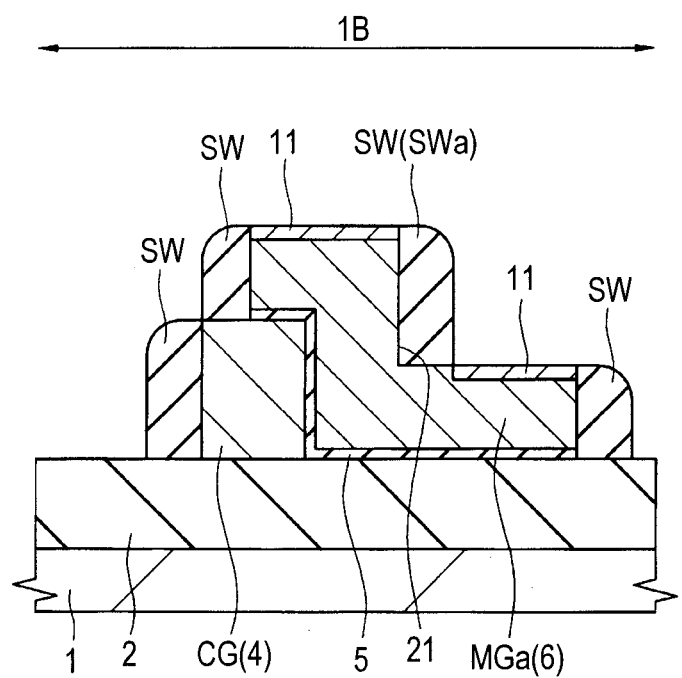
FIG. 90 is a cross-sectional view of a main part (memory gate shunt region) of the same manufacturing step of the semiconductor device as that in FIG. 89.
Figure 91:
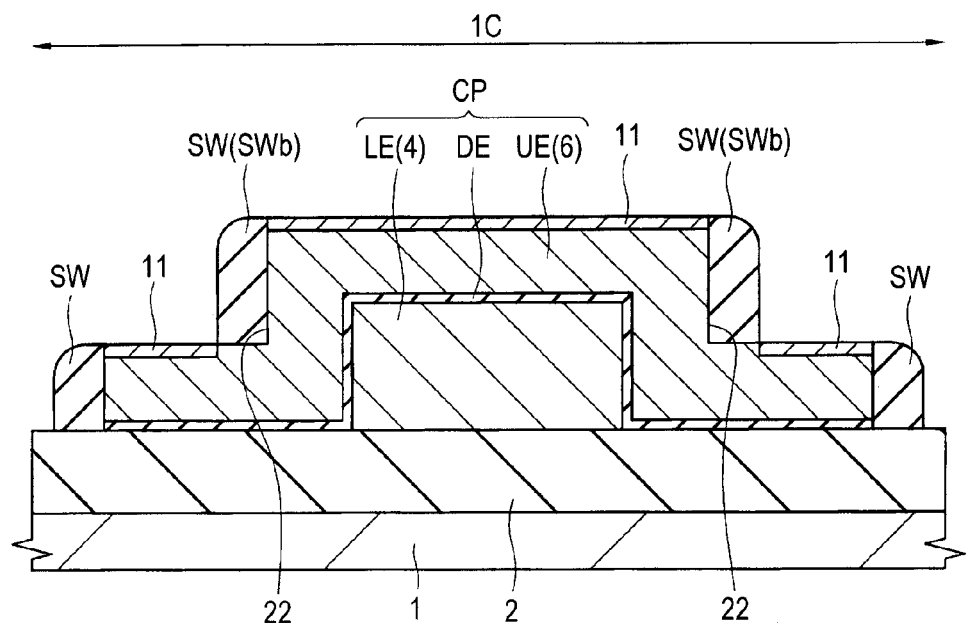
FIG. 91 is a cross-sectional view of a main part (capacitor formation region) of the same manufacturing step of the semiconductor device as that in FIG. 89.
Figure 92:
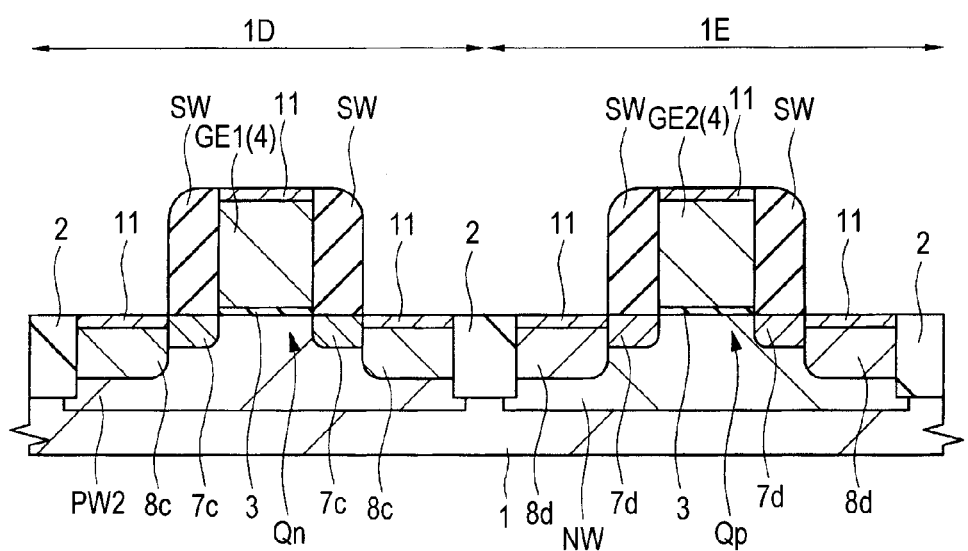
FIG. 92 is a cross-sectional view of a main part (peripheral nMIS region, peripheral pMIS region) of the same manufacturing step of the semiconductor device as that in FIG. 89.

Then, as shown in FIGS. 73 to 76, sidewall insulating films (sidewalls, sidewall spacers) SW are formed of an insulator, for example, silicon oxide, over the sidewall (sidewall opposite to the side on which both the electrodes are adjacent to each other via the insulating film 5) of each of the control gate electrode CG and the memory gate electrode MG, and over the sidewalls of the gate electrodes GE1 and GE2 (in step S23 shown in FIG. 10). For example, an insulating film, such as a silicon oxide film, is deposited over the entire main surface of the semiconductor substrate 1, and then subjected to the anisotropic etching (etched back). As a result, the insulating film can be selectively left over the sidewall of each of the control gate electrode CG and the memory gate electrode MG (over the sidewall opposite to the side on which the electrodes are adjacent to each other via the insulating film 5) and over the sidewall of the gate electrodes GE1 and GE2 to form the sidewall insulating film SW. As shown in FIG. 75, the sidewall insulating films SW can be formed over the sidewalls (side) of the upper electrode UE. Although not shown, the sidewall insulating film SW can also be formed over the sidewall of the lower electrode LE not covered with the upper electrode UE.

Then, as shown in FIGS. 77 to 80, a photoresist pattern RP10 is formed over the main surface of the semiconductor substrate 1 as a mask layer (resist pattern for a mask) using the photolithography. The photoresist pattern RP10 is formed so as to cover the entire memory gate shunt region 1B, the entire capacitor formation region 1C, and the peripheral pMIS region 1E, and to expose the memory cell region 1A and the peripheral nMIS region 1D.

Then, ion implantation is performed using the photoresist pattern RP10 as a mask (ion implantation blocking mask) (in step S24 shown in FIG. 10). In step S24, n-type impurities (for example, arsenic (As) or phosphorus (P)) are ion-implanted. The dose amount in the ion implantation at step S24 can be set to, for example, about $1 \times 10^{15}/cm^2$.

In the ion implantation at step S24, n-type impurities are introduced (implanted) into the semiconductor substrate 1 (p-type well PW1) of the source and drain of the memory cell region 1A to thereby form n$^+$-type semiconductor regions (impurity diffusion layers) 8a and 8b having a high concentration of impurities. In the ion implantation at step S24, n-type impurities are introduced (implanted) by ion implantation into the semiconductor substrate 1 (p-type well PW2) within the peripheral nMIS region 1D to thereby form an n$^+$-type semiconductor region (impurity diffusion layer) 8c having a high concentration of impurities. The n$^+$-type semiconductor region 8a is formed in the semiconductor substrate 1 of the source in the memory cell region 1A (p-type well PW1), and the n$^-$-type semiconductor region 8b is formed in the semiconductor substrate 1 of the drain in the memory cell region 1A (p-type well PW1). At this time, in the semiconductor substrate 1 (p-type well PW1) of the memory cell region 1A, the n$^+$-type semiconductor region 8a is formed in self-alignment with the sidewall insulating film SW over the sidewall of the memory gate electrode MG (sidewall opposite to the side adjacent to the control gate electrode CG via the insulating film 5). The n$^+$-type semiconductor region 8b is formed in self-alignment with the sidewall insulating film SW on the sidewall of the control gate electrode CG (sidewall opposite to the side adjacent to the memory gate electrode MG via the insulating film 5). This is because in the ion implantation at step S24, the sidewall insulating films SW located at the control gate electrode CG, the memory gate electrode MG, and the sidewalls thereof can serve as the ion implantation blocking mask. In the semiconductor substrate 1 (p-type well PW2) of the peripheral nMIS region 1D, the n$^+$-type semiconductor region 8c is formed in self-alignment with the sidewall insulating film SW over the sidewall of the gate electrode GE1. This is because the gate electrode GE1 and the sidewall insulating film SW at the sidewall thereof can serve as the ion implantation blocking mask.

In the ion implantation at step S24, the memory gate shunt region 1B, the capacitor formation region 1C, and the peripheral pMIS region 1E are covered with the photoresist pattern RP10. No impurities are ion-implanted into the semiconductor substrate 1 in these regions, the gate electrode GE2, the lower electrode LE, the upper electrode UE, and the contact MGa. After the ion implantation process in step S24, the photoresist pattern RP10 is removed.

Then, as shown in FIGS. 81 to 84, a photoresist pattern RP11 is formed over the main surface of the semiconductor substrate as a mask layer (resist pattern for a mask) using the photolithography. The photoresist pattern RP11 is formed so as to cover the entire memory cell region 1A, the entire memory gate shunt region 1B, the entire capacitor formation region 1C, and the entire peripheral nMIS region 1D, and to expose the peripheral pMIS region 1E.

Then, ion implantation is performed using the photoresist pattern RP11 as a mask (ion implantation blocking mask) (in step S25 of FIG. 10). In step S25, p-type impurities (for example, boron (B)) are ion-implanted. In the ion implantation at step S25, p-type impurities are introduced (implanted) by ion implantation into the semiconductor substrate 1 (n-type well NW) within the peripheral pMIS region 1E to thereby form a p$^+$-type semiconductor region (impurity diffusion layer) 8d having a high concentration of impurities. At this time, the p$^+$-type semiconductor region 8d is formed in self-alignment with the sidewall insulating film SW at the sidewall of the gate electrode GE2 in the semiconductor substrate 1 within the peripheral pMIS region 1E (n-type well NW). This is because the gate electrode GE2 and the sidewall insulating film SW over the sidewall thereof can serve as the ion implantation blocking mask.

In the ion implantation at step S25, the memory cell region 1A, the memory gate shunt region 1B, the capacitor formation region 1C, and the peripheral nMIS region 1D are covered with the photoresist pattern RP11. No impurities are ion-implanted into the semiconductor substrate 1 in these regions, the control gate electrode CG, the memory gate electrode MG, the gate electrode GE1, the lower electrode LE, the upper electrode UE, and the contact MGa. After the ion implantation process in step S25, the photoresist pattern RP11 is removed.

Although the $n^+$-type semiconductor region 8a, the $n^+$-type semiconductor region 8b, and the $n^+$-type semiconductor region 8c are formed in the same ion implantation step (ion implantation process in step S24), the invention is not limited thereto. Alternatively, the $n^+$-type semiconductor region 8a, the $n^+$-type semiconductor region 8b, and the $n^+$-type semiconductor region 8c can be formed in different ion implantation steps.

In the memory cell region 1A, the $n^-$-type semiconductor region 7a and the $n^+$-type semiconductor region 8a having a higher concentration of impurities than that of the region 7a form the n-type semiconductor region MS serving as a source region of the memory transistor (having a LDD structure). The $n^-$-type semiconductor region 7b and the $n^+$-type semiconductor region 8b having a higher concentration of impurities than that of the region 7b form the n-type semiconductor region MD serving as a drain region of the control transistor (selection transistor) (having a LDD structure). In the peripheral nMIS region 1D, the $n^-$-type semiconductor region 7c and the $n^+$-type semiconductor region 8c having a higher concentration of impurities than that of the region 7c form source and drain regions of the LDD structure of the n-channel MISFET. In the peripheral pMIS region 1E, the $p^-$-type semiconductor region 7d and the $p^+$-type semiconductor region 8d having a higher concentration of impurities than that of the region 7d form source and drain regions of the LDD structure of the p-channel MISFET.

Then, activation annealing is performed to activate the impurities introduced into the semiconductor regions for the source and drain (the $n^-$-type semiconductor regions 7a, 7b, and 7c, the type semiconductor region 7d, the $n^+$-type semiconductor regions 8a, 8b, and 8c, and the $p^+$-type semiconductor region 8d) (in step S26 of FIG. 10).

In this way, the memory cell MC of the nonvolatile memory is formed in the memory cell region 1A, and the capacitive element CP is formed in the capacitor formation region 1C. The n-channel MISFETQn is formed in the peripheral nMIS region 1D. The p-channel MISFETQp is formed in the peripheral pMIS region 1E.

In this stage, each of the concentration of impurities of the upper electrode UE (silicon film 6 included therein) in the capacitor formation region 1C and the concentration of impurities of the contact MGa (silicon film 6 included therein) in the memory gate shunt region 1B is higher than that of the memory gate electrode (silicon film 6 included therein) in the memory cell region 1A. The relationship in concentration of impurities between these components is also maintained even in the manufactured semiconductor device.

Then, a self aligned silicide (salicide) process is performed to form a metal silicide layer 11. First, if necessary, the etching is performed (using, for example, wet etching using diluted hydrofluoric acid or the like). This process cleans (exposes) the upper surfaces (surfaces) of the $n^+$-type semiconductor regions 8a, 8b, and 8c, and the $p^+$-type semiconductor region 8d, the upper surface of the control gate electrode CG, the upper surface (part not covered with the sidewall insulating film SW) of the memory gate electrode MG, the upper surface of the upper electrode UE (part not covered with the sidewall insulating film SW), and the upper surface of the lower electrode LE (part not covered with the capacity insulating film DE and the upper electrode UE). The etching at this time can be such light etching as to remove the natural oxide film.

Then, as shown in FIGS. 85 to 88, a metal film 10 is formed (deposited) over the entire main surface of the semiconductor substrate 1 including the upper surfaces (surfaces) of the control gate electrode CG, the memory gate electrode MG, the gate electrodes GE1 and GE2, the upper electrode UE, the $n^+$-type semiconductor regions 8a, 8b, and 8c, and the $p^+$-type semiconductor region 8d. Specifically, the metal film 10 is formed so as to cover the control gate electrode CG, the memory gate electrode MG, the gate electrodes GE1 and GE2, the upper electrode UE, and the sidewall insulating film SW. The metal film 10 is comprised of, for example, a cobalt (Co) film or a nickel (Ni) film, and can be formed using sputtering or the like.

Then, the heat treatment is applied to the semiconductor substrate 1, so that the metal film 10 is reacted with the upper layers (superficial layers) of the control gate electrode CG, the memory gate electrode MG, the gate electrodes GE1 and GE2, the upper electrode UE, the $n^+$-type semiconductor regions 8a, 8b, and 8c, and the $p^+$-type semiconductor region 8d. In this way, the metal silicide layer 11 which is a layer produced by the reaction between silicon and metal is formed over (at the upper surface, the surface, or the upper layer of) of each of the control gate electrode CG, the memory gate electrode MG, the gate electrodes GE1 and GE2, the upper electrode UE, the $n^+$-type semiconductor regions 8a, 8b, and 8c, and the $p^+$-type semiconductor region 8d. The metal silicide layer 11 can be, for example, a cobalt silicide layer (when the metal film 10 is a cobalt film), or a nickel silicide layer (when the metal film 10 is a nickel film). Thereafter, unreacted parts of the metal film 10 are removed. FIGS. 89 to 92 show cross-sectional views of this stage. Although not shown in the cross-sectional view of FIG. 91, the metal silicide layer 11 can be formed over regions of the upper surface of the lower electrode LE not covered with the laminated pattern of the upper electrode UE and the capacity insulating film DE.

In this way, as shown in FIGS. 89 to 92, the metal silicide layer (metal silicide film) 11 is formed over upper parts (upper surfaces, surfaces, or upper layers of) each of the control gate electrode CG, the memory gate electrode MG, the gate electrodes. GE1 and GE2, the $n^+$-type semiconductor regions 8a, 8b, 8c, the $p^+$-type semiconductor region 8d, and the upper electrode UE. The formation of the metal silicide layer 11 can reduce a resistance, such as a diffusion resistance or a contact resistance.

Then, as shown in FIGS. 93 to 96, an insulating film (interlayer insulating film) 12 is formed (deposited) as an interlayer insulating film over the entire main surface of the semiconductor substrate 1 so as to cover the control gate electrode CG, the memory gate electrode MG, the gate electrodes GE1 and GE2, the lower electrode LE, the upper electrode UE, and the sidewall insulating film SW. The insulating film 12 is comprised of a single film of a silicon oxide film, or a laminated film comprised of a silicon nitride film and a silicon oxide film which is formed over the silicon nitride film and which is thicker than that of the silicon nitride film. The insulating film 12 can be formed, for example, using a CVD method or the like. After forming the insulating film 12, the upper surface of the insulating film 12 is flattened using a chemical mechanical polishing (CMP) method or the like if necessary.

Then, the insulating film 12 is dry-etched using a photoresist pattern (not shown) formed over the insulating film 12 as an etching mask by the photolithography to thereby form contact holes (openings, through holes) CNT in the insulating film 12.

Then, a conductive plug PG is formed of tungsten (W) or the like as a conductor (conductor for connection) in each contact hole CNT.

In order to form the plug PG, for example, a barrier conductive film is formed over the insulating film 12 containing the inside (the bottom and sidewalls) of the contact hole CNT. The barrier conductive film can be, for example, a titanium film, a titanium nitride film, or a laminated film thereof. Then, a main conductive film comprised of the tungsten film or the like is formed over the barrier conductive film to be embedded in the contact hole CNT. Unnecessary parts of the main conductive film and the barrier conductive film over the insulating film 12 are removed by the CMP method or etching back method to thereby form plugs PG. For simplifying the drawings, the barrier conductive film included in the plug PG and the main conductive film are integrally illustrated as shown in FIGS. 93 to 96.

The contact hole CNT and the plug PG embedded therein are, formed above the $n^+$-type semiconductor region 8a, 8b, and 8c, the $p^+$-type semiconductor region 8d, the control gate electrode CG, the memory gate electrode MG, the lower electrode LE, and the upper surface of the upper surface electrode UE. At the bottom of each contact hole CNT, a part of the main surface of the semiconductor substrate 1 is exposed. For example, there are exposed parts of the n+-type semiconductor regions 8a, 8b, and 8c and the $p^+$-type semiconductor region 8d (metal silicide layer 11 thereover), parts of the control gate electrode CG and the memory gate electrode MG (metal silicide layer 11 over the surfaces thereof), parts of the gate electrodes GE1 and GE2 (metal silicide layer 11 thereover), and parts of the lower electrode LE and the upper electrode UE (metal silicide layer 11 thereover).

Figure 93:
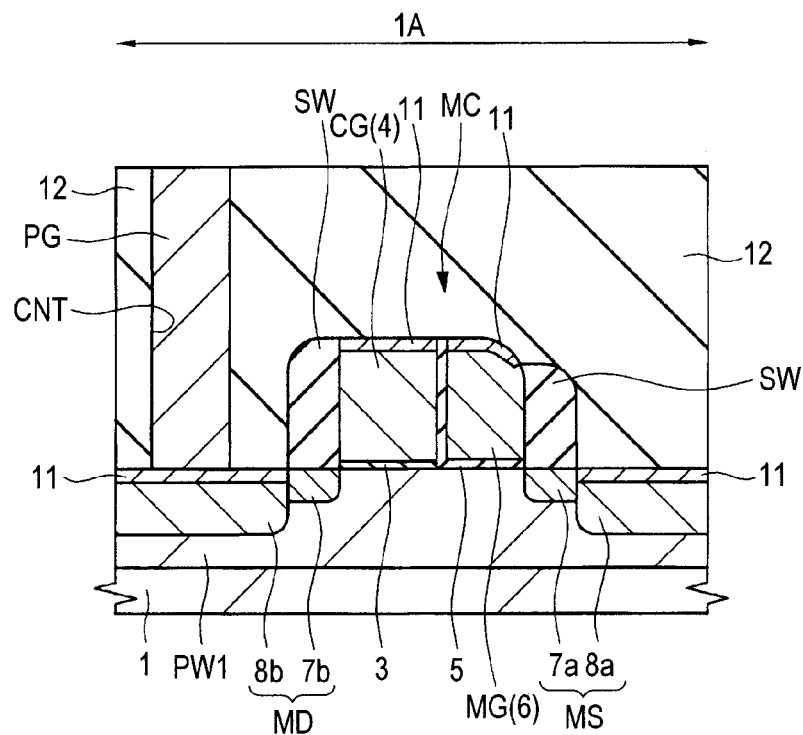
FIG. 93 is a cross-sectional view of a main part (memory cell region) of a manufacturing step of the semiconductor device, following the step shown in FIG. 89.
Figure 94:
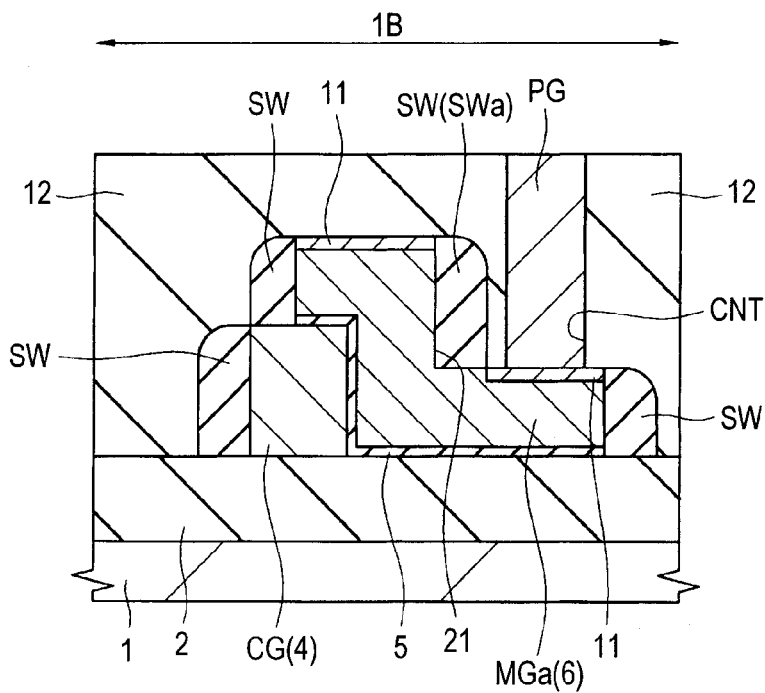
FIG. 94 is a cross-sectional view of a main part (memory gate shunt region) of the same manufacturing step of the semiconductor device as that in FIG. 93.
Figure 95:
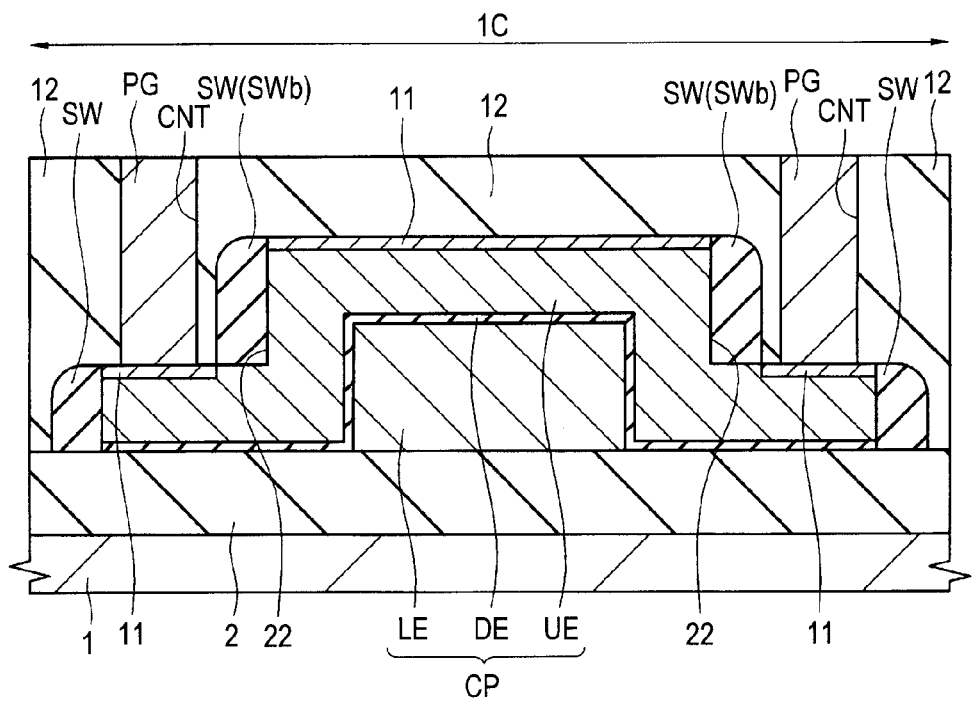
FIG. 95 is a cross-sectional view of a main part (capacitor formation region) of the same manufacturing step of the semiconductor device as that in FIG. 93.
Figure 96:
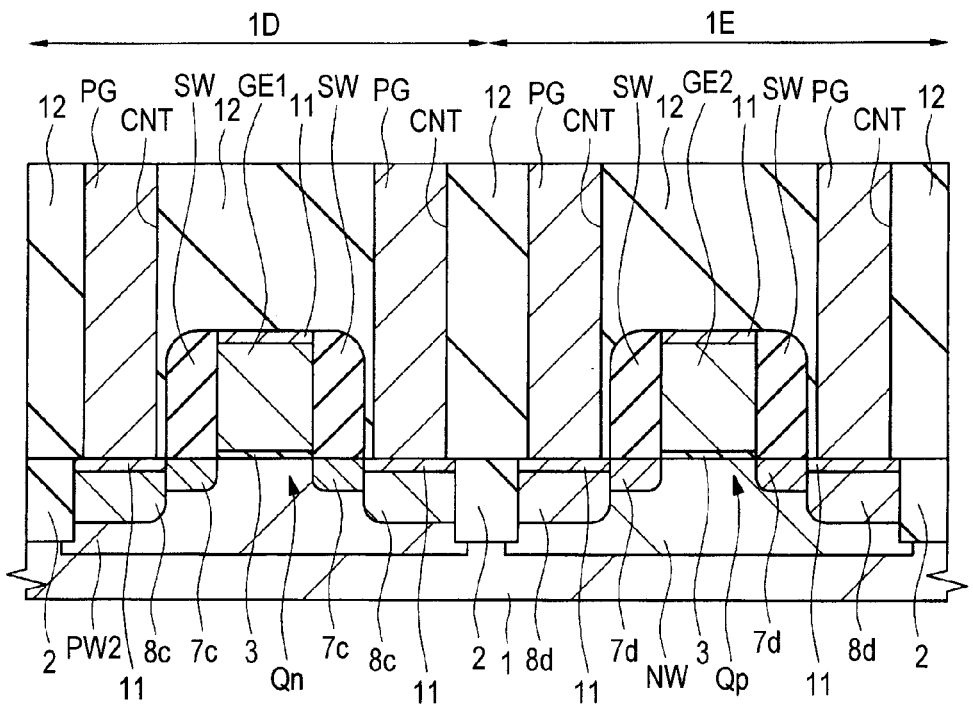
FIG. 96 is a cross-sectional view of a main part (peripheral nMIS region, peripheral pMIS region) of the same manufacturing step of the semiconductor device as that in FIG. 93.

As shown in the cross-sectional view of FIG. 93, a part of the $n^+$-type semiconductor region 8b (metal silicide layer 11 over its surface) is exposed at the bottom of the contact hole CNT, and electrically coupled to the plug PG filling the contact hole CNT. As shown in the cross-sectional view of FIG. 94, the contact MGa of the memory gate electrode MG (metal silicide layer 11 over the surface thereof) is exposed at the bottom of the contact hole CNT, and electrically coupled to the plug PG filling the contact hole CNT1. As shown in the cross-sectional view of FIG. 95, a part of the upper electrode UE (metal silicide layer 11 over the surface thereof) is exposed at the bottom of the contact hole CNT to be electrically coupled to the plug PG filling the contact hole CNT. As shown in the cross-sectional view of FIG. 96, a part of the $n^+$-type semiconductor region 8c (metal silicide layer 11 over the surface thereof) is exposed at the bottom of the contact hole CNT to be electrically coupled to the plug PG filling the contact hole CNT. A part of the $p^+$-type semiconductor region 8c (metal silicide layer 11 over the surface thereof) is exposed at the bottom of the contact hole CNT to be electrically coupled to the plug PG filling the contact hole CNT.

Then, as shown in FIGS. 1 to 3, and FIG. 97, the wirings (wiring layers) M1 are formed over the insulating film 12 with the plugs PG embedded therein. Now, the formation of the wiring M1 using the damascene technique (single damascene technique) will be described below.

First, an insulating film (interlayer insulating film) 14 is formed over the insulating film 12 with the plugs PG embedded therein, and then wiring trenches (trenches into which the wirings M1 are embedded in the insulating film 14) are formed in the insulating film 14 by photolithography and dry etching. A barrier conductive film (for example, a titanium nitride film, a tantalum film, a tantalum nitride film, or the like) is formed over the main surface of the semiconductor substrate 1 (that is, the insulating film 14 including the bottom and sidewalls of the wiring trenches). Subsequently, a copper seed layer is formed over the barrier conductive film by the CVD method or sputtering method. Further, another copper plating film is formed over the seed layer using an electrolytic plating method or the like to fill in the inside of the wiring trenches. Thereafter, parts of the copper plating film, the seed layer, and the barrier metal film located in regions other than the wiring trenches are removed by the CMP method to thereby form a first layer wiring M1 comprised of copper as a main conductive material. The wirings M1 are embedded in the wiring trenches of the insulating film 14. For simplifying the drawings, FIGS. 1 and 3 and FIG. 97 show the copper plating film included in the wiring M1, the seed layer, and the barrier conductive film which are integral with each other.

The wirings M1 are electrically coupled to the source region (semiconductor region MS) of the memory transistor, the drain region (semiconductor region MD) of the control transistor, the control gate electrode CG, the memory gate electrode MG (contact MGa thereof), the upper electrode UE, the lower electrode LE, the gate electrodes GE1 and GE2, source and drain regions of the n-channel MISFETQn and the p-channel MISFET, and the like.

Thereafter, second or later wirings are formed by the dual damascene method or the like, and the illustration and description thereof will be omitted below. The wiring M1 and other wirings located above the wiring M1 are not limited to damascene wirings (embedded wirings), and thus can be formed by patterning a conductive film for wiring, and thus, can be, for example, a tungsten wiring or an aluminum wiring.

Now, the main features and effects of this embodiment will be described in more detail below.

In this embodiment, the nonvolatile memory (memory cell MC thereof) and the capacitive element CP are formed (mixed) over the same semiconductor substrate 1. The lower electrode LE of the capacitive element CP is formed in the same layer of the silicon film 4 as that of the control gate electrode CG. The capacity insulating film DE of the capacitive element CP is formed in the same layer of the insulating film 5 as that of the memory gate insulating film (insulating film 5 in the memory cell region 1A) of the memory transistor. The upper electrode UE of the capacitive element CP is formed of the same layer of the silicon film 6 as that of the memory gate electrode MG. This embodiment can easily and accurately manufacture the semiconductor device on which the combination of the nonvolatile memory (memory cell MC thereof) and the capacitive element CP is mounted, and thus can simplify the manufacturing process of the semiconductor device and can reduce the number of manufacturing steps.

In this embodiment, the memory gate electrode MG, the contact MGa, and the upper electrode UE are formed of the same layer of the silicon film 6, but the concentrations of impurities of these components are not the same. Specifically, the concentration of impurities in the upper electrode UE (silicon film 6 included therein) of the capacitor formation region 1C is higher than that of the memory gate electrode MG (silicon film 6 included therein) in the memory cell region 1A. The concentration of impurities of the contact MGa (silicon film 6 included therein) is higher than that of the memory gate electrode MG (silicon film 6 included therein) in the memory cell region 1A. In other words, the concentration of impurities in the memory gate electrode MG (silicon film 6 included therein) of the memory cell region 1A is lower than that of the upper electrode UE (silicon film 6 included therein) in the capacitor formation region 1C. The concentration of impurities of the memory gate electrode MG (silicon film 6 included therein) of the memory cell region 1A is lower than that of the impurities of the contact MGa (silicon film 6 included therein). Due to a difference in concentration of impurities, the resistance of the upper electrode UE (silicon film 6 included therein) in the capacitor formation region 1C is lower than that of the memory gate electrode MG (silicon film 6 included therein) in the memory cell region 1A. The resistance of the contact MGa (silicon film 6 included therein) is lower than that of the memory gate electrode MG (silicon film 6 included therein) in the memory cell region 1A.

That is, the silicon film 6 included in the memory gate electrode MG is preferably a low impurity concentration or a non-doped silicon film. In contrast, the silicon film 6 included in the upper electrode UE and the silicon film 6 included in the contact MGa are preferably a high impurity concentration silicon film.

The reason for this arrangement will be described below. In the memory cell region 1A, the concentration of impurities of the silicon film 6 included in the memory gate electrode MG is desirably low from the viewpoint of characteristics of the memory element. This is based on the following reason. The memory gate electrode MG whose concentration of impurities is small has a depleted region adjacent to the insulating film 5, and thus the electric field of the region in the memory gate electrode MG near the insulating film 5 during holding the charges is released. This arrangement makes it difficult for the charges to move from the charge storing layer (corresponding to the silicon nitride film 5b) to the memory gate electrode MG, and can suppress the phenomenon of reversion of data, which is advantageous from the viewpoint of data hold (data retention).

Thus, the silicon film 6 included in the memory gate electrode MG of the memory cell MC can be formed of a non-doped or a low impurity concentration silicon film to thereby improve the data hold characteristics of the nonvolatile memory.

In contrast, in the capacitor formation region 1C, the electrode of the capacitive element preferably has a low resistance, and the silicon film 6 included in the upper electrode UE of the capacitive element CP desirably has a high concentration of impurities, and a low resistance. When the upper electrode UE of the capacitive element CP has a low concentration of impurity, or is non-doped, the region of the upper electrode UE adjacent to the capacity insulating film DE becomes depleted. The depletion will decrease the capacity of the capacitive element CP (or increase the dependence of capacity on the voltage). From this viewpoint, the silicon film 6 included in the upper electrode UE of the capacitive element CP desirably has a high concentration of impurities.

The silicon film 6 included in the upper electrode UE of the capacitive element CP is comprised of a silicon film having a high concentration of impurities, which can suppress or prevent the unstable state of the capacity to make the C-V characteristics of the capacitive element CP flat (or to decrease the dependence on capacity of the voltage), and also decrease the resistance of the upper electrode UE. Thus, the characteristics of the capacitive element CP can be improved, and also the performance of the semiconductor device with the capacitive element CP can be improved.

That is, the concentration of impurities of the upper electrode UE is made high, while the concentration of impurities of the memory gate electrode MG included in the memory cell MC is made low, which is very important for improving the total performance of the semiconductor device with the combination of the nonvolatile memory (memory cell MC thereof) and the capacitive element CP. Unlike this embodiment, in a case where the concentration of impurities of the upper electrode UE is the same as that of the impurities of the memory gate electrode MG, when both concentrations are made low, the characteristics of the capacitive element CP is decreased. When both concentrations are made high, the data hold characteristics of the nonvolatile memory is difficult to improve. The improvement of the performance of the semiconductor device with the combination of the nonvolatile memory and the capacitive element CP is restricted.

In contrast, in this embodiment, the concentration of impurities of the upper electrode UE (silicon film 6 included therein) in the capacitor formation region 1C is higher than that of the memory gate electrode MG (silicon film 6 included therein) in the memory cell region 1A, which can improve both the data hold characteristics of the nonvolatile memory and the characteristics of the capacitive element CP. This embodiment can improve the performance (characteristics) of the semiconductor device including the nonvolatile memory and the capacitive element. This embodiment will be compared with the related art case in which the concentration of impurities of the upper electrode UE in the capacitor formation region 1C is the same as that of the memory gate electrode MG in the memory cell region 1A. In this embodiment, the former is larger than the latter (in other words, the latter is smaller than the former). This embodiment can improve the data hold characteristics of the nonvolatile memory because of the low concentration of impurities of the memory gate electrode MG in the memory cell region 1A, and can also improve the characteristics of the capacitive element CP because of the high concentration of impurities of the upper electrode UE.

From the viewpoint of improving the data hold characteristics of the nonvolatile memory, the memory gate electrode MG (silicon film 6 included therein) is desirably non-doped or has a low concentration of impurities. More preferably, for the concentration of impurities of the memory gate electrode MG (silicon film 6 included therein) of equal to or less than $1 \times 10^{19}/cm^3$, the data hold characteristics of the nonvolatile memory can be more surely improved.

In order to improve the characteristics (C-V characteristics) of the capacitive element CP and reducing the resistance of the upper electrode UE, the concentration of impurities of the upper electrode UE (silicon film 6 included therein) is preferably high. More preferably, for the concentration of impurities of the upper gate electrode UE (silicon film 6 included therein) of equal to or more than $1 \times 10^{20}/cm^3$, the C-V characteristics of the nonvolatile memory CP can be more surely improved. Further, the upper electrode UE can more surely have a low resistance.

When forming a memory cell array (memory cells MC arranged in the array), the memory gate electrode MG preferably has the metal silicide layer 11 formed thereover because the metal silicide layer also serves as a long wiring (wiring for coupling the memory gate electrodes of the memory cells). Thus, the memory gate electrode MG (silicon film 6 included therein) is non-doped or has a low concentration of impurities in order to improve the data hold characteristics of the nonvolatile memory (in this case, the resistance of the silicon film 6 included in the memory gate electrode MG becomes high). In such a case, the metal silicide layer 11 over the memory gate electrode MG can serve as the wiring. This arrangement can reduce the resistance of the memory gate electrode MG, and thus improve the operation speed of the nonvolatile memory.

As can be seen from FIG. 74, however, the sidewall insulating film SW (hereinafter referred to as a sidewall insulating film SWa) is formed over each sidewall (side) 21 of a stepped portion of the contact MGa because of the existence of a stepped portion. As can be seen from FIGS. 86 and 90, even if the metal silicide layer 11 is formed above the memory gate electrode MG by salicide technique, the metal silicide layer 11 formed over the contact MGa is separated into parts, so that no metal layer 11 is formed over the sidewall 21 at the stepped portion of the contact MGa and under the sidewall insulating film SWa. Thus, when the contact MGa (silicon film 6 included therein) also has the same concentration of impurities as that of the memory gate electrode MG in a case where the memory gate electrode MG (silicon film 6 included therein) is a low-impurity-concentration or non-doped silicon film, the following phenomena will be caused. Specifically, a high resistance region which does not obtain the effect of decreasing the resistance and which does not include the metal silicide layer 11 is generated in the contact MGa after the formation process of the metal silicide layer 11 by the salicide technique. In the contact MGa, the high-resistance region can be generated in a region adjacent to the control gate electrode CG via the insulating film 5. The memory gate electrode MG except for the contact MGa is formed in the form of sidewall spacer via the insulating film 5 at the sidewall of the control gate electrode CG. The sidewall spacer-like memory gate electrode MG is integrally coupled to the high-resistance region of the contact MGa. The existence of the high-resistance region in the contact MGa increases the resistance of the memory gate electrode MG. This possibly decreases the performance of the semiconductor device with the nonvolatile memory (for example, the operating speed of the nonvolatile memory).

In contrast, in this embodiment, the concentration of impurities of the contact MGa (silicon film 6 included therein) is higher than that of the memory gate electrode MG (silicon film 6 included therein) in the memory cell region 1A. Due to a difference in concentration of impurities, the resistance of the contact MGa (silicon film 6 included therein) is lower than that of the memory gate electrode MG (silicon film 6 included therein) in the memory cell region 1A. That is, even when the concentration of impurities of the memory gate electrode MG (silicon film 6 included therein) in the memory cell region 1A is decreased in order to improve the data hold characteristics of the nonvolatile memory, the resistance of the contact MGa can be decreased by increasing the concentration of impurities of the contact MGa (silicon film 6 included therein). Thus, in this embodiment, even when no metal silicide layer 11 is formed over the sidewall 21 at the stepped portion of the contact MGa and under the sidewall insulating film SWa, the resistance of the contact MGa (silicon film 6 included therein) itself can be made low, which can suppress or prevent the generation of the high-resistance region in the contact MGa. This embodiment can suppress or prevent the generation of the high-resistance part in the memory gate electrode MG, and can improve the operation speed of the nonvolatile memory and the performance of the semiconductor device with the nonvolatile memory.

From the viewpoint of suppressing or preventing the generation of the high-resistance region in the contact MGa, the contact MGa (silicon film 6 included therein) desirably has a high concentration of impurities. More preferably, for the concentration of impurities of the contact MGa (silicon film 6 included therein) of equal to or less than $1 \times 10^{20}/\text{cm}^3$, the generation of the high-resistance region in the contact MGa can be more surely suppressed or prevented.

The formation of the metal silicide layer 11 over the upper electrode UE using the salicide technique can decrease the resistance of the upper electrode UE, and thus can improve the performance (characteristics) of the semiconductor device including the capacitive element CP. As can be seen from the above FIG. 75, however, since the upper electrode UE is structured to run on the lower electrode LE, the upper electrode UE has a stepped portion reflecting the lower electrode LE as an underlayer, and sidewall insulating films SW (hereinafter referred to as the sidewall insulating film SWb) are formed at the sidewalls (sides) 22 of the stepped portion of the upper electrode UE. As can be seen from FIGS. 87 and 91, even if the metal silicide layer 11 is formed above the upper electrode UE by salicide technique, the metal silicide layer 11 formed over the upper electrode UE is separated into parts, so that no metal layer 11 is formed over the sidewall 22 at the stepped portion of the upper electrode UE and under the sidewall insulating film SWb.

In contrast, in this embodiment, the concentration of impurities of the upper electrode UE (silicon film 6 included therein) is higher than that of the memory gate electrode MG (silicon film 6 included therein) in the memory cell region 1A. Due to a difference in concentration of impurities, the resistance of the upper electrode UE (silicon film 6 included therein) is lower than that of the memory gate electrode MG (silicon film 6 included therein) in the memory cell region 1A. That is, even when the concentration of impurities of the memory gate electrode MG (silicon film 6 included therein) in the memory cell region 1A is decreased in order to improve the data hold characteristics of the nonvolatile memory, the resistance of the upper electrode UE can be decreased by increasing the concentration of impurities of the upper electrode UE (silicon film 6 included therein). Thus, in this embodiment, even when no metal silicide layer 11 is formed over the sidewall 22 at the stepped portion of the upper electrode UE and under the sidewall insulating film SWb, the resistance of the upper electrode UE (silicon film 6 included therein) itself can be made low, which can suppress or prevent the generation of the high-resistance region in the upper electrode UE. Thus, the performance of the semiconductor device with the nonvolatile memory and the capacitive element CP can be improved.

In this way, in this embodiment, the concentration of the impurities of the upper electrode UE (silicon film 6 included therein) of the capacitive element CP is higher than that of the memory gate electrode MG (silicon film 6 included therein) of the memory cell MC, which can improve the performance of the semiconductor device with the nonvolatile memory and the capacitive element CP. The concentration of the impurities of the contact MGa (silicon film 6 included therein) is higher than that of the memory gate electrode MG (silicon film 6 included therein) of the memory cell MC, which can improve the performance of the semiconductor device with the nonvolatile memory.

This embodiment uses the ion implantation in the above step S14 such that the concentration of the impurities of each of the upper electrode UE (silicon film 6 included therein) of the capacitive element CP and the contact MGa (silicon film 6 included therein) of the memory gate shunt region 1B is higher than that of the memory gate electrode MG of the memory cell MC (silicon film 6 included therein). That is, in the ion implantation at step S14, the memory gate electrode MG in the memory cell region 1A is covered with the photoresist pattern RP3 to prevent the impurities from being implanted (ion-implanted). The upper electrode UE in the capacitor formation region 1C and the contact MGa in the memory gate shunt region 1B are not covered with the photoresist pattern RP3 to allow the n-type impurities to be implanted (ion-implanted) thereinto. Thus, the concentration of the impurities of each of the upper electrode UE (silicon film 6 included therein) of the capacitive element CP and the contact MGa (silicon film 6 included therein) of the memory gate shunt region 1B can be higher than that of the memory gate electrode MG of the memory cell MC (silicon film 6 included therein).

The ion implantation in step S14 involves a step of performing ion implantation on the silicon film 4 in the peripheral nMIS region 1D. The ion implantation is performed on the silicon film 4 in the peripheral nMIS region 1D because the gate electrode GE1 for the n-channel MISFETQn formed in the peripheral nMIS region 1D is formed of an n-type silicon film (silicon film 4 into which n-type impurities are introduced by the ion implantation in step S14). Thus, a step of ion-implanting n-type impurities into the silicon film 4 in the peripheral nMIS region 1D, a step of ion-implanting n-type impurities into the upper electrode UE of the capacitive element CP, and a step of ion-implanting n-type impurities into the contact MGa in the memory gate shunt region 1B are performed in the same ion implantation step (by the ion implantation in step S14), which can decrease the number of manufacturing steps of the semiconductor device.

In step S14, impurities are ion-implanted into the upper electrode UE. An ion implantation energy at this time is adjusted to control the implantation depth of the impurity ions. As a result, the n-type impurities are implanted into an upper layer part of the silicon film 6 included in the upper electrode UE in the capacitor formation region 1C, but preferably, the implanted impurity ions do not reach the capacity insulating film DE under the upper electrode UE (that is, no ions are implanted into the capacity insulating film DE). Thus, the ion implantation in step S14 can prevent the damage on the capacity insulating film DE positioned under the upper electrode UE. The impurities implanted into the upper layer part of the upper electrode UE in the ion implantation at step S14 are diffused over the entire upper electrode UE in the thickness direction by the heat treatment in step S17. Thus, the impurities are diffused into the entire upper electrode UE, while preventing the damage on the capacity insulating film DE positioned under the upper electrode UE, which can decrease the resistance of the entire upper electrode UE to reduce the resistance of the upper electrode UE.

After implanting (ion-implanting) impurities into the upper electrode UE in step S14, the impurities are not preferably ion-implanted into the capacitor formation region 1C (especially, the upper electrode UE) any more. Specifically, in each of the ion implantation processes in steps S16, S19, S20, S21, S22, S24, and S25, the capacitor formation region 1C (especially, the upper electrode UE) is covered with the photoresist pattern (corresponding to each of the above photoresist patterns RP4, RP6, RP7, RP8, RP9, and RP10), so that the capacitor formation region 1c (especially, the upper electrode UE) is not preferably ion-implanted. Especially, the ion implantation for formation of the $n^+$-type semiconductor regions 8a, 8b, and 8c (corresponding to the ion implantation in step S24) is performed to implant n-type impurity ions. However, the implantation depth of the ion implantation is relatively deep (deeper than that of the ion implantation for formation of $n^-$-type semiconductor regions 7a, 7b, and 7c). At the time of the ion implantation (corresponding to the ion implantation in the above step S24), the upper electrode UE is not preferably subjected to ion implantation. This arrangement can surely prevent the damage on the capacity insulating film DE positioned under the upper electrode UE in these ion implantation processes.

Preferably, the dose amount in the ion implantation for formation of the $n^-$-type semiconductor region 7a (corresponding to the ion implantation in step S19) is set to the appropriate dose amount as the $n^-$-type semiconductor region 7a, and the dose amount in the ion implantation for formation of the $n^-$-type semiconductor region 7b (corresponding to the ion implantation in step S20) is set to the appropriate dose amount as the $n^-$-type semiconductor region 7b. The dose amount in the ion implantation for formation of the $n^+$-type semiconductor regions 8a and 8b (corresponding to ion implantation in the above step S24) is set to the appropriate dose amount as the $n^+$-type semiconductor regions 8a and 8b. Thus, even when the impurities are implanted (ion-implanted) into the contact MGa and the upper electrode UE in the ion implantation process for formation of the source or drain region (in steps S19, S20, and S24), the amount of the impurities required to decrease the resistance of the contact MGa or upper electrode UE will be lacking. In contrast, in this embodiment, the ion implantation is performed on the contact MGa and the upper electrode UE in a more dose amount in an ion implantation process (in step S14) other than the ion implantation processes (in steps S19, S20, and S24) for formation of the source or drain region, so that the concentration of impurities of the contact MGa and the upper electrode UE can be surely increased to an appropriate level.

In order to form the gate electrode GE1 of n-type silicon appropriate for the n-channel MISFET, the ion implantation of the silicon film 4 in the peripheral nMIS region 1d is performed in a high dose amount as compared to the ion implantation for formation of the source or drain. Thus, the ion implantation is performed on the contact MGa and the upper electrode UE in an ion implantation process of the silicon film 4 in the peripheral nMIS region 1D to be performed in the high dose amount (in the ion implantation process at step S14), so that the contact MGa and the upper electrode UE can surely have a high concentration of impurities, while forming the source and drain regions and the gate electrodes in appropriate concentrations for respective regions.

As shown above, the ion implantation in step S14 is performed in a higher dose amount than that in the ion implantation process (in steps S19, S20, S24) for formation of the source or drain region. That is, the dose amount of the ion implantation in step S14 is more than each of the dose amount of the ion implantation (corresponding to the ion implantation in step S19) for formation of $n^-$-type semiconductor region 7a, the dose amount of the ion implantation (corresponding to the ion implantation in step S20) for formation of $n^-$-type semiconductor region 7b, and the dose amount of the ion implantation (corresponding to the ion implantation in step S24) for formation of the $n^+$-type semiconductor regions 8a and 8b. At this time, the dose amount of the ion implantation in step S14 is preferably more than the total of the dose amount of the ion implantation for formation of the $n^-$-type semiconductor region 7a (corresponding to the ion implantation in step S19), the dose amount of the ion implantation (corresponding to the ion implantation in step S20) for formation of $n^-$-type semiconductor region 7b, and the dose amount of the ion implantation for formation of the $n^+$-type semiconductor regions 8a and 8b (corresponding to the ion implantation in step S24). Suppose that the impurities are implanted into the memory gate electrode MG in the ion implantation for formation of the $n^-$-type semiconductor region 7a (ion implantation in step S19), in the ion implantation for formation of the $n^-$-type semiconductor region 7b (ion implantation in step S20), and in the ion implantation for formation of the $n^+$-type semiconductor regions 8a and 8b (ion implantation in step S24). In this case, the memory gate electrode MG can have a lower concentration of impurities than that of the upper electrode UE and the contact MGa.

The effect of increasing the data hold characteristics of the nonvolatile memory is the most when the memory gate electrode MG is a non-doped silicon film in the manufactured semiconductor device. Even when impurities are introduced, as the gate electrode has a smaller concentration of impurities, the gate electrode will have the more effect. Thus, when forming the silicon film 6 in step S9, the silicon film 6 formed of the non-doped silicon film preferably tends to decrease the concentration of impurities of the memory gate electrode MG in the manufactured semiconductor device. The memory gate electrode MG (silicon film 6 included therein) suppresses the introduction of impurities as much as possible in the following process, whereby the concentration of impurities of the memory gate electrode MG in the manufactured semiconductor device can be made lower, which is advantageous in improving the data hold characteristics of the nonvolatile memory. The silicon film 6 is formed as a non-doped silicon film in step S9, and in the following respective processes, no impurities are introduced (ion-implanted) into the memory gate electrode MG (silicon film 6 included therein), so that the memory gate electrode MG of the manufactured semiconductor device can be made non-doped. However, even when impurities are implanted (ion-implanted) into a part or all of the memory gate electrode MG in the ion implantation for formation of the n⁻-type semiconductor region 7a (corresponding to the ion implantation in the above step. S19), or in the ion implantation for formation of the n⁺-semiconductor region 8a (corresponding to the ion implantation in the above step. S24), the memory gate electrode MG can have a relatively low concentration of impurities. As a result, this embodiment can obtain the effect of improving the data hold characteristics of the nonvolatile memory.

Suitable n-type impurities ion-implanted in step S14 for use can include phosphorus (P) or arsenic (As). Especially, phosphorus (P) is more preferably used. This is because the phosphorus (P) tends to be more easily diffused than the arsenic (As) (that is, diffusion coefficient of the phosphorus in a Si region is more than that of the arsenic.). The ion implantation of phosphorus (P) in step S14 tends to diffuse the impurities (here, made of phosphorus) in the entire silicon films 4 and 6 in the thickness direction by the heat treatment in step S17.

Suitable n-type impurities ion-implanted (corresponding to ion implantation processes in step S19 and S20) for formation of the n⁻-type semiconductor regions 7a and 7b can include phosphorus (P) or arsenic (As). Especially, arsenic (As) is more preferably used. This is based on the following reason. The depth (junction depth) of the n⁻-type semiconductor region 7a is shallow. Thus, the arsenic element whose diffusion coefficient is smaller (smaller than that of phosphorus) in the silicon region tends to easily form the shallow n⁻-type semiconductor regions 7a and 7b.

In the ion implantation for forming the n⁻-type semiconductor region 7b (corresponding to ion implantation in step S20), p-type impurities (for example, boron (B)) can be ion-implanted together with n-type impurities, whereby a p-type halo region for the punch through stopper can be formed so as to enclose the n⁻-type semiconductor region 7b.

Suitable n-type impurities ion-implanted (corresponding to ion implantation processes in step S24) for formation of the n⁺-type semiconductor regions 8a and 8b can include phosphorus (P) or arsenic (As). Especially, both of arsenic (As) and phosphorus (P) are more preferably used. This is because both the decrease in resistance of the n⁺-type semiconductor regions 8a and 8b and the reduction in electric field of n⁺ junction can be achieved.

Figure 98:
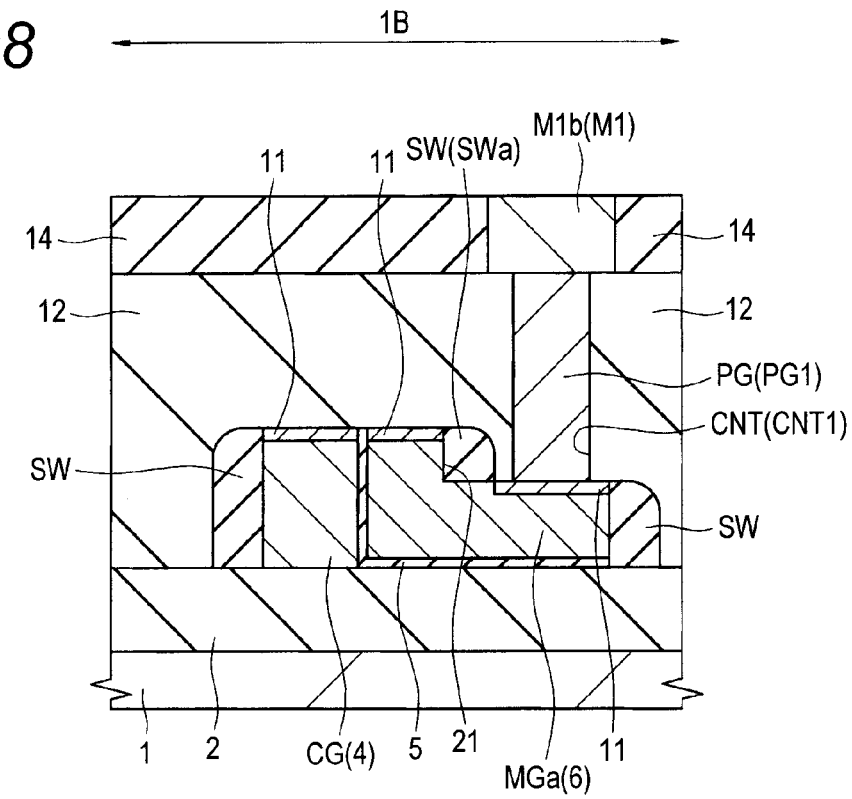
FIG. 98 is a cross-sectional view of a main part (memory gate shunt region) of a semiconductor device in a modified example.

FIG. 98 is a cross-sectional view of a main part of the memory gate shunt region 1B in a modified example of this embodiment, and thus corresponds to the above FIG. 2.

In the semiconductor device shown in FIGS. 1 to 5, the contact MGa runs on the control gate electrode CG (that is, a part of the contact MGa is positioned above the control gate electrode CG) as can be seen from the above FIG. 2. In the semiconductor device of a modified example shown in FIG. 98, the contact MGa does not run on the control gate electrode CG (that is, the contact MGa does not have a part positioned above the control gate electrode CG). The semiconductor device in a modified example shown in FIG. 98 is basically the same as that of the semiconductor device shown in FIGS. 1 to 5 except for the above structure.

Even when the contact MGa does not run on the control gate electrode CG like the semiconductor device in a modified example shown in FIG. 98, an increase in concentration of impurities of the contact MGa is effective, like the semiconductor device shown in FIGS. 1 to 5. That is, even when the contact MGa does not run on the control gate electrode CG, the sidewall insulating film SWa can be formed over each sidewall (side) 21 of the stepped portion of the contact MGa as shown in FIG. 98. Thus, even when the metal silicide layer 11 is formed above the memory gate electrode MG by salicide technique, the metal silicide layer 11 formed over the contact MGa is separated into parts by the sidewall insulating films SWa, and then no metal layer 1 is formed over the sidewall 21 of the stepped portion of the contact MGa and under the sidewall insulating film SWa. The contact MGa shown in FIG. 98 has the same concentration of impurities as that of the above contact MGa shown in FIG. 2, and thus can obtain the same effects as that of the semiconductor device show in FIGS. 1 to 5. That is, like the semiconductor devices shown in FIGS. 1 to 5, also in the semiconductor device in a modified example of FIG. 98, even when the metal silicide layer 11 is not formed over the sidewall 21 of the stepped portion of the contact MGa and under the sidewall insulating film SWa, the contact MGa (silicon film 6 included therein) itself can have a low resistance. Thus, the semiconductor device can have the effect of suppressing or preventing the generation of the high-resistance region in the contact MGa. Thus, the generation of the high-resistance part in the memory gate electrode MG can be suppressed or prevented to thereby improve the operation speed of the nonvolatile memory, while improving the performance of the semiconductor device with the nonvolatile memory. Also, in the second embodiment to be described later, the contact MGa shown in FIG. 98 can be applied.

Second Embodiment

In this embodiment, the control gate electrode CG of the nonvolatile memory of the first embodiment is formed of a laminated film comprised of an insulating film and a silicon film 4, which will be described below.

Figure 99:
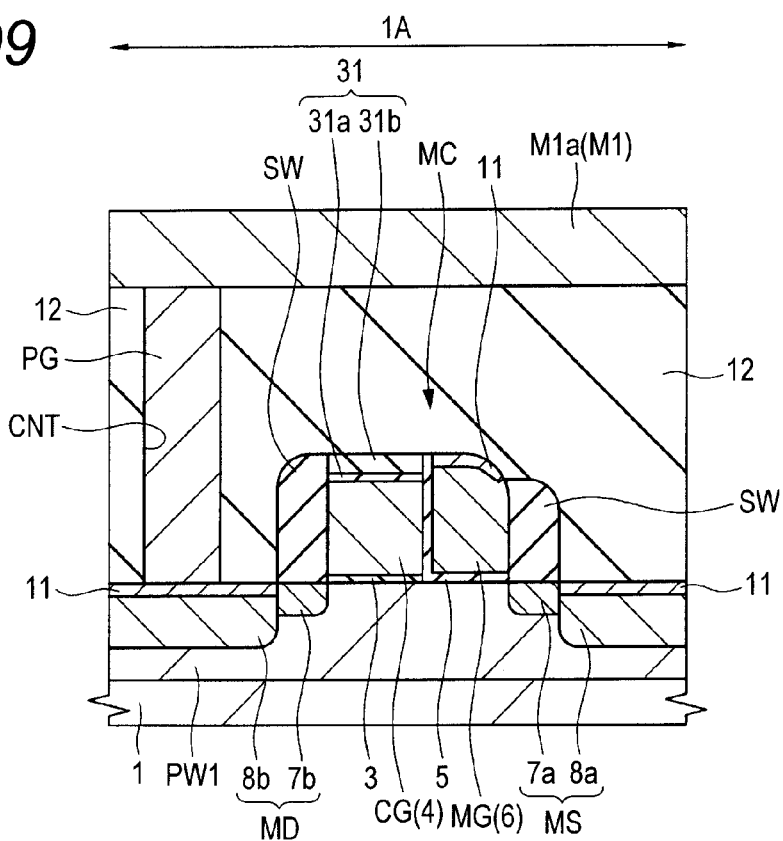
FIG. 99 is a cross-sectional view of a main part (memory cell region) of a semiconductor device in another embodiment of the invention.
Figure 100:
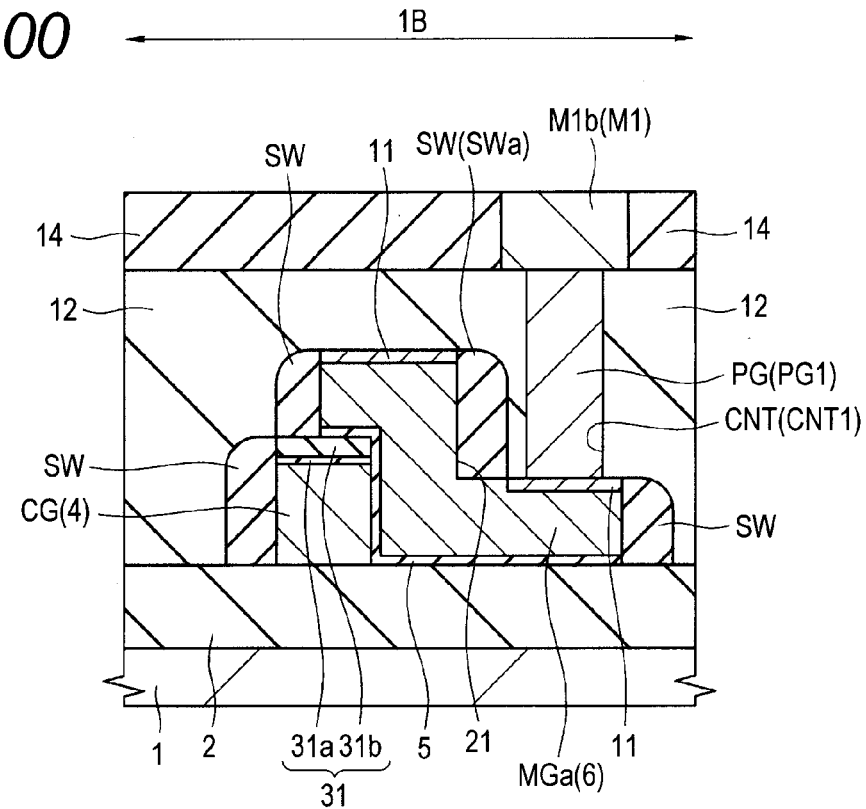
FIG. 100 is a cross-sectional view of a main part (memory gate shunt region) of a semiconductor device in another embodiment of the invention.
Figure 101:
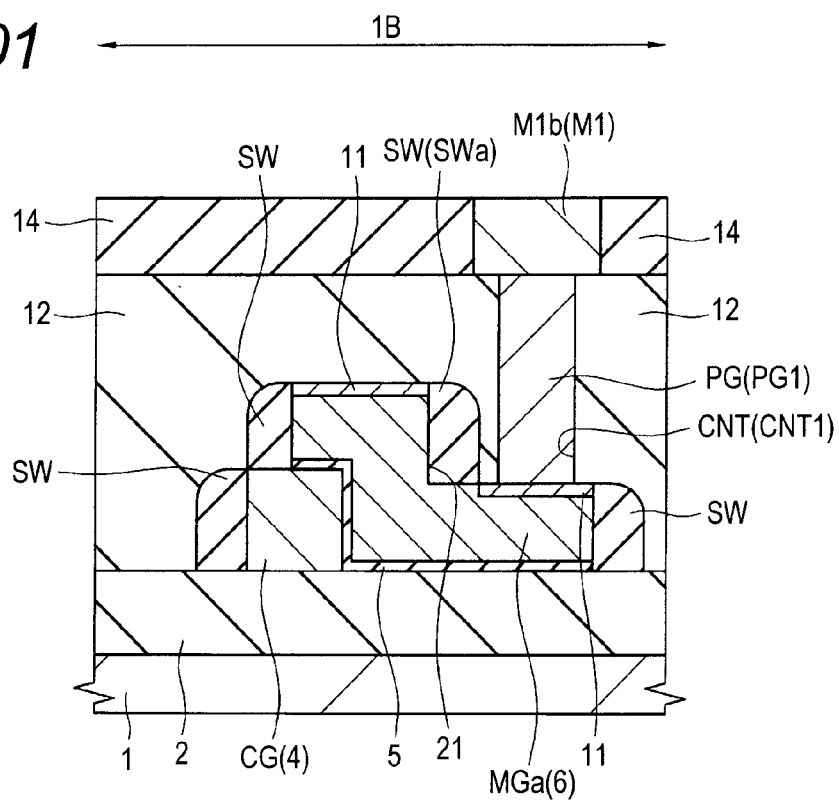
FIG. 101 is a cross-sectional view of a main part (memory gate shunt region) of a semiconductor device in a further embodiment of the invention.
Figure 102:
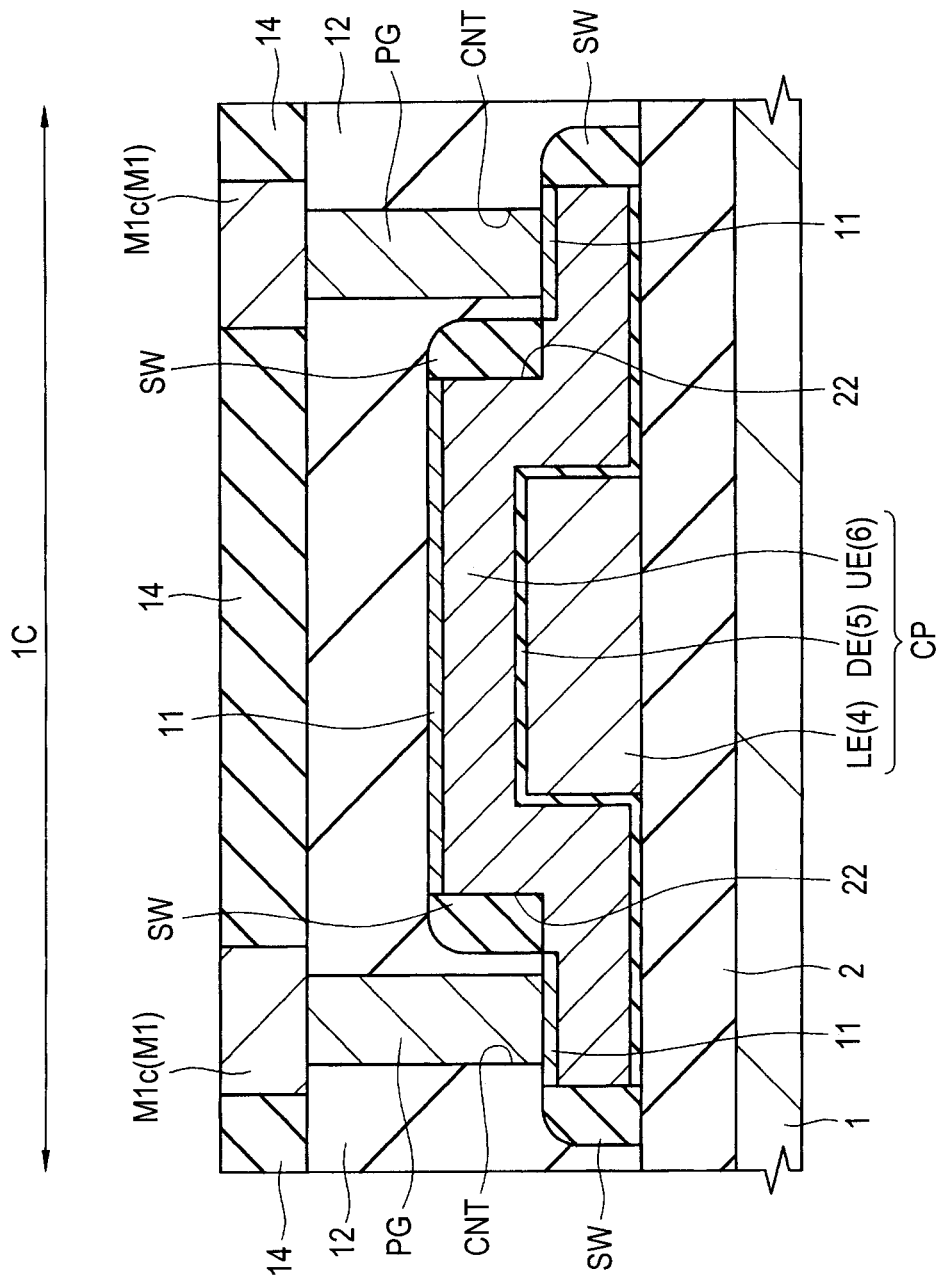
FIG. 102 is a cross-sectional view of a main part (capacitor formation region) of the semiconductor device in the one embodiment of the invention.

FIGS. 99 to 102 are cross-sectional views of main parts of the semiconductor device of this embodiment. FIG. 99 is a cross-sectional view of a main part of the memory cell region 1A of the nonvolatile memory. FIGS. 100 and 101 are cross-sectional views of main parts of the memory gate shunt region 18. FIG. 102 shows a cross-sectional view of a main part of the capacitor formation region 1C.

As shown in FIG. 99, the memory cell of the nonvolatile memory in this embodiment includes a gate electrode CG which is comprised of a laminated film (laminated layer pattern, or laminated structure) of the silicon film 4, and an insulating film 31. More specifically, the control gate electrode CG is comprised of a laminated film (laminated film pattern) of the silicon film 4, an insulating film 31*a* over the silicon film 4, and an insulating film 31*b* over the insulating film 31*a*. The insulating film 31 is comprised of the insulating film 31*a* over the silicon film 4, and the insulating film 31*b* over the insulating film 31*a*. The insulating film 31*a* is formed in a smaller thickness than the insulating film 31*b*. The insulating film 31*a* is preferably comprised of a silicon oxide film, and the insulating film 31*b* is preferably comprised of a silicon nitride film.

In this embodiment, the insulating film 31 (insulating films 31*a* and 31*b*) is formed over the control gate electrode CG of the memory cell, and thus the metal silicide layer 11 is not formed over the control gate electrode CG of the memory cell. That is, the semiconductor device of this embodiment corresponds to a semiconductor device provided by replacing the control gate electrode CG formed by the silicon film 4 and the metal silicide layer 11 thereover of the first embodiment with the control gate electrode CG formed of a laminated film of the silicon film 4 and the insulating film 31.

Other structures of the memory cell of the semiconductor device of this embodiment is the same as that of the first embodiment, and its description will be omitted below.

As shown in FIG. 100, in the memory gate shunt region 1B of this embodiment, the control gate electrode CG is comprised of a laminated film of the silicon film 4 and the insulating film 31.

As shown in FIG. 101, the insulating film 31 formed in this embodiment is removed in the memory gate shunt region 1B, thus providing the same structure as that of the first embodiment (which is the structure without an insulating film 31 over the silicon film 4 included in the control gate electrode CG).

When the memory gate shunt region 1B is formed as shown in FIG. 101, the control gate CG (not containing the insulating film 31) formed in the memory gate shunt region 1B is lower than the control gate electrode CG (containing insulating film 31) formed in the memory cell region 1A by a height of the insulating film 31 over the silicon film 4 (control gate electrode CG). Thus, even when the contact MGa is formed to run on the control gate electrode CG, the element formed in the memory gate shunt region 1B is lowered by the height of the removed insulating film 31 as shown in FIG. 31, so that the formed thickness of the insulating film 12 can be thinned as compared to the case shown in FIG. 100. Thus, when forming the contact holes CNT, the desired contact holes CNT can be formed without generating abnormal shapes, and thus the reliability of the semiconductor device can be improved. The case of FIG. 101 corresponds to the case where the insulating film 31 is removed in the memory gate shunt region 1B. The case of FIG. 100 corresponds to the case where the insulting film 31 exists above the control gate electrode CG not only in the memory cell region 1A, but also in the memory gate shunt region 1B.

Even in both of FIGS. 100 and 101, the contact MGa extends in the direction perpendicular to the extending direction of the control gate electrode CG. Alternatively, the contact MGa may be formed to extend in the same direction as the extending direction of the control gate electrode CG depending on the layout thereof. The same goes for the first embodiment. Other components in the memory gate shunt region 1B are the same as that of the first embodiment, and thus its description will be omitted below.

The structure of a capacitive element CP formed in the capacitor formation region 1C shown in FIG. 102 is the same structure as that of the first embodiment. This is because the insulating film 31 formed above the lower electrode LE is removed in the capacitor formation region 1C like the case shown in FIG. 101. Thus, the thickness of the insulating film between the lower electrode LE and the upper electrode UE becomes thinner. Like the above first to third embodiments, the insulating film between the lower electrode LE and the upper electrode UE is comprised of only the capacity insulating film DE which is the same layer as the insulating film 5. Thus, the decrease in capacity of the capacitive element CP due to the formation of the insulating film 31 can be avoided to thereby improve the performance of the semiconductor device.

Figure 103:
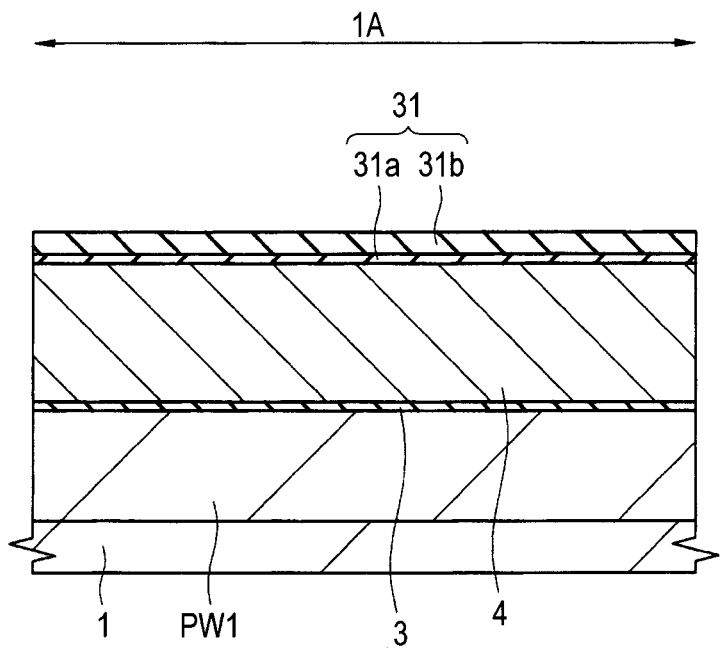
FIG. 103 is a cross-sectional view of a main part (memory cell region) of the manufacturing step of the semiconductor device in the one embodiment of the invention.
Figure 104:
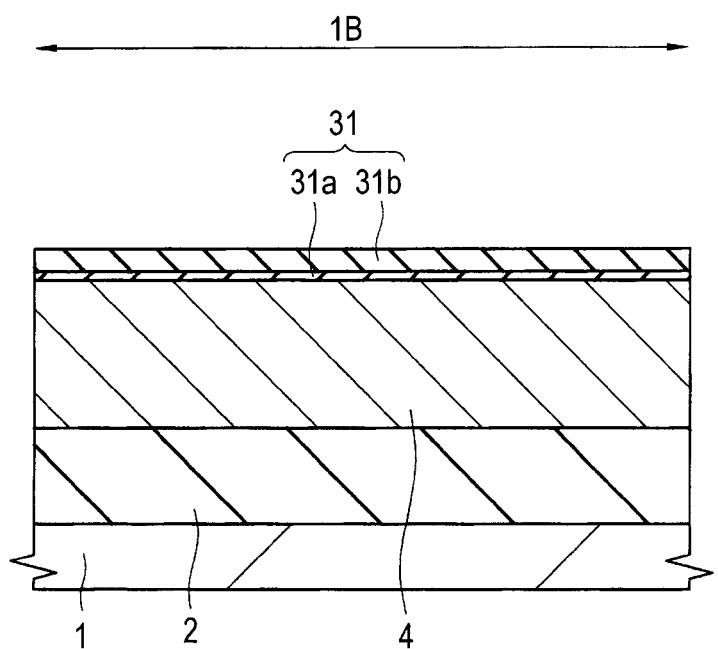
FIG. 104 is a cross-sectional view of a main part (memory gate shunt region) of the same manufacturing step of the semiconductor device as that shown in FIG. 103.
Figure 105:
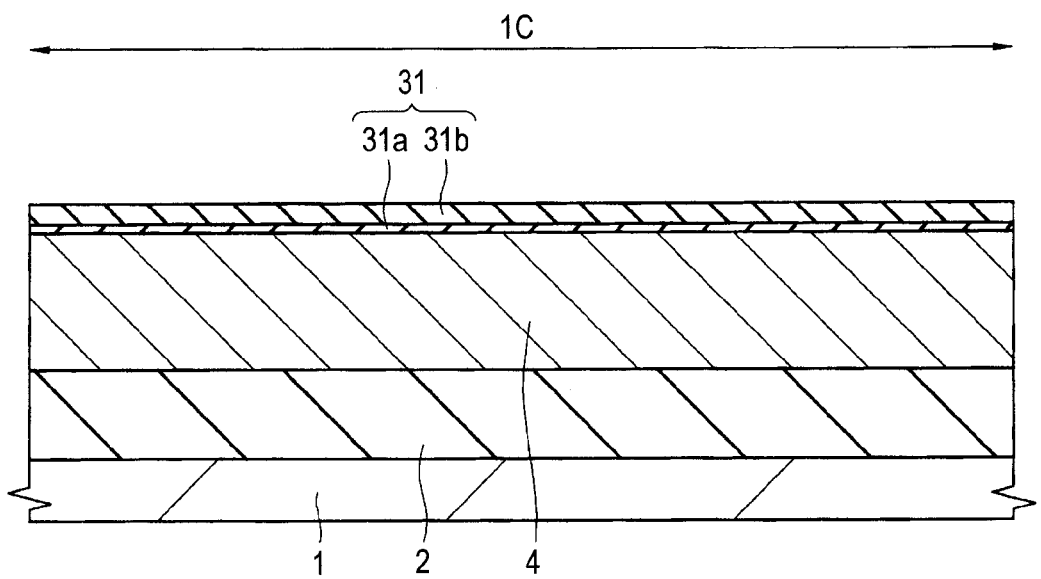
FIG. 105 is a cross-sectional view of a main part (capacitor formation region) of the same manufacturing step of the semiconductor device as that shown in FIG. 103.
Figure 106:
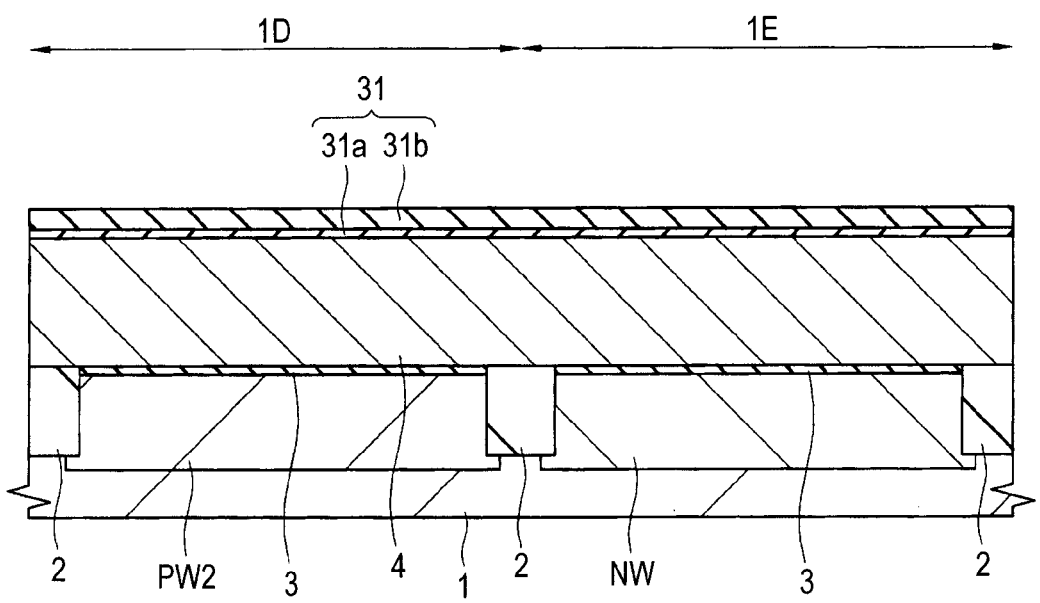
FIG. 106 is a cross-sectional view of a main part (peripheral nMIS region, peripheral pMIS region) of the same manufacturing step as that shown in FIG. 103.
Figure 107:
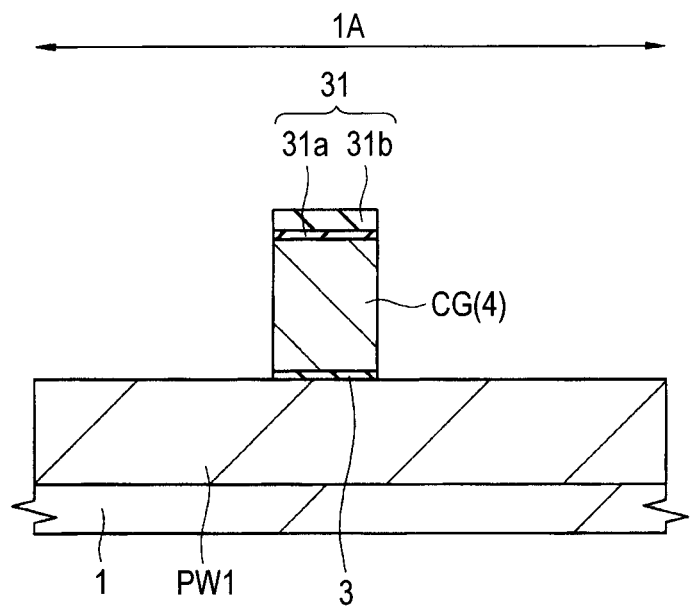
FIG. 107 is a cross-sectional view (memory cell region) of a manufacturing step of the semiconductor device, following the step shown in FIG. 103.
Figure 108:
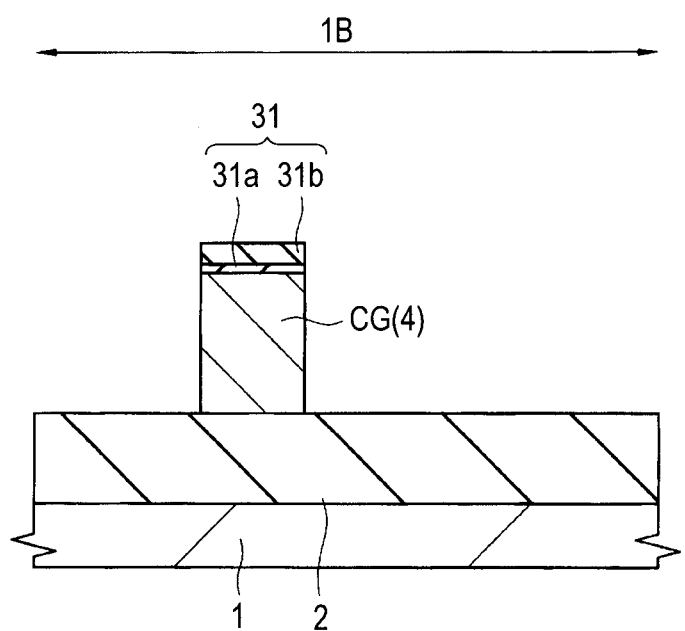
FIG. 108 is a cross-sectional view of a main part (memory gate shunt region) of the same manufacturing step of the semiconductor device as that in shown in FIG. 107.
Figure 109:
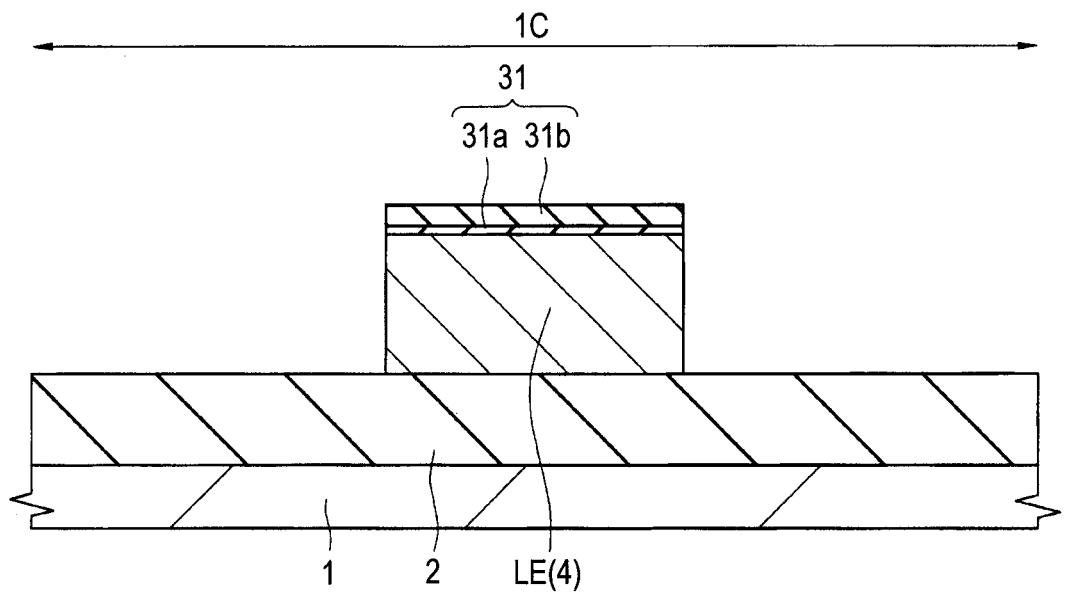
FIG. 109 is a cross-sectional view of a main part (capacitor formation region) of the same manufacturing step of the semiconductor device as that in shown in FIG. 107.
Figure 110:
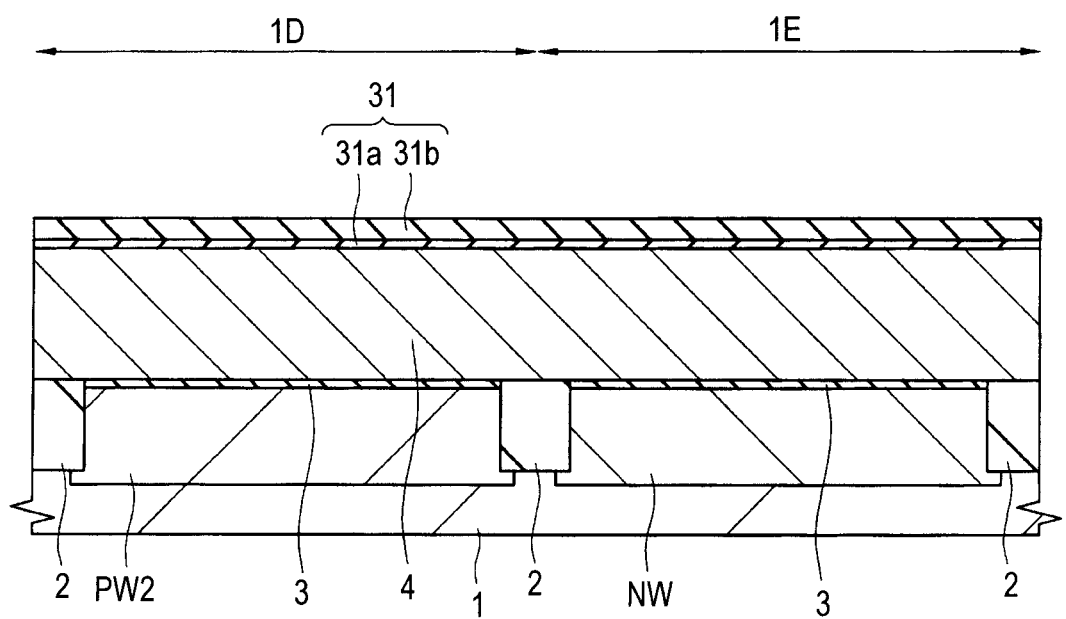
FIG. 110 is a cross-sectional view of a main part (peripheral nMIS region, peripheral pMIS region) of the same manufacturing step of the semiconductor device as that shown in FIG. 107.
Figure 111:
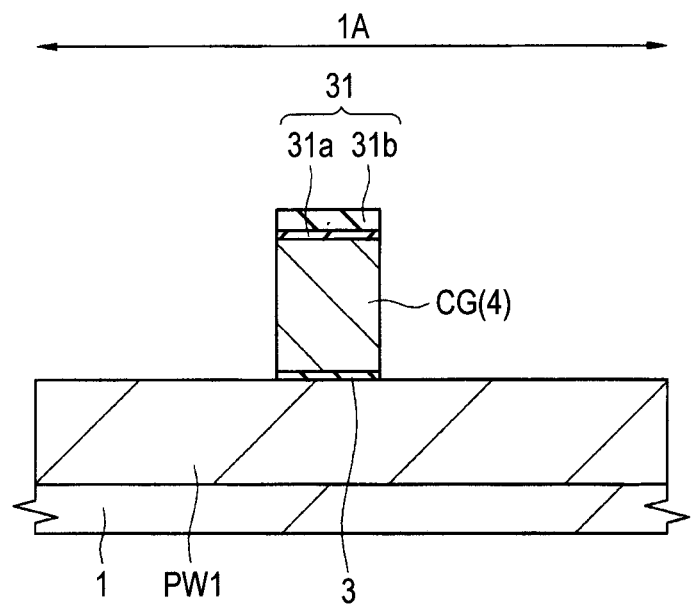
FIG. 111 is a cross-sectional view (memory cell region) of a manufacturing step of the semiconductor device, following the step shown in FIG. 107.
Figure 112:
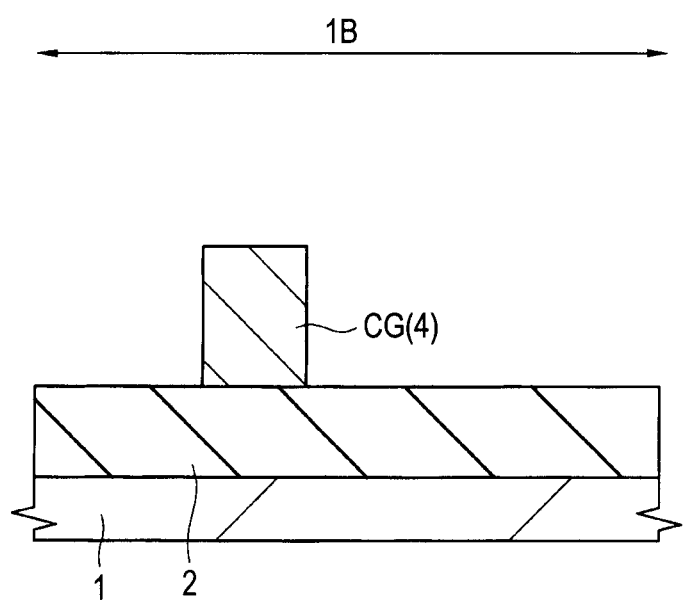
FIG. 112 is a cross-sectional view (memory gate shunt region) of the same manufacturing step of the semiconductor device as that shown in FIG. 111.
Figure 113:
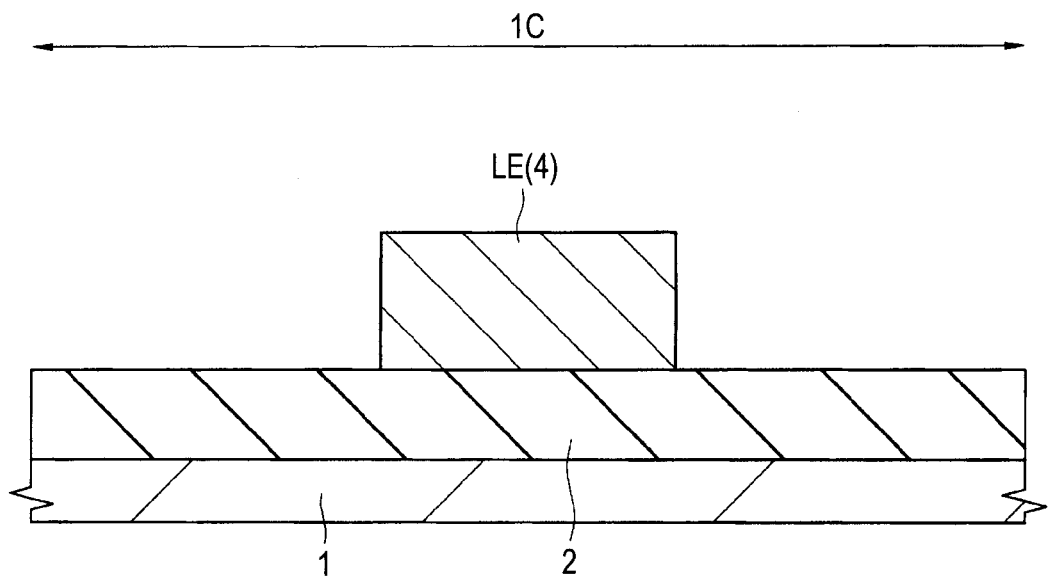
FIG. 113 is a cross-sectional view of a main part (capacitor formation region) of the same manufacturing step of the semiconductor device as that in shown in FIG. 111.
Figure 114:
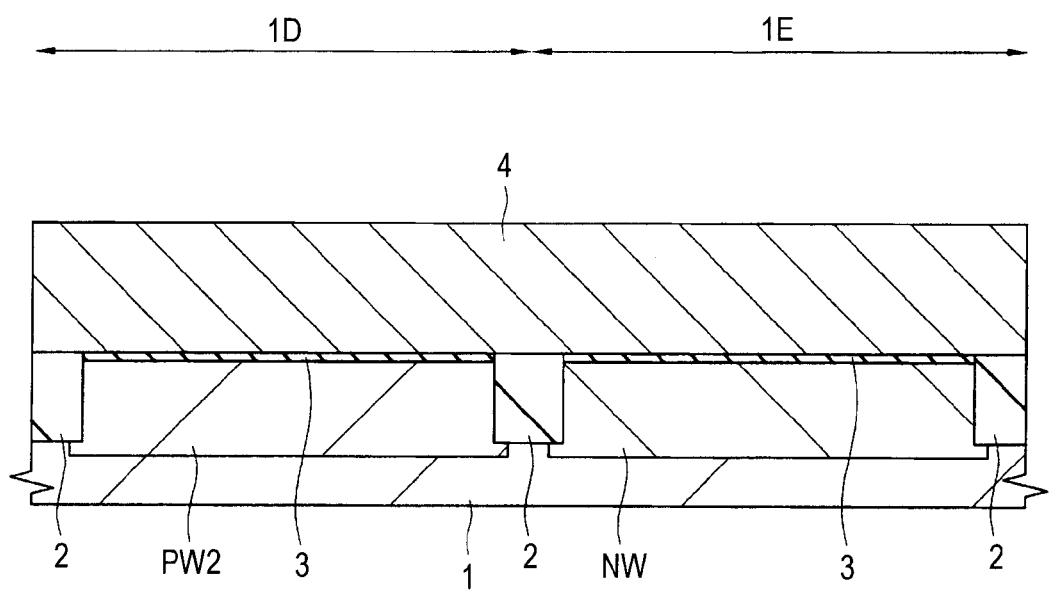
FIG. 114 is a cross-sectional view of a main part (peripheral nMIS region, peripheral pMIS region) of the same manufacturing step of the semiconductor device as that shown in FIG. 111.

Now, the manufacturing process of the semiconductor device in this embodiment will be described below. FIGS. 103 to 114 are cross-sectional views of main parts of manufacturing steps of the semiconductor device of this embodiment. Among these drawings, FIGS. 103, 107, and 111 are cross-sectional views of main parts of the memory cell region 1A, FIGS. 104, 108, and 112 are cross-sectional views of main parts of the memory gate shunt region 1B, FIGS. 105, 109, and 113 are cross-sectional views of main parts of the capacitor formation region 1C, and FIGS. 106, 110, and 114 are cross-sectional views of the peripheral nMIS region 1D and the peripheral pMIS region 1E.

The manufacturing process of the semiconductor device of this embodiment is basically the same as that of the semiconductor device of the first embodiment. Now, different points of the manufacturing process from the first embodiment will be mainly described below.

Like the first embodiment, after performing the processes until the above step S6, in this embodiment, another step of forming the insulating film 31 over the silicon film 4 is added to between the step S6 and the step S7 as shown in FIGS. 103 to 106. The formation step of the insulating film 31 includes the steps of forming an insulating film 31*a* over the silicon film 4, and an insulating film 31*b* over the insulating film 31*a*.

Then, in the first embodiment, in step S7, the silicon film 4 is patterned to form the control gate electrode CG and the lower electrode LE. In this embodiment, the laminated film of the silicon film 4 and the insulating film 3 is patterned to thereby form the control gate electrode CG and the lower electrode LE comprised of a laminated film pattern of the silicon film 4 and the insulating film 31 as shown in FIGS. 107 to 110.

Then, as shown in FIGS. 111 to 114, the insulating film 31 is removed if necessary, in the region where the insulating film 31 is to be removed between step S7 and step S8. At this time, the insulating film 31 is maintained without being removed in the memory cell region 1A, and the insulating film 31 is removed in the capacitor formation region 1C, the above peripheral nMIS region 1D, and the peripheral pMIS region 1E. In the memory gate shunt region 1B, the insulating film 31 is not removed and maintained to thereby provide the structure shown in FIG. 100, or alternatively, the insulating film 31 is removed to provide the structure shown in FIG. 101. FIG. 112 shows the case where the insulating film 31 is removed (when the structure shown in FIG. 101 is obtained).

The following steps (step S8 and the following steps) are basically the same as those of the first embodiment, and its description will be omitted below.

This embodiment can also obtain the same effects as those of the first embodiment.

Additionally, in this embodiment, the control gate electrode CG includes the control gate electrode CG comprised of a laminated film of the silicon film 4, and the insulating film 31 (more specifically, the insulating films 31*a*, and 31*b*). Even when the silicon film 4 of this embodiment is thinner than that of the first embodiment, this embodiment can ensure the height of the memory gate electrode MG formed at the sidewall of the control gate electrode CG in the form of sidewall spacer.

In the above description, the invention made by the inventors will be specifically descried based on the above embodiments. However, the invention is not limited thereto, and various modifications will be made to the disclosed embodiments without departing from the scope of the invention.

The invention is effectively applied to semiconductor devices and manufacturing methods thereof.

What is claimed is:

1. A semiconductor device, comprising a memory cell of a nonvolatile memory, and a capacitive element which are formed over a semiconductor substrate, said memory cell comprising:
    a first gate electrode formed over the semiconductor substrate and comprised of silicon;
    a second gate electrode arranged over the semiconductor substrate, formed adjacent to the first gate electrode, and comprised of silicon;
    a first insulating film formed between the first gate electrode and the semiconductor substrate; and
    a second insulating film formed between the second gate electrode and the semiconductor substrate and between the first gate electrode and the second gate electrode, said second insulating film having therein a charge storing portion,
    said capacitive element comprising:
    a first electrode formed over the semiconductor substrate and comprised of silicon; and
    a second electrode formed over the first electrode via a capacity insulating film and comprised of silicon,
    wherein a concentration of impurities of the second electrode is higher than that of impurities of the second gate electrode,
    wherein the first gate electrode and the first electrode are formed of the same layer of a first silicon film,
    wherein the second gate electrode and the second electrode are formed of the same layer of a second silicon film,
    wherein a resistance of the second electrode is lower than that of the second gate electrode,
    wherein the second insulating film and the capacity insulating film are formed of the same layer of an insulating film,
    wherein the first gate electrode and the first electrode are formed of the first silicon film into which impurities are introduce,
    wherein a metal silicide layer is formed over each of the second gate electrode and the second electrode,
    wherein the second gate electrode extends over the semiconductor substrate together with the first gate electrode,
    wherein the second gate electrode includes a contact extending from a position adjacent to a sidewall of the first gate electrode in a direction away from the first gate electrode,
    wherein a contact hole is formed in an interlayer insulating film over the contact,
    wherein a plug embedded in the contact hole is electrically coupled to the contact, and
    wherein a concentration of impurities of the contact is higher than that of the second gate electrode of the memory cell.

2. The semiconductor device according to claim 1, wherein the second silicon film of the second electrode is formed having introduced impurities.

3. The semiconductor device according to claim 2, wherein the second silicon film of the second gate electrode is formed of a non-doped second silicon film.

4. The semiconductor device according to claim 3, further comprising an element isolation region formed over the semiconductor substrate, and
    wherein the first electrode is formed over the element isolation region.

5. The semiconductor device according to claim 1, wherein a resistance of the contact is lower than that of the second gate electrode of the memory cell.

* * * * *